(12) United States Patent
Arai et al.

(10) Patent No.: US 12,476,172 B2
(45) Date of Patent: Nov. 18, 2025

(54) SEMICONDUCTOR DEVICE

(71) Applicant: DENSO CORPORATION, Kariya (JP)

(72) Inventors: Syunsuke Arai, Kariya (JP);
Masayoshi Nishihata, Kariya (JP);
Shinji Hiramitsu, Kariya (JP);
Noriyuki Kakimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 835 days.

(21) Appl. No.: 17/747,629

(22) Filed: May 18, 2022

(65) Prior Publication Data

US 2022/0278030 A1 Sep. 1, 2022

Related U.S. Application Data

(63) Continuation of application No. PCT/JP2020/038747, filed on Oct. 14, 2020.

(30) Foreign Application Priority Data

Dec. 12, 2019 (JP) .................................. 2019-224847

(51) Int. Cl.
*H01L 23/495* (2006.01)
*H01L 23/00* (2006.01)
(Continued)

(52) U.S. Cl.
CPC ........ *H01L 23/49568* (2013.01); *H01L 24/32* (2013.01); *H01L 24/48* (2013.01);
(Continued)

(58) Field of Classification Search
CPC .................... H01L 23/49568; H01L 23/49575
See application file for complete search history.

(56) References Cited

U.S. PATENT DOCUMENTS

| 2007/0057373 A1 | 3/2007 | Okumura et al. |
| 2016/0225701 A1 | 8/2016 | Tanaka |

(Continued)

FOREIGN PATENT DOCUMENTS

| JP | 2017-159335 A | 9/2017 |
| JP | 2019-176058 A | 10/2019 |

(Continued)

*Primary Examiner* — Mary A Wilczewski
(74) *Attorney, Agent, or Firm* — POSZ LAW GROUP, PLC

(57) ABSTRACT

A semiconductor device has a joint part in which a first conducting part and a second conducting part are joined by a joint material. The first conducting part has a high wettability region and a low wettability region in a surface opposite to the second conducting part. The low wettability region is adjacent to the high wettability region to define an outer periphery of the high wettability region and has wettability lower than the high wettability region to the joint material. The high wettability region has an overlap region overlapping a formation region of the joint part in the second conducting part in a planar view, and a non-overlap region connected to the overlap region and not overlapping the formation region of the joint part in the second conducting part. The non-overlap region includes a holding region capable of holding the joint material that is surplus for the joint part.

10 Claims, 45 Drawing Sheets

(51) Int. Cl.
*H01L 25/07* (2006.01)
*H05K 7/20* (2006.01)
(52) U.S. Cl.
CPC ...... *H01L 25/072* (2013.01); *H01L 23/49562* (2013.01); *H01L 2224/32245* (2013.01); *H01L 2224/48245* (2013.01); *H01L 2924/13055* (2013.01); *H01L 2924/182* (2013.01); *H01L 2924/186* (2013.01); *H01L 2924/30101* (2013.01); *H01L 2924/30107* (2013.01); *H05K 7/209* (2013.01); *H05K 7/20936* (2013.01)

(56) References Cited

U.S. PATENT DOCUMENTS

| | | | | |
|---|---|---|---|---|
| 2017/0278774 | A1* | 9/2017 | Hayashi | H01L 23/49562 |
| 2019/0057921 | A1* | 2/2019 | Ooshima | H01L 23/3142 |
| 2019/0279961 | A1* | 9/2019 | Iwasaki | H01L 23/49844 |
| 2020/0035588 | A1* | 1/2020 | Kawashima | H01L 23/49537 |
| 2021/0233871 | A1* | 7/2021 | Kaizu | H01L 23/49513 |
| 2022/0223544 | A1* | 7/2022 | Fukuoka | H01L 23/49537 |
| 2022/0278030 | A1* | 9/2022 | Arai | H01L 25/072 |
| 2023/0040316 | A1* | 2/2023 | Fukuoka | H01L 23/49562 |
| 2023/0064063 | A1* | 3/2023 | Suzuki | B23K 1/0016 |
| 2024/0071861 | A1* | 2/2024 | Kimura | H01L 23/5385 |
| 2024/0071862 | A1* | 2/2024 | Munakata | H01L 23/051 |
| 2024/0079290 | A1* | 3/2024 | Murozaki | H01L 23/49562 |
| 2024/0079291 | A1* | 3/2024 | Nakano | H01L 23/3121 |
| 2024/0079292 | A1* | 3/2024 | Tsuchimochi | H01L 25/072 |
| 2024/0079372 | A1* | 3/2024 | Omae | H01L 24/48 |
| 2024/0087978 | A1* | 3/2024 | Kawashima | H01L 25/072 |
| 2024/0213123 | A1* | 6/2024 | Kodama | H01L 24/29 |
| 2024/0387474 | A1* | 11/2024 | Nakamura | H01L 24/45 |
| 2024/0404981 | A1* | 12/2024 | Yoshikawa | H01L 24/92 |
| 2025/0201679 | A1* | 6/2025 | Kawano | H01L 24/29 |

FOREIGN PATENT DOCUMENTS

| | | | | |
|---|---|---|---|---|
| WO | WO-2017/154289 A1 * | 9/2017 | | H01L 23/48 |
| WO | WO-2021/117334 A1 * | 6/2021 | | H01L 23/49568 |
| WO | WO 2021/220641 | * 11/2021 | | H01L 23/40 |

* cited by examiner

DURING DRIVE OF UPPER ARM

DURING DRIVE OF LOWER ARM

θ =0

θ =90

θ =180

$\theta=0$, $ta2=0.5$

| THICKNESS tb2 [mm] | CURRENT DENSITY max [kA/cm²] |
|---|---|
| 0.25 | 2.1454 |
| 0.50 | 1.4269 |
| 0.65 | 1.321 |
| 0.75 | 1.0394 |
| 0.85 | 1.389 |
| 1 | 1.4234 |
| 2 | 1.543 |
| 5 | 1.6131 |

$\theta=90$, $ta2=0.5$

| THICKNESS tb2 [mm] | CURRENT DENSITY max [kA/cm²] |
|---|---|
| 0.50 | 3.0458 |
| 0.65 | 2.935 |
| 0.75 | 2.8914 |
| 0.85 | 2.8513 |
| 1 | 2.8096 |
| 2 | 2.6901 |
| 5 | 2.6226 |

$\theta=180$, $ta2=0.5$

| THICKNESS tb2 [mm] | CURRENT DENSITY max [kA/cm²] |
|---|---|
| 0.50 | 2.3357 |
| 0.65 | 2.208 |
| 0.75 | 2.1433 |
| 0.85 | 2.0943 |
| 1 | 2.0385 |
| 2 | 1.8783 |
| 5 | 1.785 |

SEMICONDUCTOR DEVICE

CROSS REFERENCE TO RELATED APPLICATIONS

The present application is a continuation application of International Patent Application No. PCT/JP2020/038747 filed on Oct. 14, 2020, which designated the U.S. and claims the benefit of priority from Japanese Patent Application No. 2019-224847 filed on Dec. 12, 2019. The entire disclosures of all of the above applications are incorporated herein by reference.

TECHNICAL FIELD

The present disclosure relates to a semiconductor device.

BACKGROUND

JP 2007-103909 A (corresponding to US 2007/0057373 A1) discloses a semiconductor device of a double-sided heat dissipation structure that includes a semiconductor element having main electrodes on both surfaces and a wiring member including, as conducting parts, heat dissipation parts disposed so as to sandwich the semiconductor element and terminal parts connected to the heat dissipation parts. The contents of JP 2007-103909 A will be incorporated by reference as description of technical elements in the present disclosure.

SUMMARY

The present disclosure provides a semiconductor device having a joint part in which a first conducting part and a second conducting part are joined by a joint material. The first conducting part has a high wettability region and a low wettability region in a surface opposite to the second conducting part. The low wettability region is adjacent to the high wettability region to define an outer periphery of the high wettability region and has wettability lower than the high wettability region to the joint material. The high wettability region has an overlap region overlapping a formation region of the joint part in the second conducting part in a planar view, and a non-overlap region connected to the overlap region and not overlapping the formation region of the joint part in the second conducting part. The non-overlap region includes a holding region capable of holding the joint material that is surplus for the joint part.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
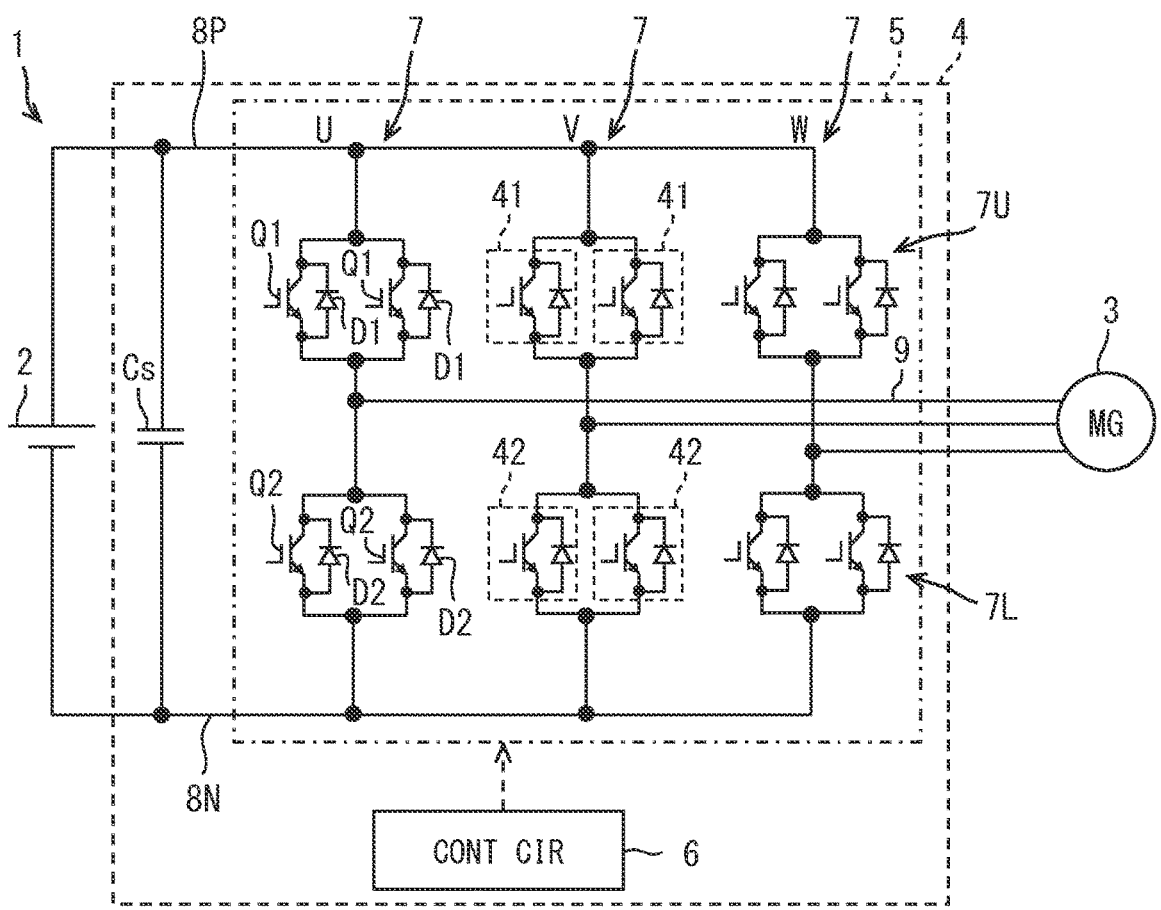
FIG. 1 is a diagram illustrating a schematic configuration of a drive system of a vehicle to which a power converting device is applied.

In a configuration having a joint part in which a joint material is disposed between two conducting parts in a plate thickness direction, variations in the height caused by dimension tolerance, assembly tolerance, or the like of elements constructing a semiconductor device are absorbed by the joint material. When the height varies in the direction that the opposition interval of the two conducting parts becomes narrower, the joint material which is surplus overflows from the two opposite regions, thereby absorbing the variations in the height. When a trench is provided in one of the conducting parts, the surplus joint material can be held by the trench. The trench may be formed by press work. In the above-described viewpoint or another viewpoint which has not been mentioned, further improvement is demanded for semiconductor devices.

A semiconductor device according to an aspect of the present disclosure includes a semiconductor element and a wiring member. The semiconductor element has two surfaces opposite to each other in a plate thickness direction and has a main electrode disposed on each of the two surfaces. The wiring member includes a plurality of conducting parts and a joint part. The conducting parts include a set of heat dissipation parts and a plurality of terminal parts. The set of heat dissipation parts are respectively disposed to the two surfaces to sandwich the semiconductor element and electrically connected to the main electrode disposed on corresponding one of the two surfaces. Each of the terminal parts are connected to one of the set of heat dissipation parts. The joint part is formed by disposing a joint material between two conducting parts in the conducting parts in the plate thickness direction.

In the joint part, a first conducting part as one of the two conducting parts has a high wettability region and a low wettability region in a surface opposite to a second conducting part as another one of the two conducting parts, the low wettability region is provided adjacent to the high wettability region so as to define an outer periphery of the high wettability region in planar view in the plate thickness direction and has wettability lower than the high wettability region to the joint material.

The high wettability region has an overlap region and a non-overlap region, the overlap region is a region overlapping a formation region of the joint part in the second conducting part in the planar view, the joint material is disposed in at least a part of the overlap region, and the non-overlap region is a region that is connected to the overlap region and does not overlap the formation region of the joint part in the second conducting part. The non-overlap region includes a holding region capable of holding the joint material that is surplus for the joint part.

According to the semiconductor device disclosed, the holding region as the high wettability region connected to the overlap region, and the joint material which is surplus easily wets and spreads from the overlap region to the holding region. The wet spreading of the surplus joint material is regulated by the low wettability region. Therefore, by the low wettability region adjacent to the high wettability region, wet spreading to the holding region is promoted and/or wet spreading to the outside of the holding region is suppressed. Therefore, without providing a trench, the surplus joint material can be held in the holding region. As a result, the semiconductor device capable of holding the surplus joint material can be provided with the simple configuration.

Referring to the drawings, a plurality of embodiments will be described.

First Embodiment

A semiconductor device and a semiconductor module according to an embodiment are applied to a power converting device. The power converting device is applied to, for example, a drive system of a vehicle. The power converting device can be applied to a vehicle such as an electric vehicle (EV), a hybrid vehicle (HV), or the like. Hereinafter, an example of application to a hybrid vehicle will be described.

<Drive System of Vehicle>

First, a schematic configuration of a drive system of a vehicle will be described. As illustrated in FIG. 1, a drive system 1 of a vehicle has a DC power source 2, a motor generator 3, and a power converting device 4.

The DC power source 2 is a chargeable/dischargeable secondary battery such as a lithium ion battery or a nickel hydride battery. The motor generator 3 is a rotating electrical machine of a three-phase AC type. The motor generator 3 functions as a travel drive source of the vehicle, that is, an electric motor. At the time of regeneration, the motor generator 3 functions as an electric generator. The vehicle has, as travel drive sources, a not-illustrated engine and the motor generator 3. The power converting device 4 performs power conversion between the DC power source 2 and the motor generator 3.

<Circuit Configuration of Power Converting Device>

Next, the circuit configuration of the power converting device 4 will be described. As illustrated in FIG. 1, the power converting device 4 has an inverter 5, a control circuit unit (CONT CIR) 6, and a smoothing capacitor Cs. The inverter 5 is a power converting unit. The inverter 5 is a DC-AC converting unit. The power converting unit is configured by having upper/lower arms 7.

The upper/lower arm 7 is a circuit in which an upper arm 7U and a lower arm 7L are connected in series. Each of the upper arm 7U and the lower arm 7L has a plurality of switching elements provided with gate electrodes. In each of the upper arm 7U and the lower arm 7L, a plurality of switching elements are connected in parallel. In the present embodiment, an n-channel-type IGBT is employed as the switching element.

The upper arm 7U has two switching elements Q1. To each of the two switching elements Q1, a diode D1 for reflux is individually connected. The diode D1 is connected in anti-parallel to the corresponding switching element Q1. The two switching elements Q1 connected in parallel are controlled by a gate drive signal whose high level and low level are switched at the same timing. The gate electrodes of the two switching elements Q1 are electrically connected to, for example, the same drive circuit unit (gate driver). The upper arm 7U is configured by two semiconductor elements 31 which will be described later.

The lower arm 7L has two switching elements Q2. To each of the two switching elements Q2, a diode D2 for reflux is individually connected. The diode D2 is connected in antiparallel to the corresponding switching element Q2. The two switching elements Q2 connected in parallel are controlled by a gate drive signal whose high level and low level are switched at the same timing. The gate electrodes of the two switching elements Q2 are electrically connected to, for example, the same drive circuit unit. The lower arm 7L is configured by two semiconductor elements 32 which will be described later.

The switching elements Q1 and Q2 are not limited to IGBTs. For example, MOSFETs can be also employed. As the diodes D1 and D2, parasitic diodes can be also used.

The upper arm 7U and the lower arm 7L are connected in series between power lines 8P and 8N, while setting the upper arm 7U on the power line 8P side. The power line 8P is a power line on the high potential side. The power line 8P is connected to the positive electrode of the DC power source 2. The power line 8P is connected to the terminal on the positive electrode side of the smoothing capacitor Cs. The power line 8N is a power line on the low potential side. The power line 8N is connected to the negative electrode of the DC power source 2. The power line 8N is connected to the terminal on the negative electrode side of the smoothing capacitor Cs. The power line 8N is also called a grounding line.

The inverter 5 is connected to the DC power source 2 via the smoothing capacitor Cs. The inverter 5 has three sets of the above-described upper/lower arms 7. The inverter 5 has the upper/lower arms 7 of three phases. In each of the phases, the collector electrode of the switching element Q1 is connected to the power line 8P. The emitter electrode of the switching element Q2 is connected to the power line 8N. The emitter electrode of the switching element Q1 and the collector electrode of the switching element Q2 are connected to each other to form a connection point of the upper/lower arm 7.

The connection point of the upper/lower arm 7 of the U phase is connected to a U-phase winding provided for a stator of the motor generator 3. The connection point of the upper/lower arm 7 of the V phase is connected to a V-phase winding of the motor generator 3. The connection point of the upper/lower arm 7 of the W phase is connected to a W-phase winding of the motor generator 3. The connection point of the upper/lower arm 7 of each phase is connected to the winding of the corresponding phase via a load line 9 provided for each phase. The load line 9 is also called an output line.

The inverter 5 converts DC voltage to 3-phase AC voltage in accordance with switching control by the control circuit unit 6 and outputs the 3-phase AC voltage to the motor generator 3. By the voltage, the motor generator 3 is driven so as to generate predetermined torque. At the time of regenerative braking of the vehicle, on receipt of the rotary force from the wheels, the motor generator 3 generates the 3-phase AC voltage. The inverter 5 can convert the 3-phase AC voltage generated by the motor generator 3 to DC voltage in accordance with switching control by the control circuit unit 6 and output the DC voltage to the power line 8P. In such a manner, the inverter 5 performs bidirectional power conversion between the DC power source 2 and the motor generator 3.

The control circuit unit 6 is configured by having, for example, a microcomputer. The control circuit unit 6 generates a drive command for operating the switching elements Q1 and Q2 of the inverter 5 and outputs it to a not-illustrated drive circuit unit. Concretely, the control circuit unit 6 outputs a PWM signal as a drive command. The drive command is, for example, an output duty ratio. The control circuit unit 6 generates a drive command on the basis of a torque request input from a not-illustrated higher ECU or signals detected by various sensors.

The various sensors include a current sensor detecting phase current flowing in a winding of each of the phases of the motor generator 3, a rotation angle sensor detecting a rotation angle of a rotor of the motor generator 3, and a voltage sensor detecting the voltage between both ends of the smoothing capacitor Cs, that is, the voltage of the power line 8P. The power converting device 4 has not-illustrated those sensors.

The power converting device 4 has a not-illustrated drive circuit unit. The drive circuit unit generates a drive signal on the basis of a drive command from the control circuit unit 6 and outputs it to gate electrodes of the switching elements Q1 and Q2 of the corresponding upper/lower arm 7. By the signal, the switching elements Q1 and Q2 are driven, that is, on-driven and off-driven. The drive circuit unit is provided, for example, for each arm.

The smoothing capacitor Cs is connected between the power lines 8P and 8N. The smoothing capacitor Cs is provided between the DC power source 2 and the inverter 5 and connected in parallel to the inverter 5. The smoothing capacitor Cs smoothes, for example, DC voltage supplied from the DC power source 2 and accumulates the charges of the DC voltage. The voltage between both terminals of the smoothing capacitor Cs becomes high DC voltage for driving the motor generator 3.

The power converting device 4 may further have a converter, a filter capacitor, or the like as the power converting unit. The converter is a DC-DC converting unit converting the DC voltage to a DC voltage of a different value. The converter is provided between the DC power source 2 and the smoothing capacitor Cs. The converter boosts, for example, the DC voltage supplied from the DC power source 2. The converter can be also provided with a voltage boosting function. The converter is configured by having, for example, upper and lower arms and a reactor. The upper and lower arms of the converter may have the same configuration as that of the upper/lower arm 7. In the case of only the voltage boosting function, the lower arm side of the converter may have the same configuration as that of the lower arm 7L of the inverter 5, and the upper arm side may be configured by a diode. The filter capacitor is connected in parallel to the DC power source 2. A filter capacitor eliminates, for example, power source noise from the DC power source 2.

<Structure of Semiconductor Device>

Next, a semiconductor device constructing the inverter 5 will be described. The upper/lower arm 7 is made by one semiconductor module 10 which will be described later. The semiconductor module 10 has two kinds (two part numbers) of semiconductor devices 11 and 12 illustrated in FIGS. 2 to 8. The semiconductor device 11 forms the upper arm U, and the semiconductor device 12 forms the lower arm 7L.

The specification of the semiconductor device 11 and that of the semiconductor device 12 are different from each other. In FIGS. 2 to 8, the plate thickness direction of each of the semiconductor devices is set as a Z direction, a direction which is orthogonal to the Z direction and in which at least two semiconductor elements are disposed side by side is set as an X direction, and a direction orthogonal to the Z direction and the X direction is set as a Y direction. Unless otherwise specified, a shape along the XY plane defined by the X direction and the Y direction is a planar shape. In FIGS. 2 to 8, for convenience, two semiconductor devices 11 and 12 are illustrated side by side. In FIGS. 6 to 8, the sealing resin member is omitted. Further, in FIG. 8, the heat sink on the emitter side is omitted. FIG. 8 illustrates, for convenience, the state of a lead frame before unnecessary parts such as a tie bar are eliminated.

First, the semiconductor device 11 on the upper arm 7U side will be described. With respect to the elements of the semiconductor device 11, the end number of each reference numeral is set as "1". As illustrated in FIGS. 2 to 8, the semiconductor device 11 has an sealing resin member 21, the semiconductor element 31, heat sinks 41 and 51, a terminal 61, a main terminal 71, and a signal terminal 81.

The sealing resin member 21 encapsulates the corresponding semiconductor element 31 and the like. The sealing resin member 21 is made of, for example, epoxy-based resin. The sealing resin member 21 is molded by, for example, the transfer mold method. As illustrated in FIGS. 2 to 5, the sealing resin member 21 has an almost rectangular parallelepiped shape. The sealing resin member 21 has an almost rectangular shape in planar view.

The semiconductor element 31 is configured by forming the switching element Q1 and the diode D1 on a semiconductor substrate. In the semiconductor element 31, an RC (Reverse Conducting)-IGBT is formed. The semiconductor element 31 is also called a semiconductor chip. The semiconductor element 31 has a vertical structure in which current flows in the Z direction.

Figure 4:
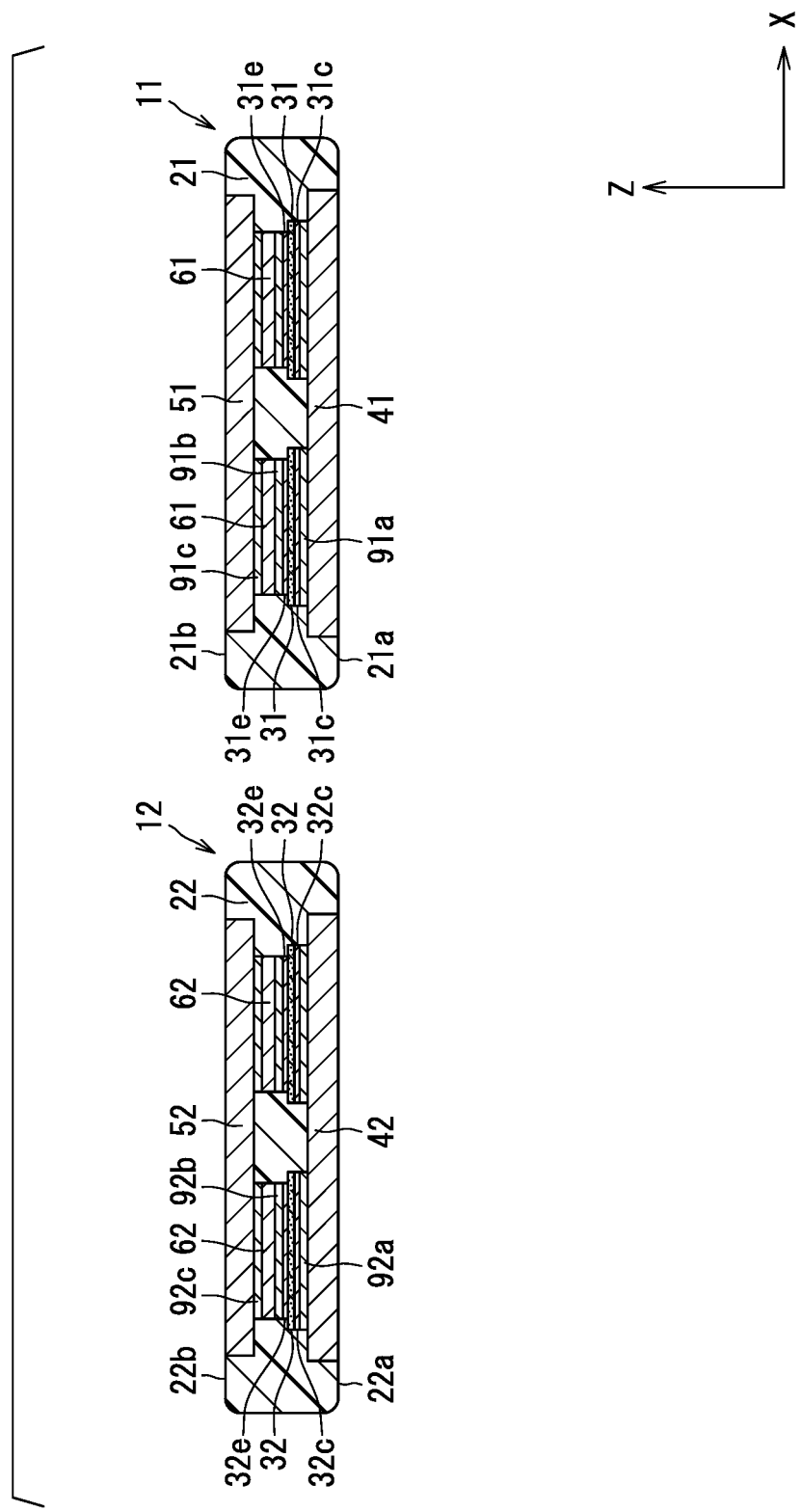
FIG. 4 is a cross section taken along the IV-IV line of FIG. 2.

As illustrated in FIG. 4, in the Z direction, a collector electrode 31c is formed in a plane (first main plane) of the semiconductor element 31, and an emitter electrode 31e is formed on the rear plane (second main plane). The collector electrode 31c also serves as the cathode electrode of the diode D1, and the emitter electrode 31e also serves as the anode electrode of the diode D1. The collector electrode 31c is the electrode (main electrode) on the high potential side, and the emitter electrode 31e is the electrode (main electrode) on the low potential side. In the emitter electrode formation plane, a pad (not illustrated) as an electrode for a signal is also formed. The pad is formed at the end on the side opposite to the formation region of the emitter electrode 31e in the Y direction. In the present embodiment, the semiconductor element 31 has five pads disposed along the X direction. The pads are arranged in the order of the pad for the cathode potential of a temperature sensor (temperature sensitive diode) detecting the temperature of the semiconductor electrode 30, the pad for the anode potential, the pad for the gate electrode, the pad for current sensing, and the pad for a Kelvin emitter detecting the potential of the emitter electrode 31e.

The semiconductor device 11 has a plurality of semiconductor elements 31. The plurality of semiconductor elements 31 are connected in parallel to form the upper arm 7U. In the present embodiment, the semiconductor device 11 has two semiconductor elements 31. As illustrated in FIGS. 4 and 8, the two semiconductor elements 31 have structures which are almost the same each other, that is, have the same shape and the same size. The semiconductor element 31 has an almost rectangular shape in planar view. The two semiconductor elements 31 are disposed so that the collector electrodes 31c are on the same side in the Z direction. The two semiconductor elements 31 are positioned at almost the same height in the Z direction and disposed side by side in the X direction.

Figure 2:
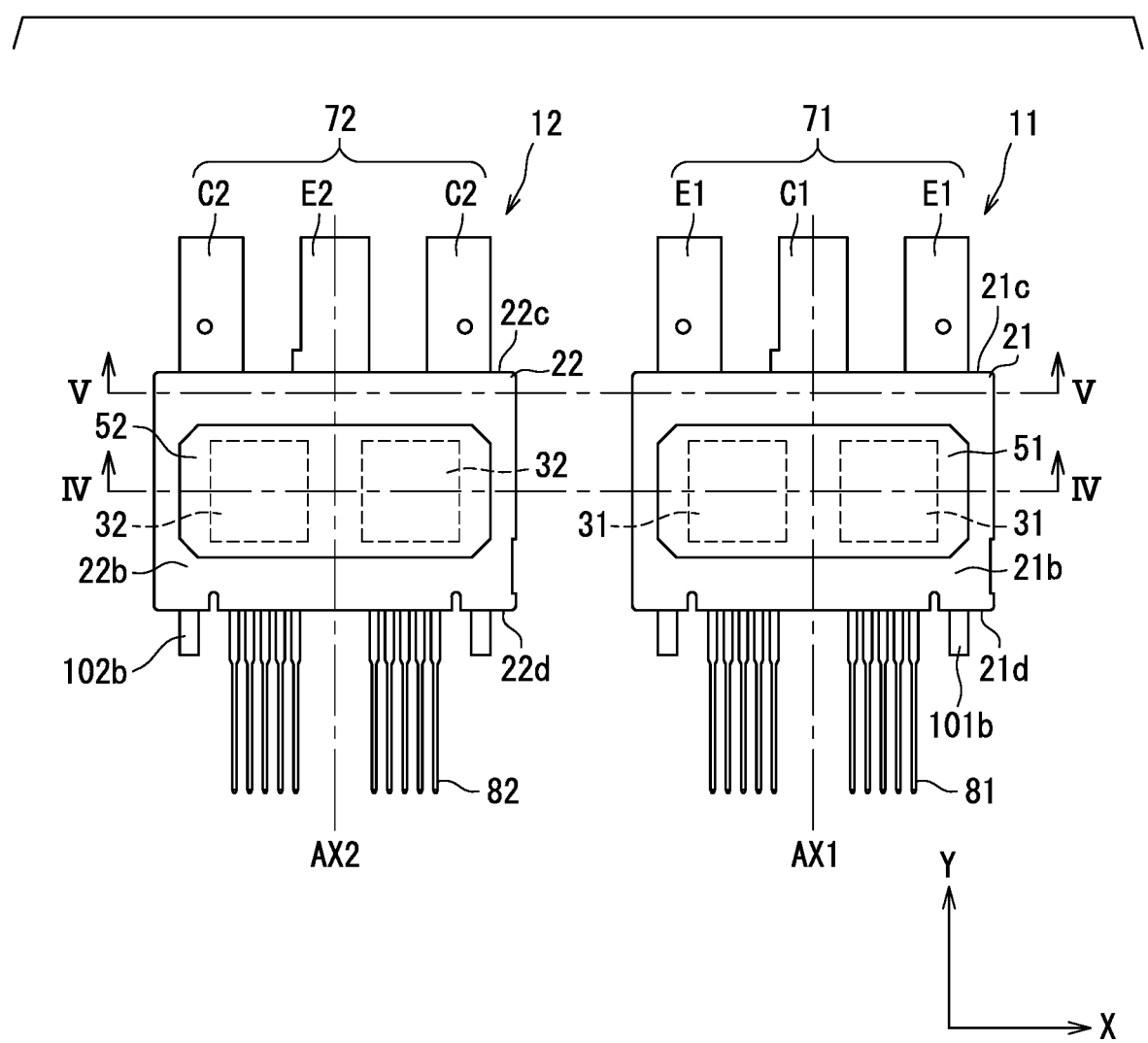
FIG. 2 is a planar view of a semiconductor device according to a first embodiment.

As illustrated in FIGS. 2 and 8, the two semiconductor elements 31 are disposed line-symmetrically with respect to an axis AX1 which is orthogonal to the X direction and the Z direction as the axis of symmetry. In the present embodiment, the sealing resin member 21 has an almost rectangular shape in planar view, and the two semiconductor elements 31 are disposed so that the axis AX1 almost matches the center of the X direction of the outer shape of the sealing resin member 21. In the two semiconductor elements 31, the arrangement order of the pads is the same.

The heat sinks 41 and 51 have the function of discharging the heat of the semiconductor elements 31 to the outside of the semiconductor device 11. The heat sinks 41 and 51 are also called heat dissipation members. The heat sinks 41 and 51 are electrically connected to the semiconductor elements 31 and have the function as wires. The heat sinks 41 and 51 are also called wiring members. The heat sinks 41 and 51 are formed by using a metal material such as copper. The heat sinks 41 and 51 are also called metal members.

The heat sinks 41 and 51 are disposed so as to sandwich the plurality of semiconductor elements 31. In the Z direction, the two semiconductor elements 31 are disposed side by side between the heat sinks 41 and 51. The semiconductor elements 31 are embedded in the heat sinks 41 and 51 in projection view from the Z direction. The plate thickness direction of the heat sinks 41 and 51 is almost parallel to the Z direction. As illustrated in FIGS. 2, 6, and 8, in the heat sinks 41 and 51, the X direction is the longer-side direction, and the Y direction is the shorter-side direction.

The heat sinks 41 and 51 are electrically connected to the semiconductor elements 31 via a joint member such as solder. As illustrated in FIG. 4, the heat sink 41 is connected to the collector electrode 31c via solder 91a. The heat sink 51 is connected to the emitter element 31e via solder 91b and 91c and the terminal 61. The terminal 61 is a metal member electrically relaying the semiconductor element 31 and the heat sink 51. The terminal 61 has a shape which is almost the same as that of the emitter electrode 31e in the projection view from the Z direction. The terminal 61 has an almost rectangular shape in planar view. The heat sink 51 is connected to the terminal 61 via the solder 91c. The plane on the side opposite to the heat sink 51 of the terminal 61 is connected to the emitter electrode 31e via the solder 91b.

Figure 5:
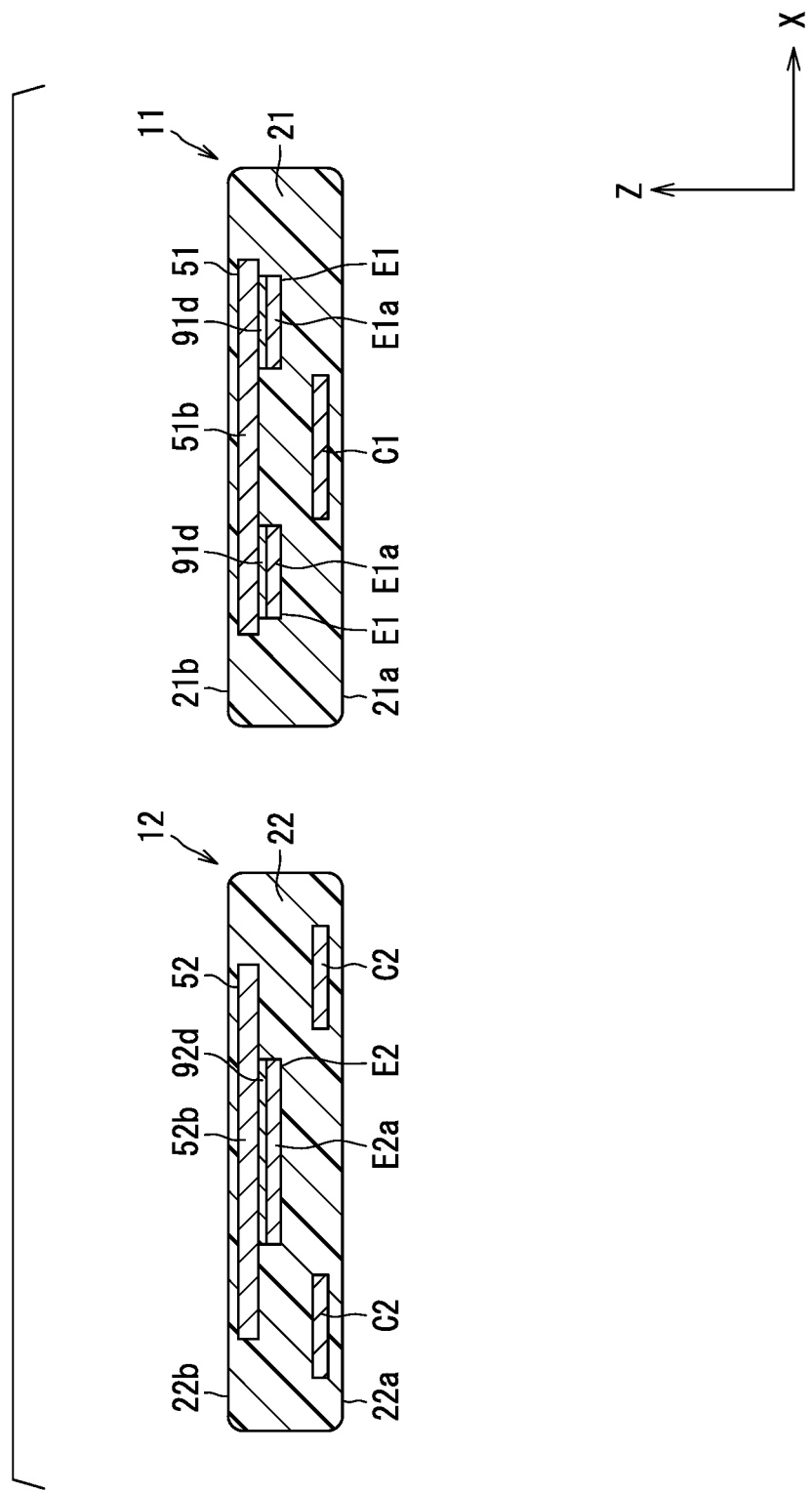
FIG. 5 is a cross section taken along the V-V line of FIG. 2.
Figure 6:
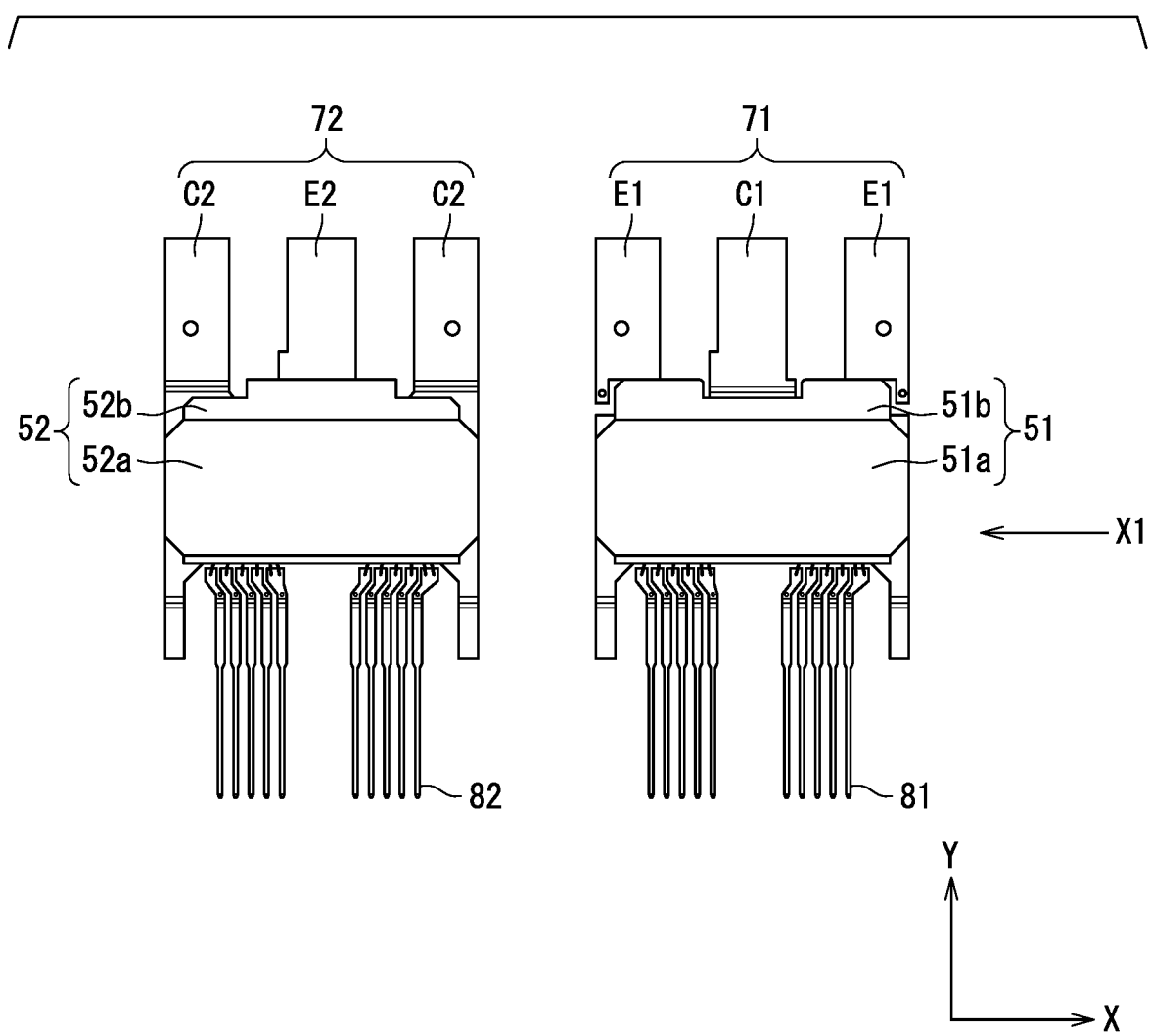
FIG. 6 is a planar view illustrating a state where a sealing resin member is omitted.
Figure 7:
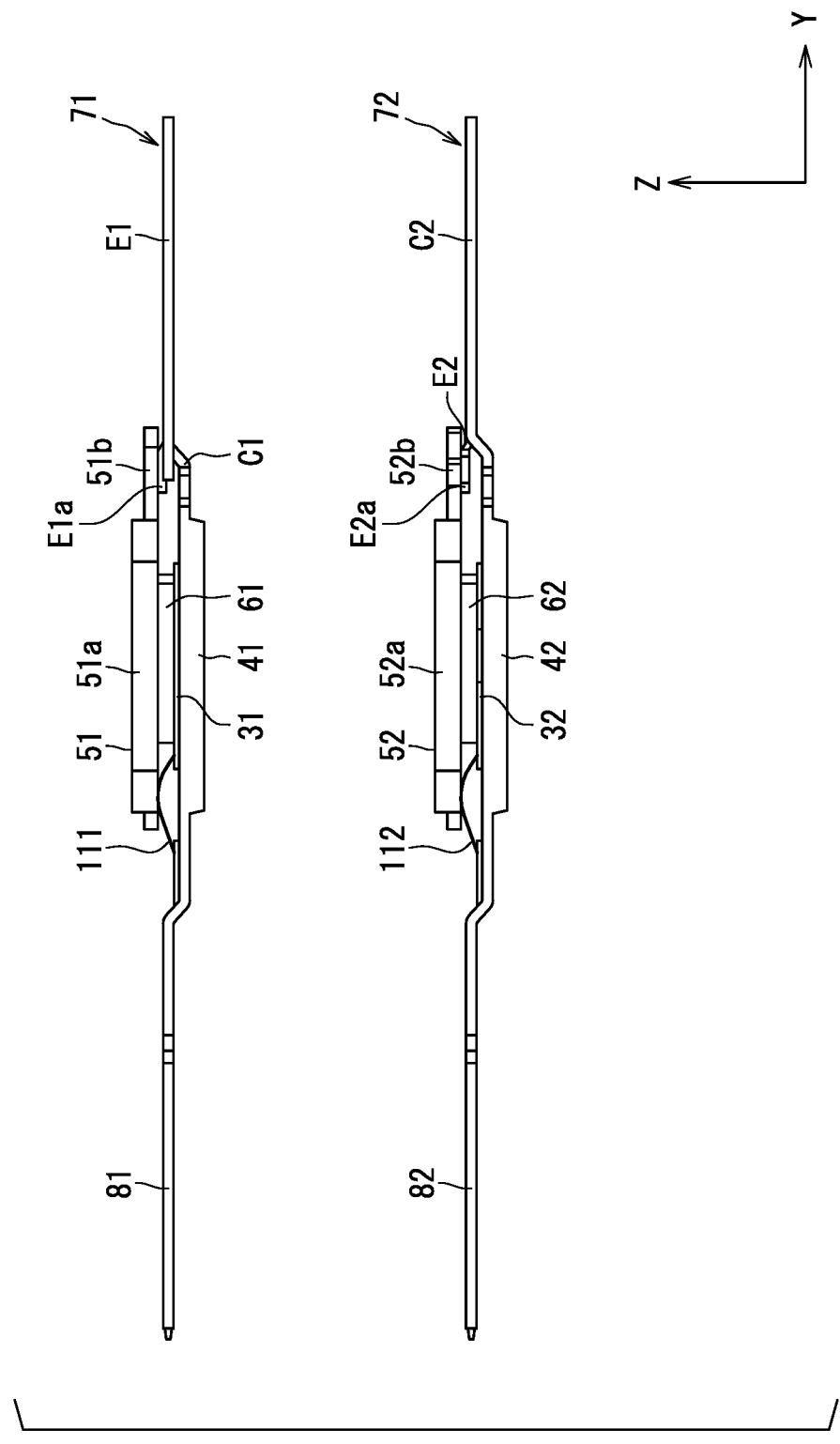
FIG. 7 is a planar view of FIG. 6 observed from the X1 direction.
Figure 8:
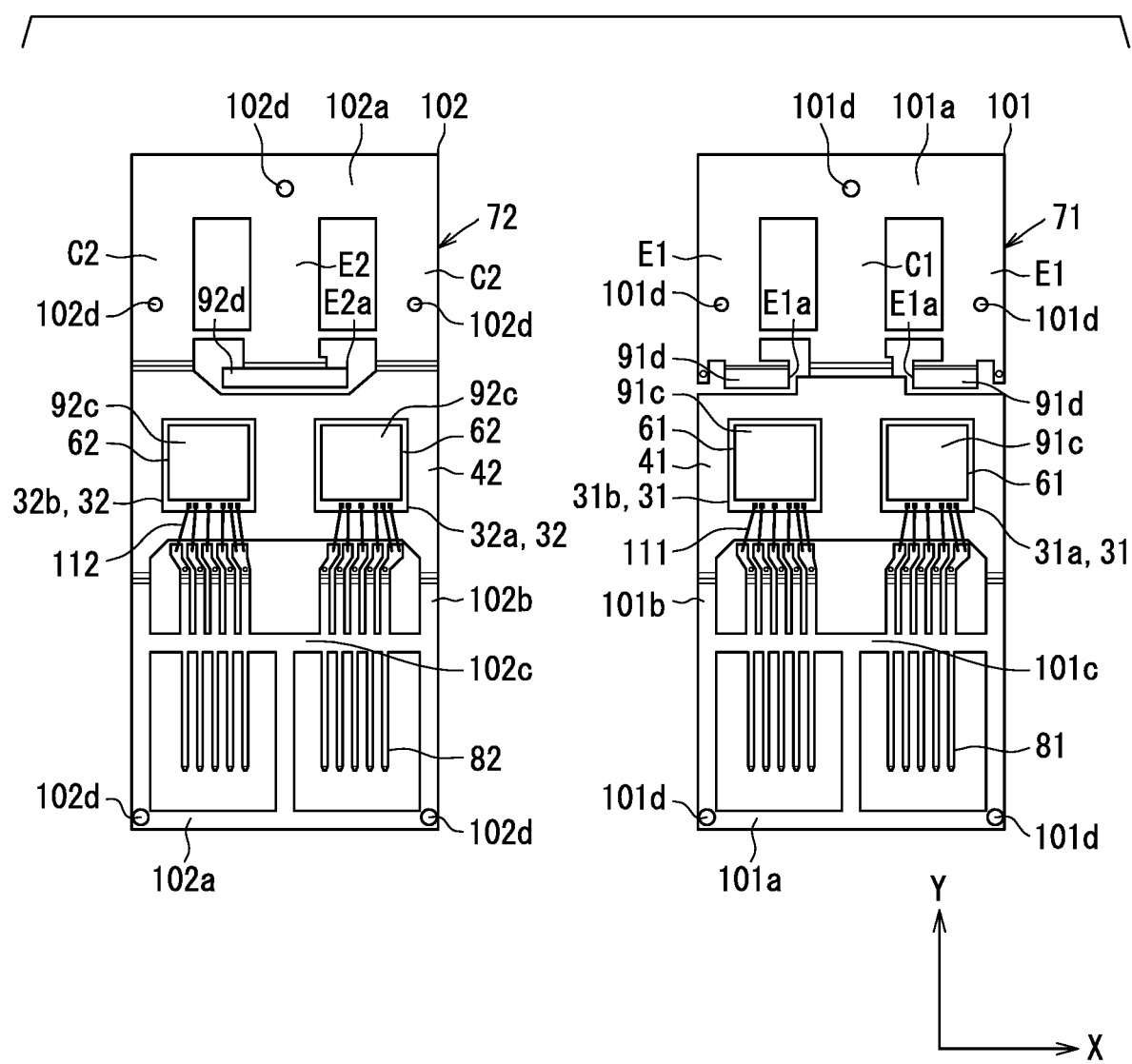
FIG. 8 is a planar view illustrating a state where a heat sink on the emitter side is omitted.

As illustrated in FIGS. 5, 6, and 7, the heat sink 51 has a body part 51a and a joint part 51b. To one plane of the body part 51a, the semiconductor element 31 is connected via the terminal 61. The joint part 51b is connected to the body part 51a. The joint part 51b is provided integrally with the body part 51a as one member. The joint part 51b is extended from one end of the body part 51a in the Y direction. The joint part 51b is thinner than the body part 51a.

Most part of the heat sinks 41 and 51 is covered with the sealing resin member 21. The plane opposite to the semiconductor element 31 in the surfaces of the heat sinks 41 and 51 is exposed from the sealing resin member 21. In the Z direction, the heat sink 41 is exposed from one plane 21a of the sealing resin member 21, and the heat sink 51 is exposed from the rear plane 21b opposite to the one plane 21a. The exposure plane of the heat sink 41 is almost flush with the one plane 21a, and the exposure plane of the heat sink 51 is almost flush with the rear plane 21b.

The main terminal 71 is a terminal through which main current flows, in the external connection terminals. The semiconductor device 11 has three or more main terminals 71. The main terminal 71 has a collector terminal C1 and an emitter terminal E1. The collector terminal C1 is connected to the heat sink 41. The collector terminal C1 is electrically connected to the collector electrode 31c via the heat sink 41. The emitter terminal E1 is connected to the heat sink 51. The emitter terminal E1 is electrically connected to the emitter electrode 31e via the heat sink 51 and the terminal 61.

The semiconductor device 11 has three main terminals 71. As illustrated in FIGS. 2, 3, 6, and 8, the main terminal 71 has one collector terminal C1 and two emitter terminals E1. As illustrated in FIG. 8, in a lead frame 101, the heat sink 41, the collector terminal C1 and the emitter terminal E1 as the main terminal 71, and the signal terminal 81 are configured.

The heat sink 41 is thicker than the other part in the lead frame 101, that is, the main terminal 71 and the signal terminal 81. The main terminal 71 and the signal terminal 81 are continuous so as to be almost flush with the element mounting plane of the heat sink 41. The ends on the same side of the plurality of main terminals 71 are connected to an outer frame 101a. The heat sink 41 is fixed to the outer frame 101a via the collector terminal C1 and a suspension lead 101b. The signal terminal 81 is fixed to the suspension lead 101b via a tie bar 101c. In the lead frame 101, a plurality of base holes 101d for positioning are provided.

The collector terminal C1 is provided integrally with the heat sink 41 as one member. The collector terminal C1 has a bent part in the sealing resin member 21 and projects to the outside from a part around the center in the Z direction in one side plane 21c of the sealing resin member 21. The emitter terminal E1 has an opposite part E1a to the joint part 51b of the heat sink 51. As illustrated in FIG. 5, the opposite part E1a is connected to the joint part 51b via solder 91d. The emitter terminal E1 has a bent part in the sealing resin member 21 and projects to the outside from a part around the center in the Z direction in the same side plane 21c which is the same as the collector terminal C1. All of the main terminals 71 are projected from the side face 21c. In the heat sink 51, for example, a not-illustrated circular-shaped groove may be formed so as to surround each of parts connected to the solder 91c and 91d. Overflowed solder is housed in the groove. To suppress wet spreading of the solder, in place of the groove, roughened plating or a roughened part by laser beam irradiation may be provided.

Figure 3:
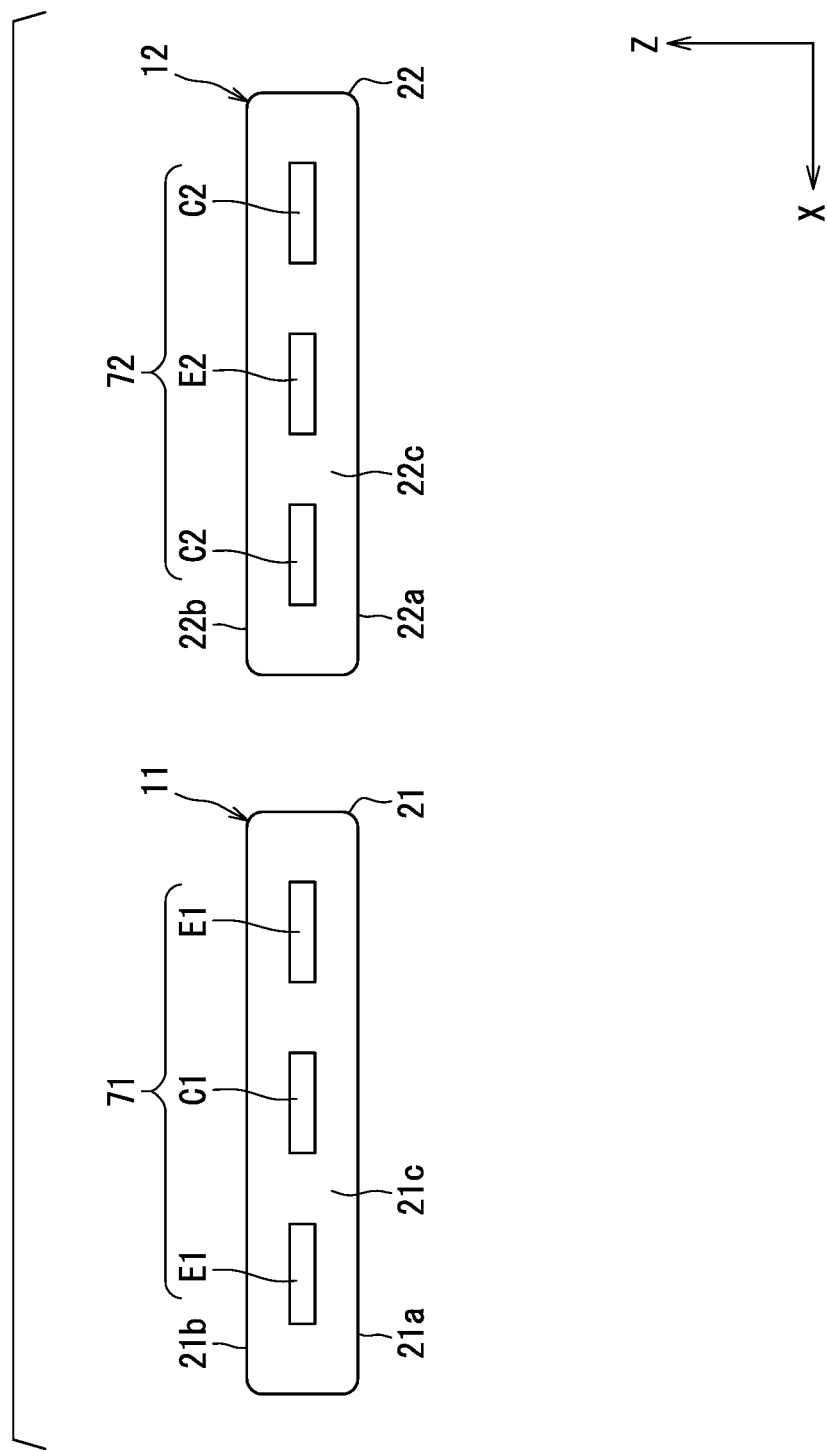
FIG. 3 is a planar view of the semiconductor device observed from a main terminal side.

The projection parts of the collector terminal C1 and the emitter terminal E1 extend in the Y direction. The collector terminal C1 and the emitter terminal E1 are disposed side by side in the X direction and their plate thickness direction almost matches the Z direction. As illustrated in FIG. 3 and the like, in the X direction, the collector terminal C1 is disposed between the emitter terminals E1. The arrangement order of the main terminals 71 is symmetrical with respect to the center in the arrangement. In the main terminal 71, the emitter terminal E1, the collector terminal C1, and the emitter terminal E1 are disposed in this order.

As illustrated in FIGS. 2 and 8, the collector terminal C1 and the emitter terminal E1 are disposed line-symmetrically with respect to the axis AX1 as the axis of symmetry. The collector terminal C1 is disposed on the axis AX1, and the center of the width of the collector terminal C1 almost matches the axis AX1. The two emitter terminals E1 are disposed line-symmetrically with respect to the axis AX1 as the axis of symmetry. Hereinafter, as illustrated in FIG. 8, one of the semiconductor elements 31 may be indicated as a semiconductor element 31a, and another one semiconductor element 31 may be indicated as a semiconductor element 31b. One of the emitter terminals E1 is disposed so as to be biased toward the side of the semiconductor element 31a from the axis AX1, and the other one of the emitter terminals E1 is disposed so as to be biased toward the side of the semiconductor element 31b from the axis AX1.

The signal terminal 81 is connected to the pad of the corresponding semiconductor element 31. The signal terminal 81 is connected to the pad via a bonding wire 111 in the sealing resin member 21. The signal terminal 81 projects from the side face of the sealing resin member 21, specifically, a side face 21d opposite to a side face 21c to the outside. The signal terminal 81 projects in the Y direction and in the direction opposite to the main terminal 71.

In the above-described semiconductor device 11, the sealing resin member 21 integrally seals the semiconductor element 31, a part of each of the heat sinks 41 and 51, the terminal 61, and a part of each of the main terminal 71 and the signal terminal 81.

Subsequently, the semiconductor device 12 on the lower arm 7L side will be described. With respect to the elements of the semiconductor device 12, the end number of each reference numeral is set as "2". The semiconductor device 12 has an sealing resin member 22, the semiconductor element 32, heat sinks 42 and 52, a terminal 62, a main terminal 72, and a signal terminal 82. Since the components of the semiconductor device 12 are the same as those of the semiconductor device 11 and the structure is almost the same, different parts will be mainly described.

The sealing resin member 22 seals the semiconductor element 32 and the like. As illustrated in FIG. 4, in the Z direction, a collector electrode 32c is formed in a plane of the semiconductor element 32, and an emitter electrode 32e is formed on the rear plane. The semiconductor device 12 also has a plurality of semiconductor elements 32. The plurality of semiconductor elements 32 are connected in parallel to form the lower arm 7L. In the present embodiment, the semiconductor device 12 has two semiconductor elements 32. The two semiconductor elements 32 have the same structure. The two semiconductor elements 32 are positioned at almost the same height in the Z direction and disposed side by side in the X direction.

As illustrated in FIGS. 2 and 8, the two semiconductor elements 32 are disposed line-symmetrically with respect to an axis AX2 which is orthogonal to the X direction and the Z direction as the axis of symmetry. In the present embodiment, the sealing resin member 22 has an almost rectangular shape in planar view, and the two semiconductor elements 32 are disposed so that the axis AX2 almost matches the center of the X direction of the outer shape of the sealing resin member 22.

The heat sinks 42 and 52 are disposed so as to sandwich the plurality of semiconductor elements 32. The plate thickness direction of the heat sinks 42 and 52 is almost parallel to the Z direction. As illustrated in FIGS. 2, 6, and 8, in the heat sinks 42 and 52, the X direction is the longer-side direction, and the Y direction is the shorter-side direction. As illustrated in FIG. 4, the heat sink 42 is connected to the collector electrode 32c via solder 92a. The heat sink 52 is connected to the emitter element 32e via solder 92b and 92c and the terminal 62.

The heat sink 52 has a body part 52a to which the semiconductor element 32 is connected via the terminal 62 and a joint part 52b connected to the body part 52a. The joint part 52b extends from one end of the body part 52a in the Y direction. The joint part 52b is thinner than the body part 52a. The heat sink 42 is exposed from one plane 22a of the sealing resin member 22, and the heat sink 52 is exposed from the rear plane 22b opposite to the one plane 22a. The exposure plane of the heat sink 42 is almost flush with the one plane 22a, and the exposure plane of the heat sink 52 is almost flush with the rear plane 22b.

The semiconductor device 12 has three or more main terminals 72. The main terminal 72 has a collector terminal C2 and an emitter terminal E2. The collector terminal C2 is electrically connected to a collector electrode 42c via the heat sink 42. The emitter terminal E2 is electrically connected to the emitter electrode 32e via the heat sink 52 and the terminal 62. The semiconductor device 12 has the main terminals 72 of the same number as those of the semiconductor device 11. The main terminal 72 has two collector terminals C2 and one emitter terminal E2. As illustrated in FIG. 8, in a lead frame 102, the heat sink 42, the collector terminal C2 and the emitter terminal E2 as the main terminals 72, and the signal terminal 82 are configured. Reference numeral 102a illustrated in FIG. 8 indicates an outer frame, reference numeral 102b indicates a suspension lead, reference numeral 102c indicates a tie bar, and reference numeral 102d denotes a base hole.

The collector terminal C2 is provided integrally with the heat sink 42 as one member. The collector terminal C2 has a bent part in the sealing resin member 22 and projects to the outside from a part around the center in the Z direction in one side plane 22c of the sealing resin member 22. The emitter terminal E2 has an opposite part E2a facing the joint part 52b of the heat sink 52. The opposite part E2a is connected to the joint part 52b via solder 92d. The emitter terminal E2 has a bent part in the sealing resin member 22 and projects to the outside from a part around the center in the Z direction in the same side plane 22c which is the same as the collector terminal C2. In the heat sink 52, for example, a circular-shaped trench may be formed so as to surround each of parts connected to the solder 92c and 92d.

The projection parts of the collector terminal C2 and the emitter terminal E2 extend in the Y direction. The collector terminal C2 and the emitter terminal E2 are disposed side by side in the X direction and their thickness direction almost matches the Z direction. As illustrated in FIG. 3 and the like, in the X direction, the emitter terminal E2 is disposed between the collector terminals C2. The arrangement order of the main terminals 72 is symmetrical with respect to the center in the arrangement. In the main terminal 72, the collector terminal C2, the emitter terminal E2, and the collector terminal C2 are disposed in this order. The arrangement order of the main terminal 72 and that of the main terminal 71 are opposite to each other.

As illustrated in FIGS. 2 and 8, the collector terminals C2 and the emitter terminal E2 are disposed line-symmetrically with respect to the axis AX2 as the axis of symmetry. The emitter terminal E2 is disposed on the axis AX2, and the center of the width of the emitter terminal E2 almost matches the axis AX2. The two collector terminals C2 are disposed line-symmetrically with respect to the axis AX2 as the axis of symmetry. Hereinafter, as illustrated in FIG. 8, one of the semiconductor elements 32 is also indicated as a semiconductor element 32a, and the other one of the semiconductor elements 32 is also indicated as a semiconductor element 32b. One of the collector terminals C2 is disposed so as to be biased toward the side of the semiconductor element 32a from the axis AX2, and the other one of the collector terminals C2 is disposed so as to be biased toward the side of the semiconductor element 32*b* from the axis AX2.

The signal terminal 82 is connected to the pad of the semiconductor element 32 via a bonding wire 112. In the sealing resin member 22, the signal terminal 82 projects from a side face 22*d* opposite to the side face 22*c* to the outside.

<Method of Manufacturing Semiconductor Device>

Subsequently, a method of manufacturing the semiconductor devices 11 and 12 will be described. Since processes (steps) of manufacture are the same in the semiconductor devices 11 and 12, the semiconductor device 11 will be described as an example.

First, elements constructing the semiconductor device 11 are prepared. The lead frame 101 illustrated in FIG. 8 is prepared. The semiconductor element 31, the terminal 61, and the heat sink 51 are also prepared.

Subsequently, on the mounting plane of the heat sink 41 in the lead frame 101, the semiconductor element 31 is disposed via the solder 91*a*. The semiconductor element 31 is disposed on the solder 91*a* so that the collector electrode 31*c* is on the mounting plane side. Then, the terminal 61 is disposed over the emitter electrode 31*e* via the solder 91*b*. The solder 91*c* is disposed on the face opposite to the semiconductor element 31 in the terminal 61. The solder 91*c* is disposed in an amount capable of absorbing height variations in the semiconductor device 11. The solder 91*b* and 91*c* may be preliminarily provided as retaining solder in the terminal 61. The solder 91*d* is disposed on the opposite part E1*a* of the emitter terminal E1. The solder 91*d* is also disposed in an amount capable of absorbing height variations in the semiconductor device 11.

In this layer stack state, the first reflow is performed. By the operation, the collector electrode 31*c* of the semiconductor element 31 and the heat sink 41 are connected via the solder 91*a*. The emitter electrode 31*e* of the semiconductor element 31 and the corresponding terminal 61 are connected via the solder 91*b*. That is, a connection body in which the lead frame 101, the semiconductor element 31, and the terminal 61 are integrated can be obtained. The solder 91*c* and 91*d* becomes retaining solder to be used in a post process in the connection body.

Subsequently, the pad of the semiconductor element 31 and the signal terminal 81 are electrically connected. In the present embodiment, by the bonding wire 111, the pad of the semiconductor element 31 and the signal terminal 81 are connected.

Then, the heat sink 41 is disposed on a not-illustrated base so that the terminal 61 side is positioned on the upper side. The heat sink 51 is disposed over the heat sink 41 so that the mounting plane on the side of the terminal 61 is positioned below. In this disposition state, the second reflow is performed. By the second reflow, the heat sink 51 is integrated in the connection body including the lead frame 101.

Subsequently, the sealing resin member 21 is formed. In the present embodiment, the transfer mold method is employed. The connection body including the lead frame 101 is disposed in a mold and the sealing resin member 21 is molded. In the present embodiment, the sealing resin member 21 is molded so that the heat sinks 41 and 51 are completely covered.

After that, unnecessary parts in the lead frame 101 such as the outer frame 101*a* and the tie bar 101*c* are removed. In such a manner, the semiconductor device 11 can be obtained.

<Schematic Structure of Semiconductor Module>

Figure 9:
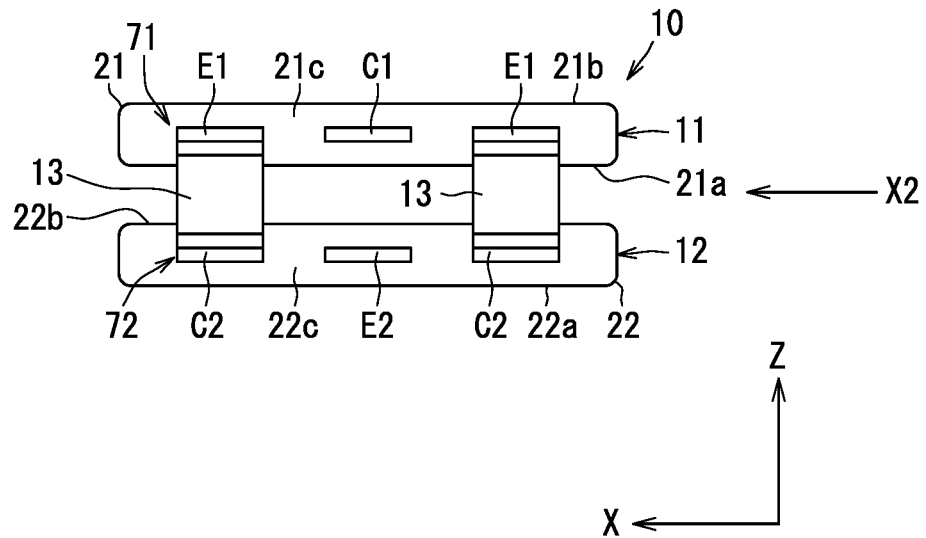
FIG. 9 is a planar view illustrating a semiconductor module according to the first embodiment.
Figure 10:
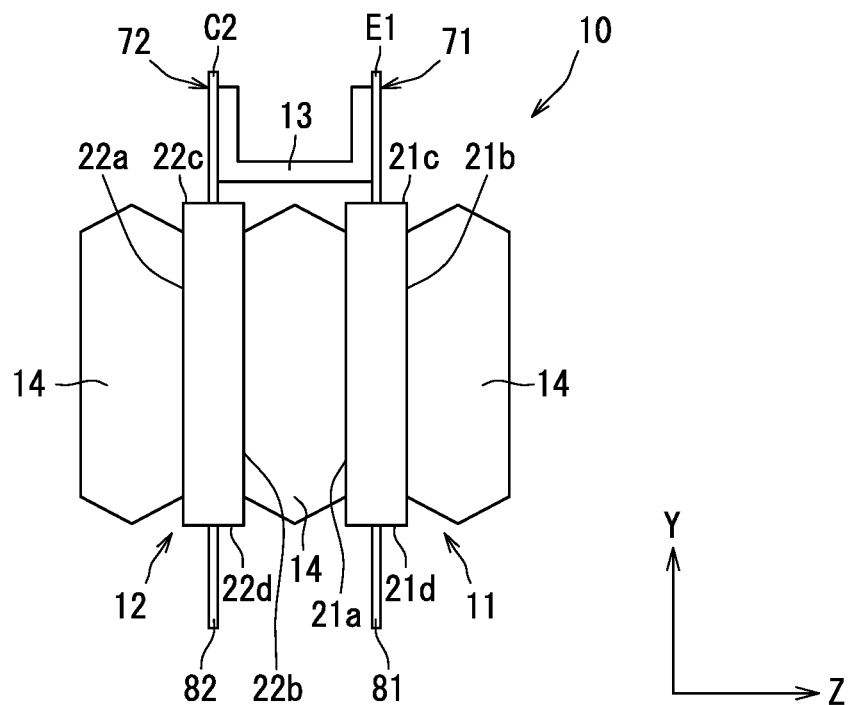
FIG. 10 is a planar view of FIG. 9 observed from the X2 direction.

Next, a schematic structure of the semiconductor module will be described. By one semiconductor module, the upper/lower arm 7 of one phase is configured. By three semiconductor modules, the inverter 5 is configured. As illustrated in FIGS. 9 and 10, the semiconductor module 10 has the above-described semiconductor devices 11 and 12, a coupling member 13, and a cooler 14. In FIG. 9, for convenience, the cooler 14 is omitted.

The cooler 14 is formed by using a metal material having excellent heat conductivity, for example, an aluminum-based material. The cooler 14 has a tubular body of a flat shape as a whole. To cool the semiconductor devices 11 and 12 which generate heat at the time of operation, the semiconductor devices 11 and 12 and the cooler 14 are alternately stacked. The semiconductor devices 11 and 12 and the coolers 14 are disposed side by side in the Z direction. Each of the semiconductor devices 11 and 12 is sandwiched by the coolers 14. By the coolers 14, the semiconductor devices 11 and 12 are cooled from both sides.

To the cooler 14, an introduction pipe and a discharge pipe which are not illustrated are connected. When refrigerant is supplied to the introduction pipe by a not-illustrated pump, the refrigerant flows in a flow path in the cooler 14 stacked. Consequently, each of the semiconductor devices 11 and 12 is cooled by the refrigerant. The refrigerant flowed in each of the coolers 14 is discharged via the discharge pipe.

In the semiconductor device 11, the collector terminal C1 on the high potential side is electrically connected to the power line 8P. The emitter terminal E1 on the low potential side is an output terminal. The collector terminal C1 is also called a P terminal or a positive electrode terminal, and the output terminal is also called an O terminal. In the semiconductor device 12, the collector terminal C2 on the high potential side is an output terminal. The emitter terminal E2 on the low potential side is electrically connected to the power line 8N. The collector terminal C2 is also called an O terminal, and the emitter terminal E2 is also called an N terminal or a negative electrode terminal.

As illustrated in FIGS. 9 and 10, a set of the semiconductor devices 11 and 12 constructing the upper/lower arm 7 are disposed so as to be adjacent to each other via the cooler 14. The semiconductor devices 11 and 12 are disposed so that the collector terminal C1 and the emitter terminal E2 face each other and the emitter terminal E1 and the collector terminal C2 are opposite to each other. "Opposite" denotes a state that the planes face each other in at least a part of the projection parts from the corresponding sealing resin members 21 and 22. In the present embodiment, the projection parts from the corresponding sealing resin members 21 and 22 face each other in almost the entire region.

The coupling member 13 is a member connecting the semiconductor devices 11 and 12. The coupling member 13 is a wire electrically connecting the upper arm 7U and the lower arm 7L. The coupling member 13 electrically connects the emitter terminal E1 and the collector terminal C2 as output terminals. One semiconductor module 10 has two coupling members 13 to connect two sets of output terminals.

The coupling member 13 is formed by, for example, processing a metal plate. The coupling member 13 is also called a bridge member or a connecting bus-bar. The coupling member 13 is connected to the emitter terminal E1 and the collector terminal C2 by, for example, welding. The coupling member 13 of the present embodiment has an almost U-letter shape. The emitter terminal E1 is connected to one end of the coupling member 13, and the collector terminal C2 is connected to the other end. The coupling member 13 is disposed so that a corresponding output terminal and a plate face each other and connected in this disposition state. The two coupling members 13 have the same structure.

Figure 11:
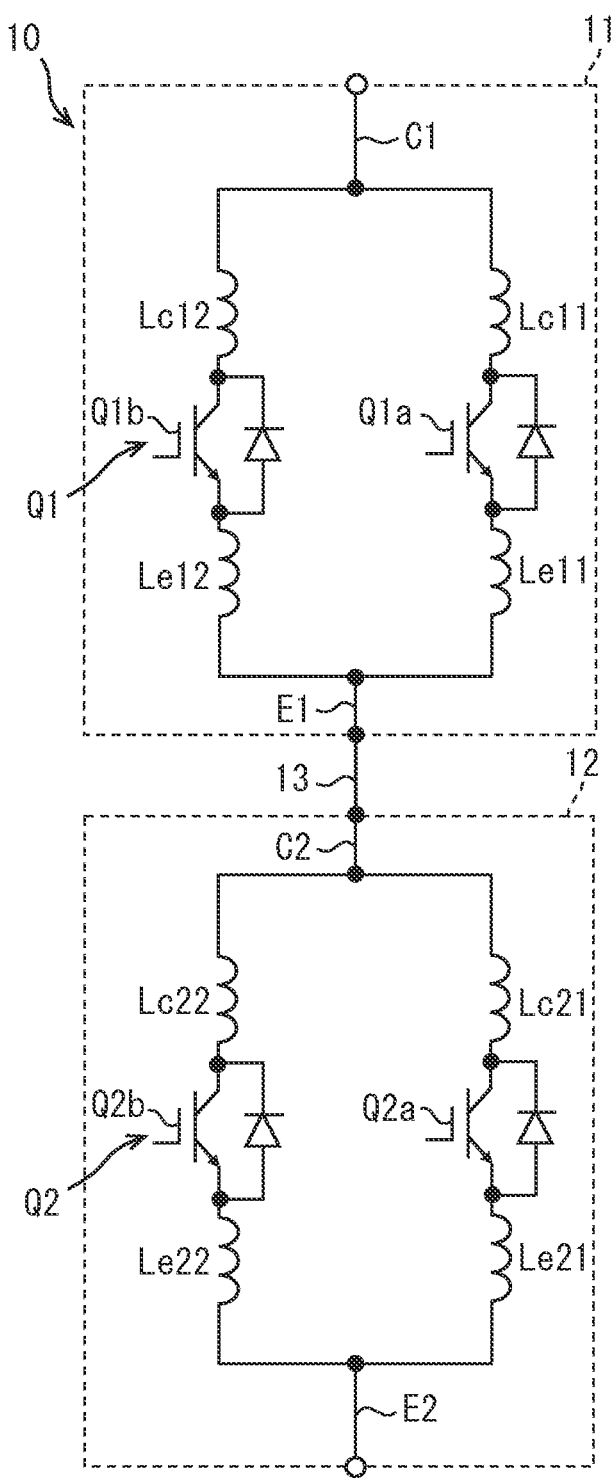
FIG. 11 is an equivalent circuit diagram of the semiconductor module in which a wiring inductance is considered.

FIG. 11 is an equivalent circuit diagram in which wiring inductance (parasite inductance) of the semiconductor module 10, that is, the upper/lower arm 7 is considered. In FIG. 11, in the switching element Q1, the switching element formed in the semiconductor element 31a is expressed as Q1a, and the switching element formed in the semiconductor element 31b is expressed as Q1b. In the switching element Q2, the switching element formed in the semiconductor element 32b is expressed as Q2a, and the switching element formed in the semiconductor element 32b is expressed as Q2b. Lc11, Lc12, Le11, and Le12 denote wiring inductances of a parallel circuit of the switching element Q1. Lc21, Lc22, Le21, and Le22 denote wiring inductances of a parallel circuit of the switching element Q2.

As described above, the semiconductor devices 11 and 12 have three or more main terminals 71 and 72, respectively. Specifically, the semiconductor device 11 has at least a plurality of collector terminals C1 or a plurality of emitter terminals E1. The semiconductor device 12 has at least a plurality of collector terminals C2 or a plurality of emitter terminals E2. A plurality of main terminals of the same kind are arranged in parallel. For example, the emitter terminals E1 are arranged in parallel, and the collector terminals C2 are arranged in parallel. By such arrangement, the inductance of the main terminal can be reduced.

The arrangement order of the main terminals 71 and 72 in the semiconductor device 11 and that in the semiconductor device 12 are opposite to each other. The number of the emitter terminals E1 and that of the collector terminals C2 as output terminals are the same. Therefore, as compared with the case of constructing the upper and lower arms by using the same (one kind of) semiconductor device, the connection structure of the output terminals is simplified, so that the inductance of the main circuit wiring can be reduced. The main circuit denotes a circuit including the smoothing capacitor Cs and the upper/lower arm 7.

The arrangement order of the collector terminal C1 and that of the emitter terminal E1 are symmetrical with respect to the center of arrangement. As compared with the asymmetrical configuration, the wiring inductances Lc11 and Lc12 can be arranged closer to each other, and the wiring inductances Le11 and Le12 can be arranged closer to each other. The arrangement order of the collector terminal C2 and that of the emitter terminal E2 are symmetrical with respect to the center of arrangement. As compared with the asymmetrical configuration, the wiring inductances Lc21 and Lc22 can be arranged closer to each other, and the wiring inductances Le21 and Le22 can be arranged closer to each other. By the above, in each of the semiconductor devices 11 and 12, unbalance of current flowing at the time of switching, that is unbalance of Alternating current can be suppressed.

When the arrangement order is made symmetrical in the semiconductor device 11, the number of collector terminals C1 and the emitter terminals E1 adjacent to each other in the X direction increases. In the collector terminal C1 and the emitter terminal E1 adjacent each other, the side faces are opposite to each other. By the effect of cancel-out of magnetic fluxes, the inductance can be reduced. Similarly, also in the semiconductor device 12, the inductance can be reduced.

A plurality of semiconductor elements 31 are disposed line-symmetrically with respect to the axis AX1 which is orthogonal to the X direction as the arrangement direction. Using the axis AX1 as the axis of symmetry, the collector terminal C1 and the emitter terminal E1 are disposed line-symmetrically. By the disposition, the current path of the collector terminal C1→the switching element Q1a→the emitter terminal E2 and the current path of the collector terminal C1→the switching element Q1b→the emitter terminal E2 become almost line-symmetrical with respect to the axis AX1 as the axis of symmetry. That is, the wiring inductances Lc11 and Lc12 are almost equal to each other. The wiring inductances Le11 and Le12 are almost equal to each other. Therefore, in the semiconductor device 11, unbalance of the Alternating current can be effectively suppressed.

Similarly, a plurality of semiconductor elements 32 are disposed line-symmetrically with respect to the axis AX2 which is orthogonal to the X direction as the arrangement direction. Using the axis AX2 as the axis of symmetry, the collector terminal C2 and the emitter terminal E2 are disposed line-symmetrically. By the disposition, the current path of the collector terminal C2→the switching element Q2a→the emitter terminal E2 and the current path of the collector terminal C2→the switching element Q2b→the emitter terminal E2 become almost line-symmetrical with respect to the axis AX2 as the axis of symmetry. That is, the wiring inductances Lc21 and Lc22 are almost equal to each other. The wiring inductances Le21 and Le22 are almost equal to each other. Therefore, in the semiconductor device 12, unbalance of the Alternating currents can be effectively suppressed.

In the present embodiment, the centers of the semiconductor elements 31 disposed side by side perfectly match in the Y direction. The centers of the semiconductor elements 32 disposed side by side also perfectly match in the Y direction. With the configuration, the unbalance of the Alternating currents can be suppressed more effectively. However, the present invention is not limited to the perfect match of the centers. Even though there is a slight deviation in the Y direction, effects similar to the above effects can be produced.

To the main terminals 71 and 72, a bus bar and the like are connected for electric connection to the smoothing capacitor Cs and the motor generator 3. The bus bar is, for example, welded. Therefore, by making at least the part forming the current path, that is, the part to the position of connection to the bus bar in each of the main terminals 71 and 72 line-symmetrical, the above-described effects can be produced.

The axis AX1 almost matches the center in the X direction of the outer shape of the sealing resin member 21. Consequently, while miniaturizing the build of the semiconductor device 11, the above-described effects can be produced. Similarly, the axis AX2 almost matches the center in the X direction of the outer shape of the sealing resin member 22. Consequently, while miniaturizing the build of the semiconductor device 12, the above-described effects can be produced.

By the plurality of coupling members 13, the semiconductor devices 11 and 12 are connected. By increasing the connection paths between the upper arm 7U and the lower arm 7L, the inductance of the main circuit wiring can be reduced.

All of the main terminals 71 project from the side face 21c of the sealing resin member 21 and are arranged along the X direction. All of the main terminals 72 project from the side face 22c of the sealing resin member 22 and are arranged along the X direction. By the arrangement, the connection between the upper arm 7U and the lower arm 7L and the connection to the smoothing capacitor Cs are simplified, and the inductance of the main circuit wiring can be reduced.

The projection parts of the collector terminal C1 and the emitter terminal E2 face each other almost in the entire region, and the projection parts of the emitter terminal E1 and the collector terminal C2 face each other almost in the entire region. Therefore, the inductance of the main circuit wiring can be effectively reduced.

The heat sinks 41 and 51 are shared by the plurality of semiconductor elements 31. Therefore, voltage fluctuation among the switching elements Q1 can be suppressed. Similarly, since the heat sinks 42 and 52 are shared by the semiconductor elements 32, voltage fluctuation among the switching elements Q2 can be suppressed. Further, the number of parts can be also reduced.

<Detailed Structure of Semiconductor Module>

Figure 12:
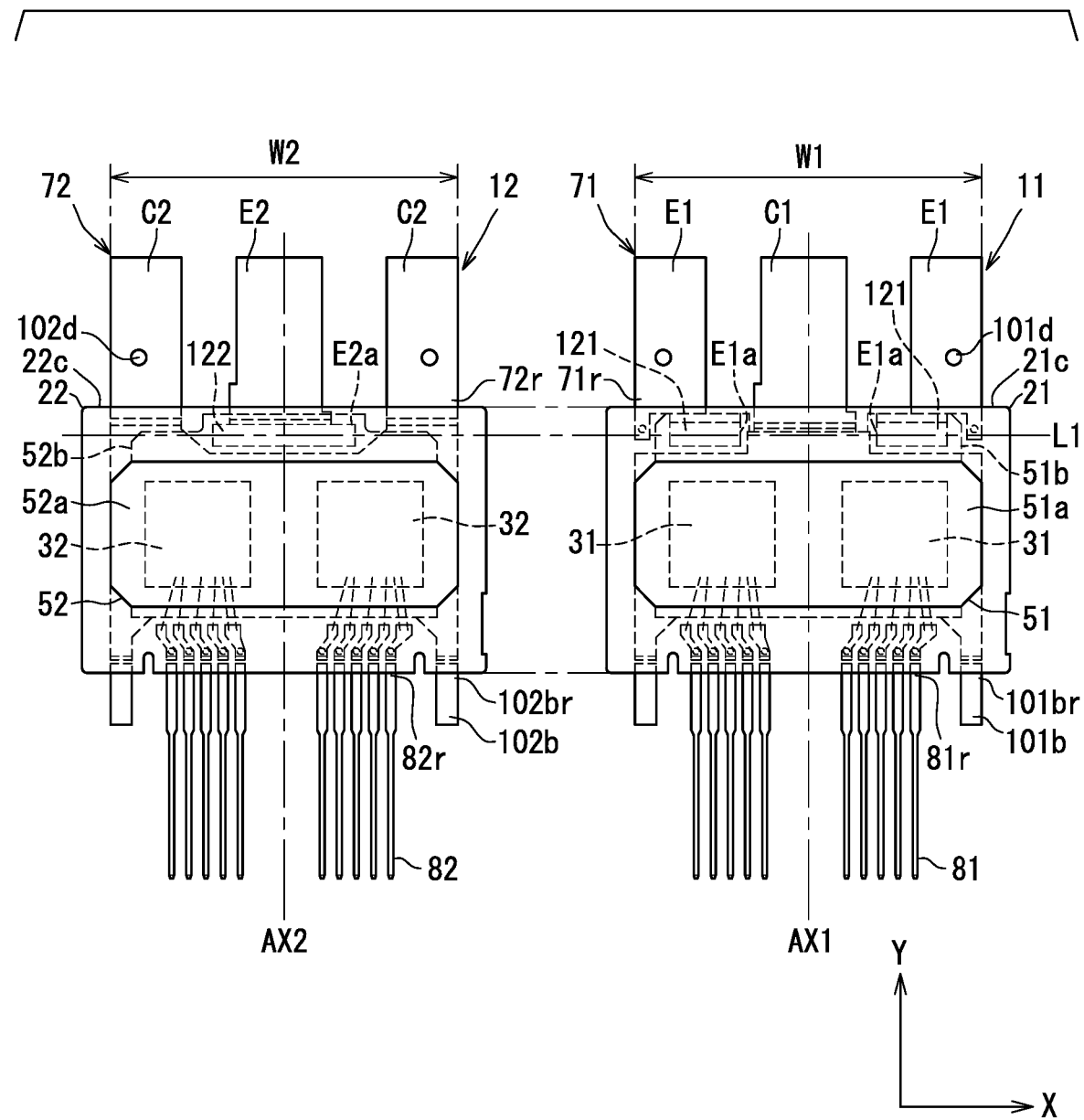
FIG. 12 is a planar view illustrating the structure in the sealing resin member in the semiconductor device.

Next, the structure of the above-described semiconductor module will be described specifically. FIG. 12 corresponds to FIG. 2 and elements in the sealing resin members 21 and 22 are indicated by broken lines.

The semiconductor module 10 is configured by including the semiconductor devices 11 and 12 having three or more main terminals 71 and 72 as described above. For position precision at the time of molding the sealing resin member and the like, all of the main terminals 71 and 72 are configured in the lead frames 101 and 102. The arrangement orders and the main terminals 71 and 72 are opposite to each other and, between the semiconductor devices 11 and 12, a difference occurs in the connection structures between the emitter terminals E1 and E2 and the heat sinks 51 and 52. It is consequently feared that the manufacture process is complicated, that is, productivity declines.

When the emitter terminal E1 is constructed together with the collector terminal E1 in the lead frame 101, clamping is not performed by a mold on the heat sink 51 side but only the heat sink 41 (lead frame 101) side is clamped. Since only one member is clamped, the position precision at the time of molding the sealing resin member 21 improves. For example, resin leakage can be suppressed. The lead frame 102 is similar.

To solve the above-described problem, in the semiconductor module 10 according to the present embodiment, as illustrated in FIGS. 2 to 5, FIG. 12, and the like, the sealing resin members 21 and 22 have the same structure, and at least root parts 71r and 72r in the projection parts of and the main terminals 71 and 72 have the same structure. The sealing resin members 21 and 22 have the same shape and the same size. The sealing resin members 21 and 22 have the same appearance. The root parts 71r and 72r have the same shape and the same size.

The root parts 71r and 72r of the collector terminal C1 and the emitter terminal E2 have the same structure. The root parts 71r and 72r of the emitter terminal E1 and the collector terminal C2 have the same structure. The arrangements (positions) of the root parts 71r and 72r to the sealing resin members 21 and 22 are also the same. Consequently, the sealing resin members 21 and 22 can be molded by using the same mold. By sharing the mold, productivity can be improved. For example, mold change can be made unnecessary.

The root parts 71r and 72r are parts clamped by the mold at the time of molding the sealing resin members 21 and 22, in the main terminals 71 and 72. The root parts 71r and 72r are parts in a predetermined range (for example, about 1 mm) from the side faces 21c and 22c of the sealing resin members 21 and 22. The same arrangement denotes, for example, a position relation that the root parts 71r and 72r overlap almost perfectly in projection view from the Z direction in a state where the semiconductor devices 11 and 12 are stacked so that the sealing resin members 21 and 22 match.

Between the heat sink 51 and the emitter terminal E1, a solder joint part 121 via the solder 91d is formed. Between the heat sink 52 and the emitter terminal E2, a solder joining part 122 via the solder 92d is formed. Using at least one of the sealing resin members 21 and 22 and the root parts 71r and 72r as a position reference of the semiconductor devices 11 and 12, at least a part of the solder joint parts 121 and 122 is provided in the same position in the Y direction. As illustrated in FIG. 12, the solder joint parts 121 and 122 are provided on an imaginary line L1 parallel to the X direction.

By the above, solder joint can be performed in the same reflow process and condition. Particularly, the second reflow can be performed in the same process and condition. At the time of performing the reflow during carriage along the X direction, for example, the position of a heater can be made the same. Also in the case where the heater is provided just below the heat sinks 41 and 42, heat transfer distance from the heater to the solder joint part 121 and that to the solder joining part 122 can be made almost the same. Consequently, occurrence of a bias in the melting state of the solder 91d and 92d at the time of reflow can be suppressed.

By the above, in the semiconductor module 10 according to the present embodiment, while having two kinds (two part numbers) of semiconductor devices 11 and 12, productivity can be improved. Particularly, in the present embodiment, the Y-direction centers of the solder joint parts 121 and 122 coincide with each other. Consequently, productivity can be further improved.

The other clamp parts in the lead frames 101 and 102 have the same structure, and the dispositions to the sealing resin members 21 and 22 are also the same. For example, root parts 81r and 82r in projection parts of the signal terminals 81 and 82 have the same structure and their arrangements (positions) to the sealing resin members 21 and 22 are also the same. Root parts 101br and 102br in the projection parts of the suspension leads 101b and 102b have the same structure and their arrangements (positions) to the sealing resin members 21 and 22 are also the same.

In the present embodiment, the whole projection parts of the main terminals 71 and 72 have the same structure and the same arrangement. The appearances of the semiconductor devices 11 and 12 are the same although the potentials (collector/emitter) of the main terminals 71 and 72 are opposite. Consequently, the productivity can be further improved. For example, manufacture can be performed by the same process and the same condition. For example, connection to the smoothing capacitor Cs can be performed by the same process and the same condition.

In the present embodiment, as illustrated in FIG. 12, using the axis AX1 as the axis of symmetry, the solder joint parts 121 are disposed line-symmetrically. Using the axis AX1 as the axis of symmetry, the semiconductor elements 31 and the solder joint parts 121 are disposed line-symmetrically. Using the axis AX2 as the axis of symmetry, the solder joint parts 122 are disposed line-symmetrically. Using the axis AX2 as the axis of symmetry, the semiconductor elements 32 and the solder joint parts 122 are disposed line-symmetrically. With the arrangement, in the X direction, balance at the time of reflow (second reflow) is obtained. Therefore, productivity can be improved. For example, a tilt of the heat sinks 51 and 52 in the X direction as the longer-side direction can be suppressed. Unbalance of Alternating current can be also suppressed.

In the present embodiment, the base holes 101d and 102d for positioning provided for the lead frames 101 and 102 are also in the same positions using the sealing resin members 21 and 22 and the like as position references. For example, not-illustrated positioning pins are positioned so as to be matched with the base holes 101d and 102d. Therefore, the positions of the corresponding elements in the semiconductor devices 11 and 12 can be aligned with high precision.

In the present embodiment, as illustrated in FIG. 12, width W1 of the plurality of main terminals 71 and width W2 of the plurality of main terminals 72 are made equal to each other. In other words, the width in the X direction in the lead frame 101 and that in the lead frame 102 are made equal to each other. Consequently, in each process, before the positioning (real positioning) is performed by using the base holes 101d and 102d, temporary positioning can be performed by using the outer shapes of the lead frames 101 and 102. Therefore, time required for the positioning can be shortened. The width W1 corresponds to the length of the disposition region of the plurality of main terminals 71 in the width direction of the main terminals 71. The width W2 corresponds to the length of the disposition region of the plurality of main terminals 72 in the width direction of the main terminals 72.

In the present embodiment, the heat sinks 41 and 42 as thick parts in the lead frames 101 and 102 have the same structure. Since the heat capacity of the heat sink 41 and that of the heat sink 42 are the same, at the time of forming the semiconductor devices 11 and 12, solder joint can be performed by the same reflow process and the same condition. For example, the first reflow can be performed by the same process and the same condition.

Figure 13:
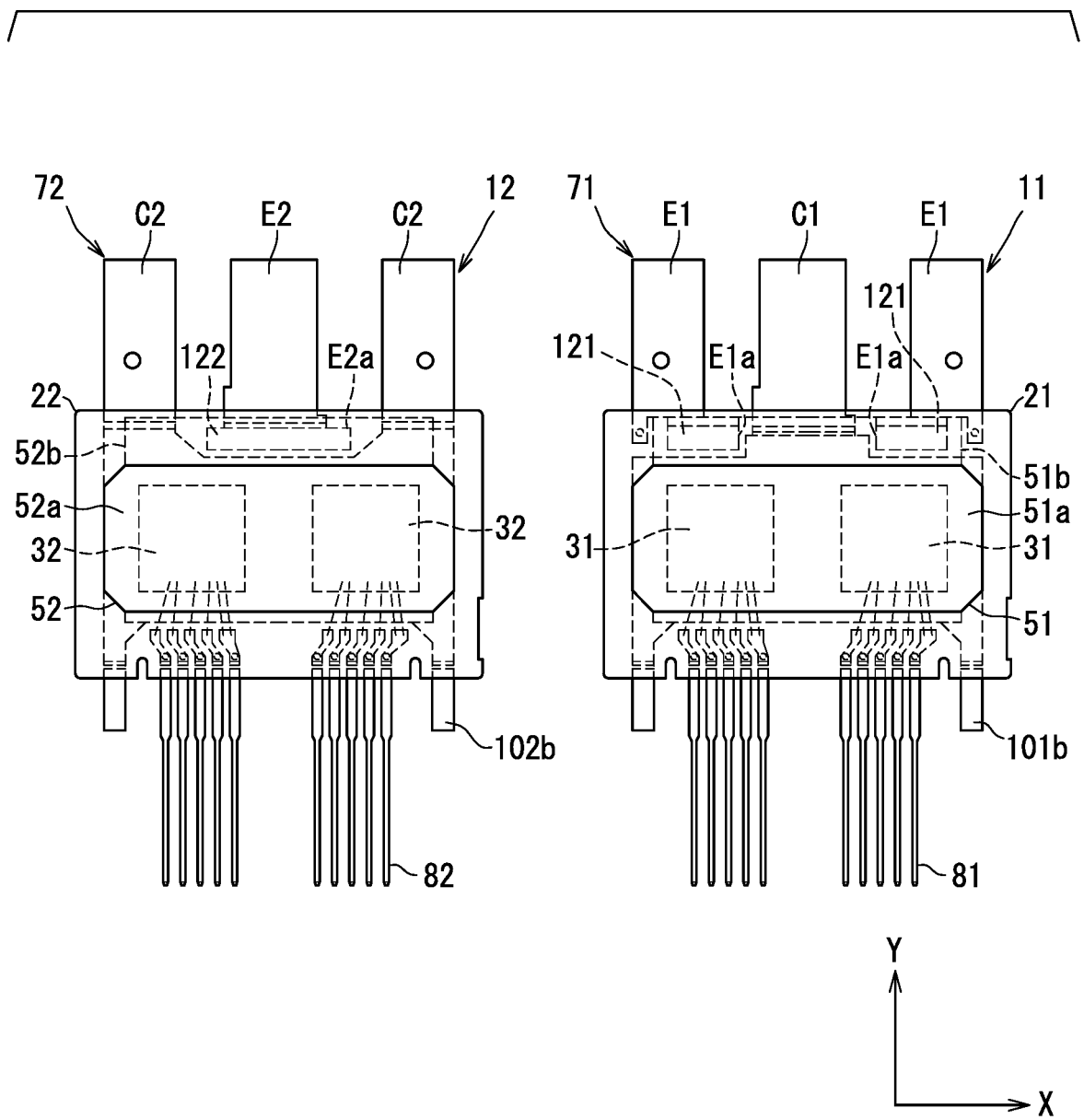
FIG. 13 is a planar view illustrating a modification.

Although the example that the structures of the heat sinks 51 and 52 are different from each other has been described in the present embodiment, the present disclosure is not limited to the example. As in a modification illustrated in FIG. 13, the heat sinks 51 and 52 having the same structure can be also employed. The heat sinks 51 and 52 have the same shape and the same size. The heat sinks 51 and 52 have the same heat capacity. Consequently, the second reflow can be stabilized. By making the heat sinks 51 and 52 the same, the number of parts can be reduced.

Figure 14:
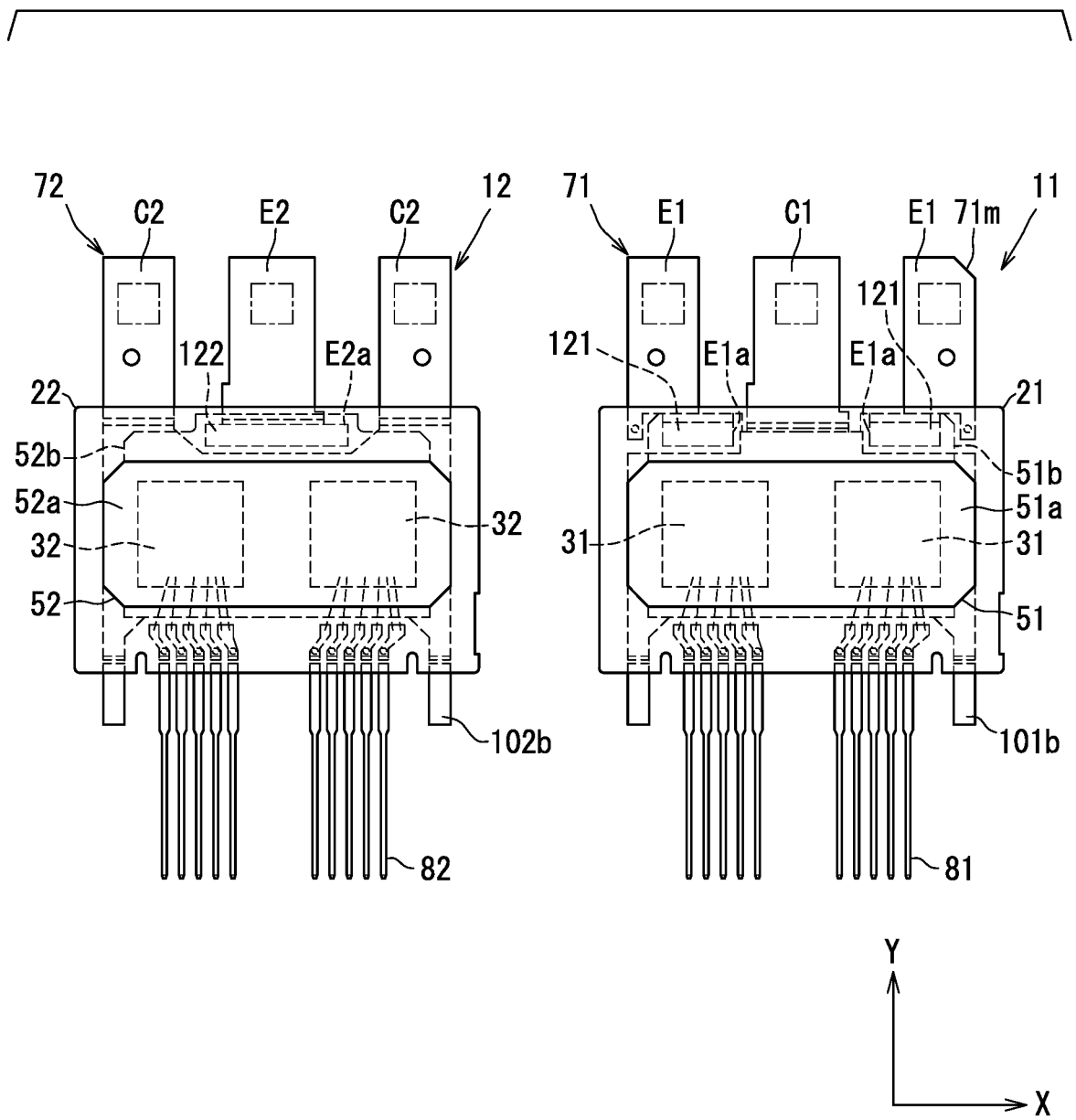
FIG. 14 is a planar view illustrating a modification.

In the case where the semiconductor devices 11 and 12 have the same appearance, a mark for distinction from the other may be provided for at least one of the semiconductor devices 11 and 12. It is preferable to provide the mark on the tip side of the projection more than the part where the bus bar and the like are connected. That is, it is preferable to provide the mark in a part which does not exert an influence on the current operation of the upper/lower arm 7. In a modification illustrated in FIG. 14, a notch 71m as a mark is provided in one of the emitter terminals E1 of the semiconductor device 11. It can suppress erroneous connection of the same semiconductor devices. The position of the notch 71m in the main terminal 71 is not limited to the emitter terminal E1. Another notch may be also provided in a different position in the semiconductor device 12 in addition to the notch 71m. For example, a notch may be provided at the projection end of the emitter terminal E2.

Another mark other than a notch may be used. For example, a mark formed by printing, laser process, or the like can be also employed. To improve productivity, the above-described notch is preferable. A notch may be formed, for example, at the time of forming the lead frames 101 and 102 or at the time of removing (lead cutting) the tie bars 101c and 102c and the like.

Although the example that the semiconductor device 11 has the three main terminals 71 and the semiconductor device 12 has the three main terminals 72 has been described, the present disclosure is not limited to the example. A configuration having four or more main terminals 71 and four or more main terminals 72 may be employed.

Figure 15:
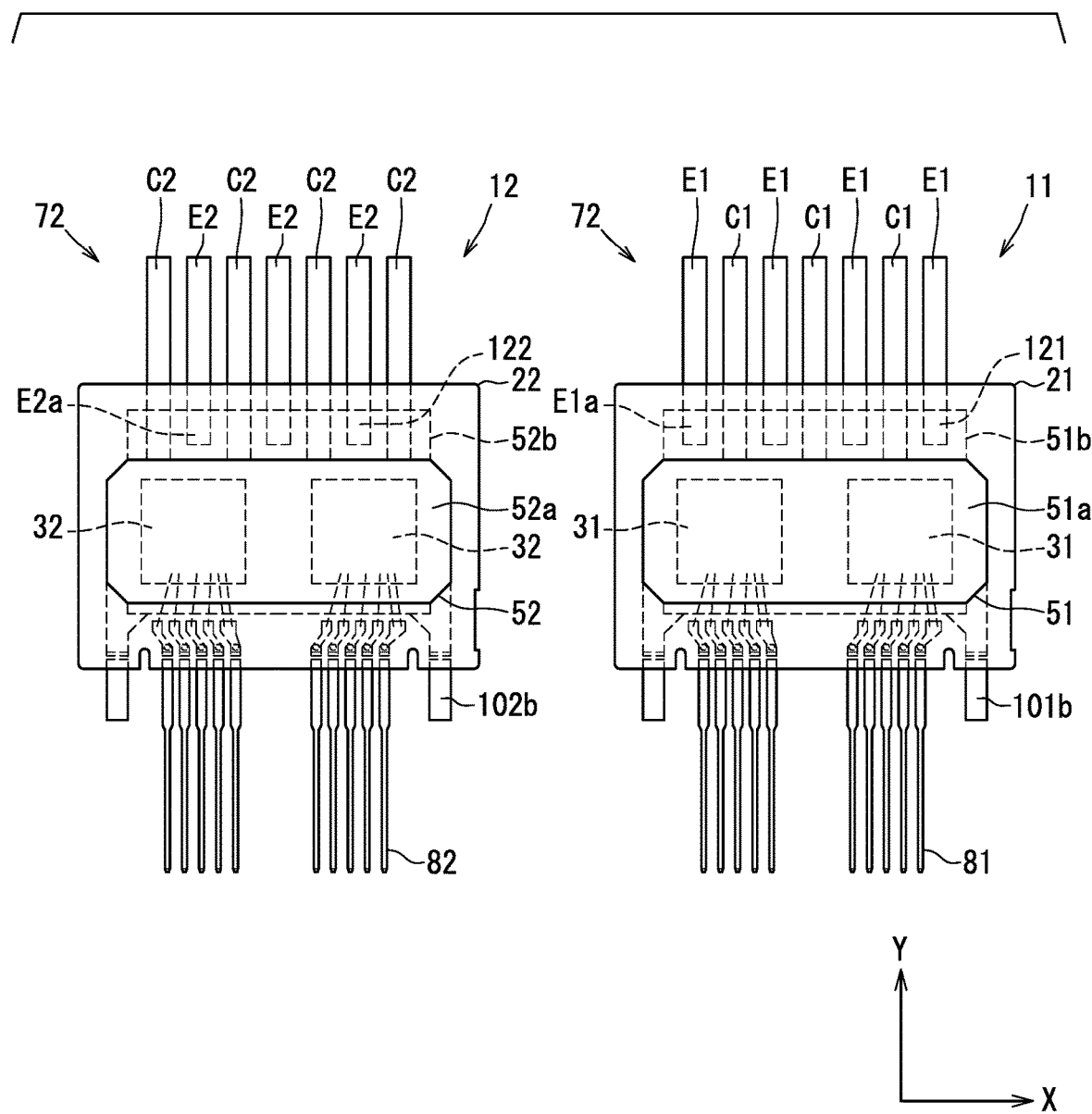
FIG. 15 is a planar view illustrating a modification.

In a modification illustrated in FIG. 15, the semiconductor device 11 has seven main terminals 71 and the semiconductor device 12 has seven main terminals 72. The semiconductor device 11 has three collector terminals C1 and four emitter terminals E1. The collector terminals C1 and the emitter terminals E1 are disposed alternately in the X direction.

The semiconductor device 12 has four collector terminals C2 and three emitter terminals E2. The collector terminals C2 and the emitter terminals E2 are disposed alternately in the X direction. The arrangement order of each of the main terminals 71 and 72 is symmetrical with respect to the center of the arrangement. The arrangement orders viewed from the center of the main terminals 71 and 72 are opposite to each other. The number of solder joint parts 121 is four and the number of solder joint parts 122 is three. In FIG. 15, the heat sinks 51 and 52 have the same structures as those in FIG. 13.

Although the example that the semiconductor device 11 has two semiconductor elements 31 and the semiconductor device 12 has two semiconductor elements 32 has been described, the present disclosure is not limited to the example. Three or more semiconductor elements 31 and three or more semiconductor elements 32 may be provided.

Although the example that the semiconductor devices 11 and 12 each of the both-side heat dissipation structure have the terminals 61 and 62 has been described, the present disclosure is not limited to the example. A configuration that the terminals 61 and 62 are not provided may be also employed. Although the example that the heat sinks 41, 42, 51, and 52 are exposed from the corresponding sealing resin members 21 and 22 has been described, a configuration that the heat sinks 41, 42, 51, and 52 are not exposed from the sealing resin members 21 and 22 may be also employed. The heat sinks 41, 42, 51, and 52 may be divided into a plurality of parts, for example, in accordance with the numbers of the semiconductor elements 31 and 32. However, when they are integrated, the productivity can be improved. Fluctuations of voltage in the parallel circuit can be suppressed.

Second Embodiment

In a second embodiment, the same reference numerals are designated to parts corresponding to the parts in the foregoing embodiment in view of function and/or structure and/or relates parts. With respect to the corresponding part and/or the related part, the description of the forgoing embodiment can be referred to.

Figure 16:
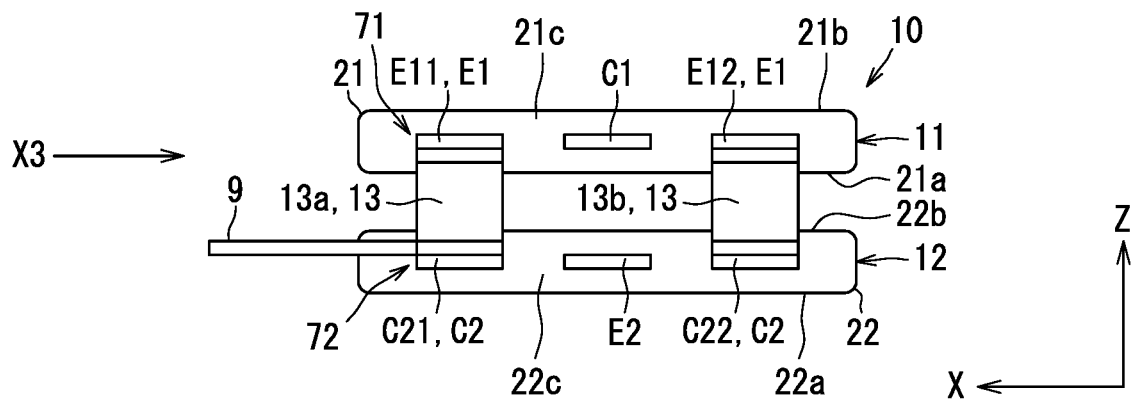
FIG. 16 is a planar view illustrating a semiconductor module according to a second embodiment.
Figure 17:
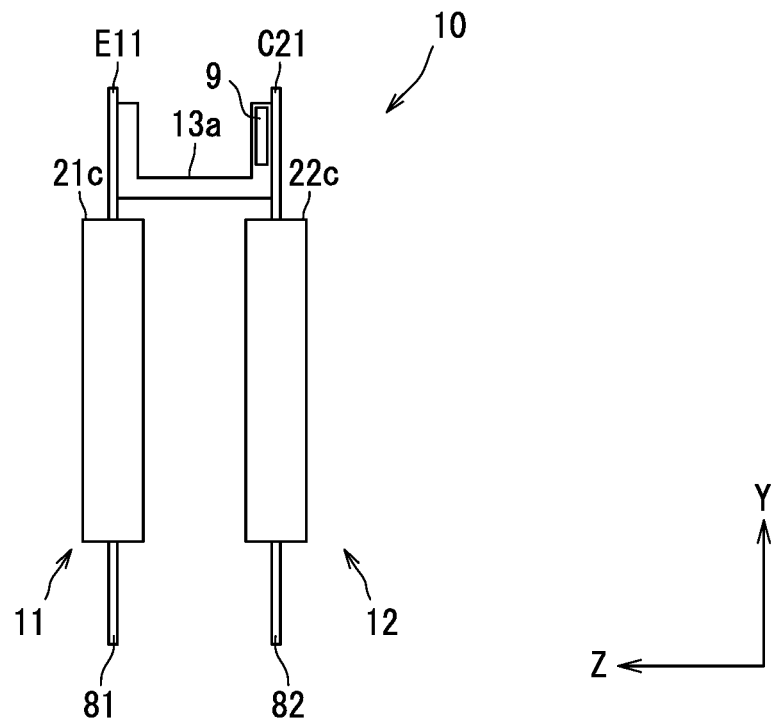
FIG. 17 is a planar view of FIG. 16 observed from the X3 direction.

As illustrated in FIGS. 16 and 17, the semiconductor module 10 according to the second embodiment further has the load line 9. The load line 9 is formed by using, for example, a metal material such as copper. The load line 9 is formed, for example, in a plate shape. The load line 9 is also called a bus bar. The semiconductor module 10 has, as the coupling member 13, a coupling member 13a to which the load line 9 is connected and a coupling member 13b to which the load line 9 is not connected.

The load line 9 may be provided integrally with the coupling member 13a or connected to the coupling member 13a. The load line 9 is connected to a predetermined position in the coupling member 13a. In FIGS. 16 and 17, for convenience, the cooler 14 is not illustrated.

By connecting the load line 9 to the coupling member 13a only, the structure of connection to the motor generator 3 can be simplified. The connection between the collector terminal C1 and the emitter terminal E2 and the smoothing capacitor Cs can be also simplified.

The basic configuration of the semiconductor devices 11 and 12 is the same as that of the foregoing embodiment. The semiconductor device 11 has one collector terminal C1 and two emitter terminals E1. The semiconductor device 12 has two collector terminals C2 and one emitter terminal E2. The emitter terminals E1 and E2 of the semiconductor devices 11 and 12 are soldered to the heat sinks 51 and 52, respectively.

Hereinafter, one of the emitter terminals E1 will be also denoted as an emitter terminal E11 and another emitter terminal E1 will be also denoted as an emitter terminal E12. One of the collector terminals C2 will be also denoted as a collector terminal C21 and another collector terminal C2 will be also denoted as a collector terminal C22. In the X direction, the emitter terminal E11 is disposed on the side of the semiconductor element 31a, and the emitter terminal E12 is disposed on the side of the semiconductor element 31b. The collector terminal C21 is disposed on the side of the semiconductor element 32a, and the collector terminal C22 is disposed on the side of the semiconductor element 32b.

Hereinafter, the position the load line 9 is connected will be described.

Figure 18:
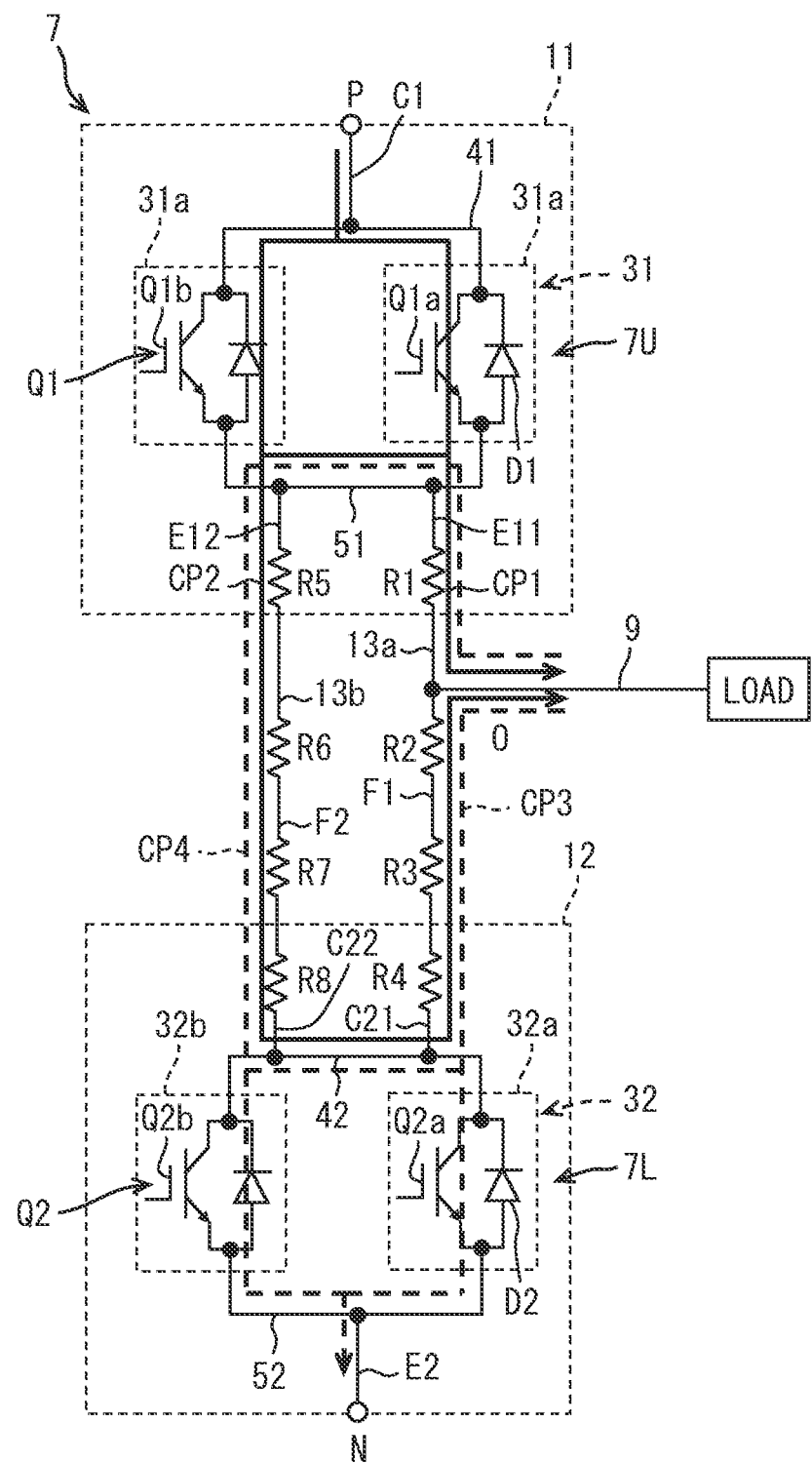
FIG. 18 illustrates a model of upper and lower arms used for verification of the position of a load line.

FIG. 18 is a circuit model of the upper/lower arm 7 in which interconnection resistance is considered to verify the position the load line 9 is connected. A load illustrated in FIG. 18 corresponds to a stator winding of the motor generator 3. The load is an inductive load (L load). Hereinafter, it may be also indicated that the collector terminal C1 as a P terminal simply as P, the emitter terminal E2 as an N terminal simply as N, and the load line 9 as an output line simply as O.

As illustrated in FIG. 18, the upper/lower arm 7 has, as paths connecting the upper arm 7U and the lower arm 7L, a first path F1 and a second path F2. In the following, they will be also simply called paths F1 and F2. The first path F1 has the coupling member 13a, the emitter terminal E11, and the collector terminal C21. The coupling member 13a is welded to the emitter terminal E11 and the collector terminal C21 as output terminals. The first path F1 has, as main resistance components, a resistor R1 in the welding part between the emitter terminal E11 and the coupling member 13a, resistors R2 and R3 as wiring resistors of the coupling member 13a itself, and a resistor R4 of the welding part between the collector terminal C21 and the coupling member 13a.

The second path F2 has the coupling member 13b, the emitter terminal E12, and the collector terminal C22. The coupling member 13b is welded to the emitter terminal E12 and the collector terminal C22 as output terminals. The second path F2 has, as main resistance components, a resistor R5 in the welding part between the emitter terminal E12 and the coupling member 13b, resistors R6 and R7 as wiring resistors of the coupling member 13b itself, and a resistor R8 of the welding part between the collector terminal C22 and the coupling member 13b. In the model illustrated in FIG. 18, it is assumed that the load line 9 is connected closer to the upper arm 7U and, in the first path F1, there are the resistors R2 and R3 on the side of the lower arm 7L from the position the load line 9 is connected.

As described above, in a configuration that the load line 9 is connected to one of the coupling members 13, there are mainly two paths of direct current. The direct current is current flowing in the stationary time in which the switching elements are on, not at the time of switching. CP1 and CP2 indicated by solid-line arrows in FIG. 18 denote main current paths when switching elements Q1 (Q1a and Q1b) on the side of the upper arm 7U are driven. CP3 and CP4 indicated by broken-line arrows denote main current paths when switching elements Q2 (Q2a and Q2b) on the side of the lower arm 7L are driven. The current path CP1 is made by the collector terminal C1(P)→the heat sink 41→the switching elements Q1a and Q1b→the heat sink 51→the emitter terminal E11→the coupling member 13a→the load line 9(O). The current path CP2 is made by the collector terminal C1(P)→the heat sink 41→the switching elements Q1a and Q1b the heat sink 51→the emitter terminal E12→the coupling member 13b→the collector terminal C22→the heat sink 42→the collector terminal C21→the coupling member 13a→the load line 9(O). As described above, since the resistance component of the main circuit wiring in the current path CP1 and that in the current path CP2 are different, it is feared that unbalance of the direct current occurs.

Similarly, the current path CP3 is made by the load line 9(O)→the coupling member 13a→the collector terminal C21→the heat sink 42→the switching elements Q2a and Q2b→the heat sink 52→the emitter terminal E2(N). The current path CP4 is made by the load line 9(O)→the coupling member 13a→the emitter terminal E11→the heat sink 51→the emitter terminal E12→the coupling member 13b→the collector terminal C22→the heat sink 42→the switching elements Q2a and Q2b→the heat sink 52→the emitter terminal E2(N). As described above, since the resistance component of the main circuit wiring in the current path CP3 and that in the current path CP4 are different, it is feared that unbalance of the direct current occurs.

Figure 19A:
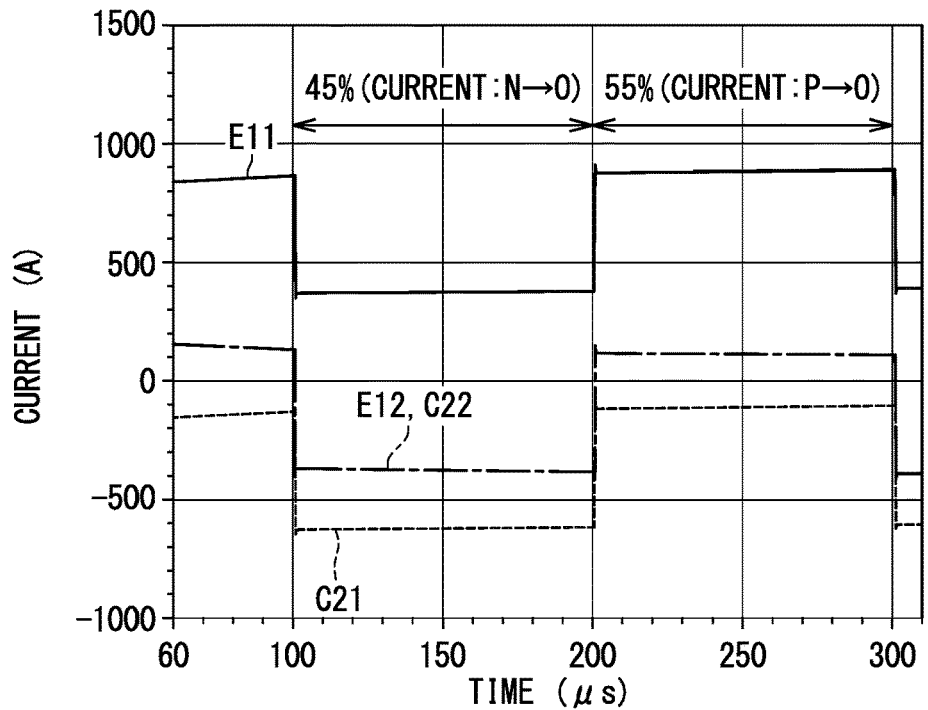
FIG. 19A is a diagram illustrating currents flowing in output terminals at the time of driving an upper arm.
Figure 19B:
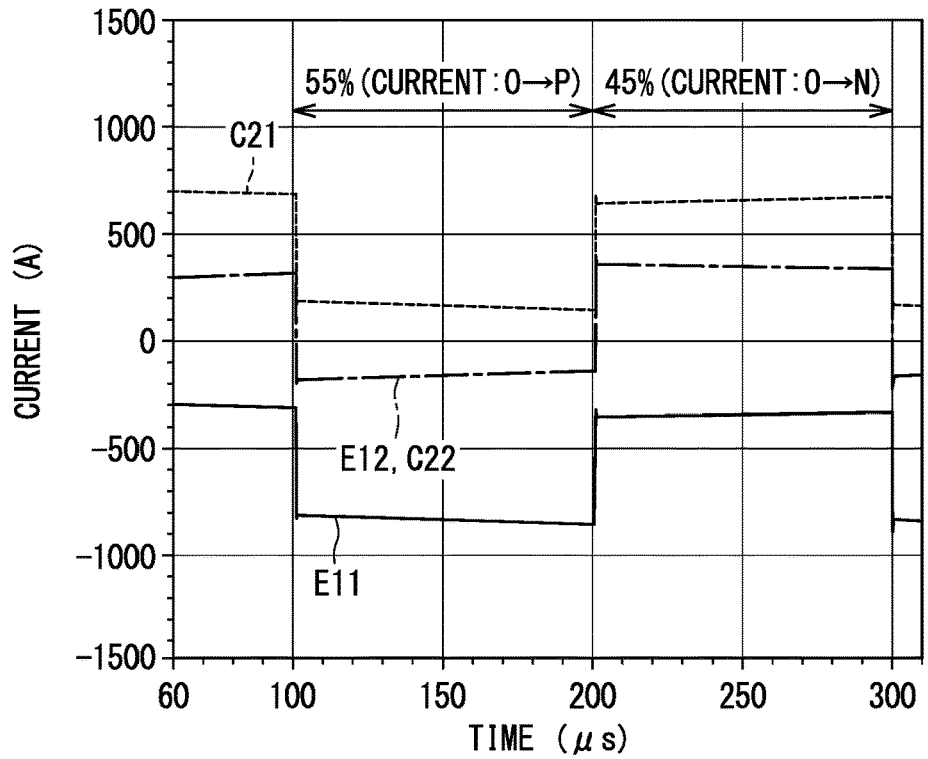
FIG. 19B is a diagram illustrating currents flowing in output terminals at the time of driving a lower arm.

FIG. 19A and FIG. 19B illustrate simulation results of current flowing to the output terminal when a motor lock occurs in the model illustrated in FIG. 18. FIG. 19A illustrates current flowing in each output terminal when the upper arm 7U side is driven. FIG. 19B illustrates current flowing in each output terminal when the lower arm 7L side is driven. In FIGS. 19A and 19B, the current flowing in the emitter terminal E11 is indicated by the solid line, the current flowing in the collector terminal C21 is indicated by the broken line, and the current flowing in the emitter terminal E12 and the collector terminal C22 is indicated by the alternate long and short dash line.

In the simulation, the load current is set to 1000 [A] and the duty ratio of the output waveform of the upper/lower arm 7 is set to 55%. The values of the resistors R1 to R8 are set to "r" as values which are equal to one another. To the total resistance value 8r of the paths F1 and F2, the resistance value of the current path CP1 is r, the resistance value of the current path CP2 is 7r, the resistance value of the current path CP3 is 3r, and the resistance value of the current path CP4 is 5r.

Therefore, the current flows in the current path CP1 more than in the current path CP2. When the switching element Q1 is driven, the larger current flows in the emitter terminal E11 more than in the emitter terminal E12. The current flows in the current path CP3 more than in the current path CP4. When the switching element Q2 is driven, the larger current flows in the collector terminal C21 more than in the collector terminal C22. As described above, the current is concentrated in the output terminal as a component of the path F1, concretely, on the side of the emitter terminal E11 and the collector terminal C21.

When the switching element Q1 is driven, current flows from the upper/lower arm 7 to the load. As illustrated in FIG. 19A, in the on period of a PWM cycle, current flows from the collector terminal C1(P) to the load line 9(O) via the switching element Q1. To the emitter terminal E11, current of 1000×7/8=875 [A] flows. In the off period, current flows from the emitter terminal E2(N) to the load line 9(O) via the diode D2. At this time, current of 1000×3/8=375 [A] flows to the emitter terminal E11. The current flowing in the emitter terminal E11 has rectangular waves of 875 [A] (duty ratio 55%) and 375 [A] (duty ratio 45%). To the emitter terminal E11, the current of 696 [A] by effective value conversion flows.

When the switching element Q2 is driven, current flows from the load to the upper/lower arm 7. In the on period of the PWM cycle, current flows from the load line 9(O) to the emitter terminal E2(N) via the switching element Q2. To the collector terminal C21, as illustrated in FIG. 19B, current of 1000×5/8=625 [A] flows. In the off period, current flows from the load line 9(O) to the collector terminal C1(P) via the diode D1. At this time, current of 1000×1/8=125 [A] flows to the collector terminal C21. The current flowing in the collector terminal C21 has rectangular waves of 625 [A] (duty ratio 45%) and 125 [A] (duty ratio 55%). To the collector terminal C21, the current of 429 [A] by effective value conversion flows.

As described above, in the model illustrated in FIG. 18, the balance of direct current in the upper arm 7U is worse than that in the lower arm 7L. Therefore, in the emitter terminal E11 and the collector terminal C21 in which current is concentrated due to unbalance of the direct current, particularly, to the emitter terminal E11, large current flows. Energization stress is larger in the emitter terminal E11.

The semiconductor module 10 of the present embodiment has, in a manner similar to the foregoing embodiment, the solder joint parts 121 and 122 as joint parts between the heat sinks 51 and 52 and the main terminals 71 and 72. The solder joint part 121 is formed between the heat sink 51 and each of the emitter terminals E11 and E12. The solder joint part 122 is formed between the heat sink 52 and the emitter terminal E2. In the emitter terminal E11 and the collector terminal C21 in which the current is concentrated, the solder joint part 121 is formed in the emitter terminal E11, and no solder joint part is formed in the collector terminal C21. The collector terminal C21 is provided continuously with the heat sink 42 as one member. For example, the electromigration effect increases as the flowing current becomes larger. The resistance to energization stress of the emitter terminal E11 is higher than that of the collector terminal C21.

In the present embodiment, in the path F1, the base position is set so that the value of the wiring resistance from the position the load line 9 is connected (hereinafter, called base position) to the heat sink 51 via the emitter terminal E11 becomes larger than that of the wiring resistance from the base position to the heat sink 42 via the collector terminal C21. As illustrated in FIGS. 16 and 17, in the semiconductor module 10 according to the present embodiment, the load line 9 is connected to the welded part with the collector terminal C21 in the coupling member 13a having an almost U-letter shape. The base position is also called an output branch point.

Figure 20:
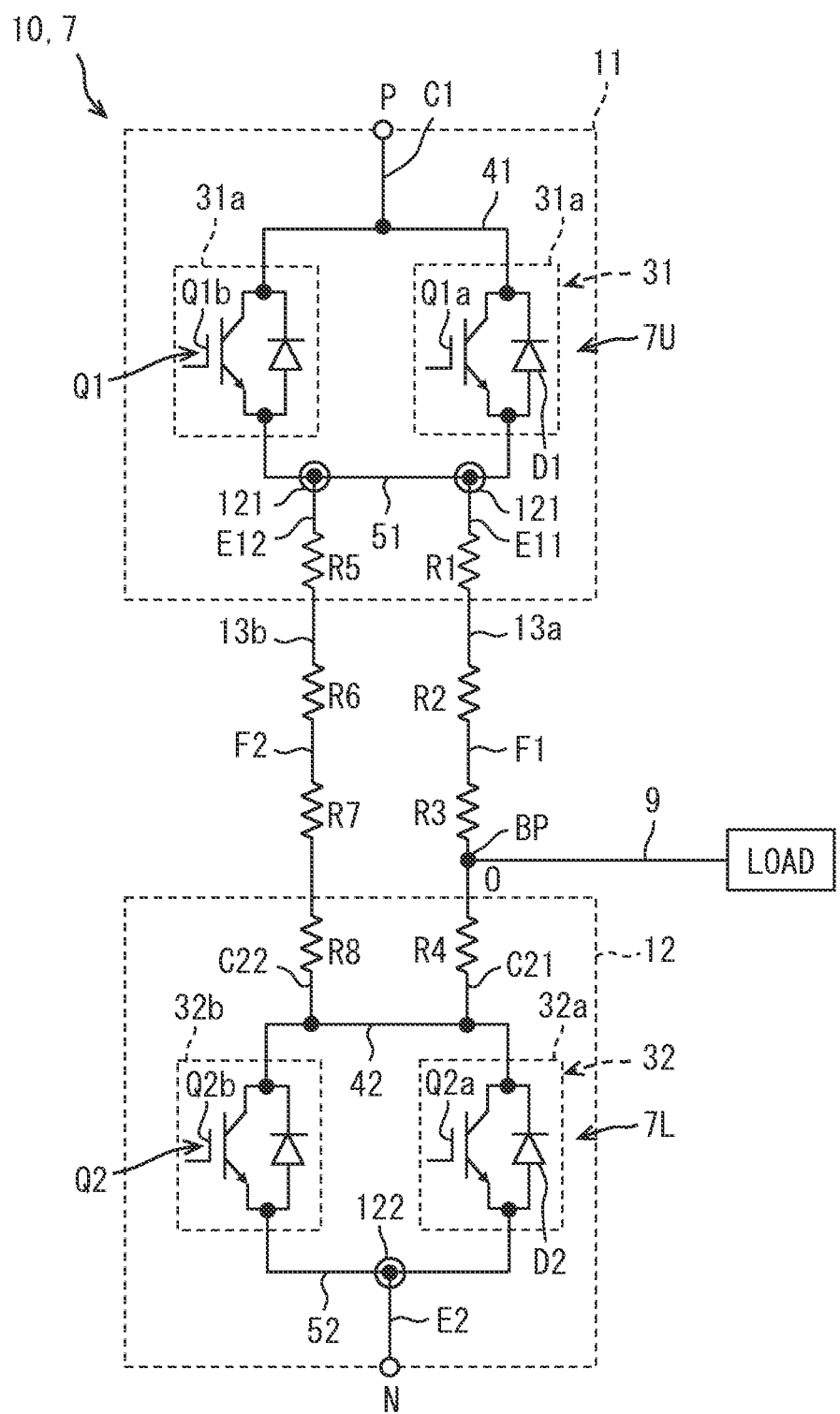
FIG. 20 is an equivalent circuit diagram of the semiconductor module in which wiring resistance is considered.

FIG. 20 is an equivalent circuit diagram of the semiconductor module 10 illustrated in FIGS. 16 and 17. In the coupling member 13a, the base position BP to which the load line 9 is connected is provided nearer to the lower arm 7L. In FIG. 20, for convenience, the wiring resistance between the base position BP and the resistor R4 in the part welded to the collector terminal C21 is set to zero, and the base position BP is provided between the wiring resistors R2 and R3 and the resistor R4 of the coupling member 13a.

In the path F1, the resistance value (first resistance value) of the wiring part from the base position BP to the heat sink 51 via the emitter terminal E11 and the solder joint part 121 is a total value of the resistors R1, R2, and R3. The resistance value (second resistance value) of the wiring part from the base position BP to the heat sink 42 via the collector terminal C21 is the value of the resistor R4. For example, when the value of each of the resistors R1 to R8 is r, the first resistance value is 3r, and the second resistance value is r.

By the above, in the semiconductor device 11 on the side of the emitter terminal E11 having low tolerance to the energization stress, unbalance of the direct current in the emitter terminals E11 and E12 can be suppressed. The degree of unbalance of the direct current in the emitter terminals E11 and E12 can be made lower. Consequently, current concentration on the solder joint part 121 formed in the emitter terminal E11 can be suppressed. By suppression of the unbalance of the direct current, the current flowing in the solder joint part 121 can be decreased. Therefore, in the semiconductor module 10 having the two kinds (two part numbers) of the semiconductor devices 11 and 12, reliability can be improved.

By the above-described disposition of the load line 9, the degree of unbalance of the direct current becomes higher on the side of the collector terminal C2, and the current flowing in the collector terminal C21 increases. However, the tolerance to energization stress of the collector terminal C21 is higher than that of the emitter terminal E11. Therefore, the reliability can be improved in the semiconductor module 10 as a whole.

Although the example that the tolerance to energization stress of the emitter terminal E11 is lower than that of the collector terminal C21 depending on the presence/absence of solder joint has been described, the present disclosure is not limited to the example. For instance, the collector terminal C21 may be soldered to the heat sink 42 and the area of the solder joint part in the collector terminal C21 may be larger than that of the solder joint part 121 in the emitter terminal E11. Depending on the presence/absence of solder joint, the area of the solder joint part, and the like, the degree of tolerance to energization stress is determined.

A configuration opposite to that of the present embodiment, that is, a configuration that the tolerance to energization stress of the collector terminal C21 on the side of the lower arm 7L is lower than that of the emitter terminal E11 on the side of the upper arm 7U may be employed. In this case, it is sufficient to provide the load line 9 so that, in the path F1, the wiring resistance value from the base position BP to the heat sink 42 is larger than that from the base position BP to the heat sink 51. For example, it is sufficient to provide the base position BP closer to the upper arm 7U in the coupling member 13a.

In the present embodiment, the coupling members 13a and 13b have the same structure. Consequently, unbalance of the direct current can be easily adjusted by the base position BP of the load line 9. By using the coupling members 13a and 13b having the same structure and performing welding in a similar manner, the resistance value of the path F1 as a whole and that of the path F2 as a whole can be made almost equal to each other.

Figure 21A:
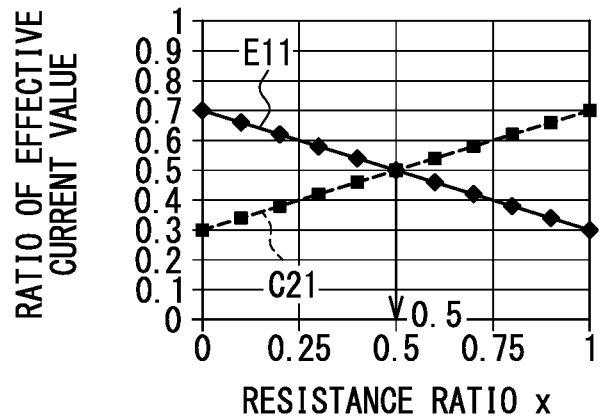
FIG. 21A is a diagram illustrating the relations between resistance ratio and ratio of effective current value when a duty ratio is 50%.
Figure 21B:
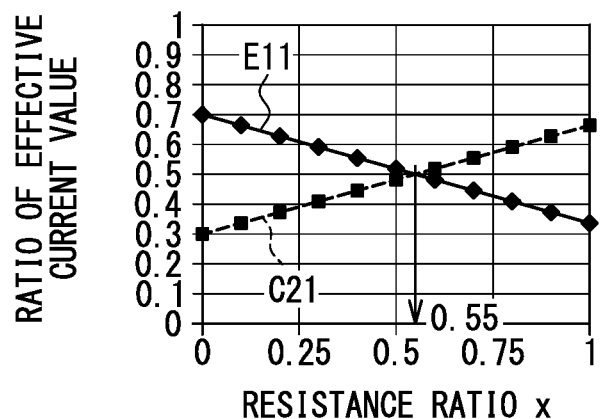
FIG. 21B is a diagram illustrating the relations between resistance ratio and ratio of effective current value when a duty ratio is 55%.
Figure 21C:
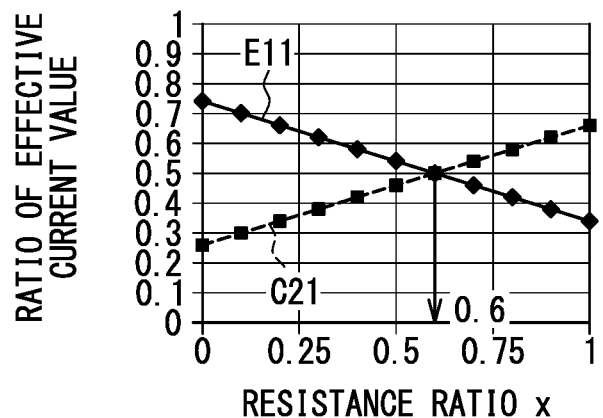
FIG. 21C is a diagram illustrating the relations between resistance ratio and ratio of effective current value when a duty ratio is 60%.

It became obvious that, when the resistance values of the paths F1 and F2 are equal, the resistance ratio x at the cross point between the current flowing in the emitter terminal E11 and the current flowing in the collector terminal C21 almost matches the duty ratio of the output waveform which is set at the time of a motor lock. FIG. 21A to FIG. 21C illustrate the relations between the resistance ratio x and the ratio of the effective current value of the emitter terminal E11 and the collector terminal C21 at various duty ratios set at the time of a motor lock. In the following, for distinction, the resistance ratio of the cross point will be expressed as x0.

The resistance ratio x is the ratio of a first resistance value to the resistance value of the entire path F1. In FIG. 20, when the total value of the resistors R1 to R4 is set to 1, the total value of the resistors R1, R2, and R3 is x and the resistor R4 is (1−x). The duty ratio at the time of a motor lock is generally set to about 50% (for example, in the range of 40% to 60%). The duty ratio is 50% in FIG. 21A, 55% in FIG. 21B, and 60% in FIG. 21C. The above-described simulation result is a result in the case where the resistance ratio x is 0.25 in FIG. 21B. When the resistance ratio x=0.25, the ratio between the effective current value of the emitter terminal E11 and that of the collector terminal C21 is 0.62:0.38.

As illustrated in FIG. 21A to FIG. 21C, at any of the duty ratios, the resistance ratio x0 at the cross point and the duty ratio Rd match. In FIG. 21A, the resistance ratio x0 is 0.5. In FIG. 21B, the resistance ratio x0 is 0.55. In FIG. 21C, the resistance ratio x0 is 0.6.

Therefore, when the duty ratio which is set at the time of a motor lock is set as Rd, in the case where the tolerance to energization stress of the emitter terminal E11 is lower, it is preferable to set the resistance ratio x, that is, the base position BP so as to satisfy x≥Rd. By satisfying the relation, the effective current value of the emitter terminal E11 can be set to the effective current value of the collector terminal C21 or less. Consequently, the reliability of the semiconductor module 10 can be improved. When x>Rd is satisfied, the effective current value of the emitter terminal E11 can be set less than the effective current value of the collector terminal C21. Consequently, the reliability of the semiconductor module 10 can be further improved.

In the case where the tolerance to energization stress of the collector terminal C21 is lower, it is preferable to set the resistance ratio x, that is, the base position BP so as to satisfy x≤Rd. By satisfying the relation, the effective current value of the collector terminal C21 can be set to the effective current value of the emitter terminal E11 or less. Consequently, the reliability of the semiconductor module 10 can be improved. When x<Rd is satisfied, the effective current value of the collector terminal C21 can be set less than the effective current value of the emitter terminal E11. Consequently, the reliability of the semiconductor module 10 can be further improved.

Although the example that the coupling members 13a and 13b have the same structure has been described, the present disclosure is not limited to the example. Although the example that the resistance values of the paths F1 and F2 are almost equal has been described, the present disclosure is not limited to the example. The present disclosure can be also applied to a configuration that the structures of the coupling members 13a and 13b are different from each other. The present disclosure can be also applied to a configuration that the resistance value of the path F1 and that of the path F2 are different from each other. For example, at least one of width, thickness, and length may be made different at least in a part of the coupling members 13a and 13b. For example, by making the welding resistance (the resistors R1, R4, R5, and R8) different while using the coupling members 13a and 13b of the same structure, the resistance value of the path F1 and that of the path F2 may be made different. The connection between the coupling members 13a and 13b and the output terminal is not limited to welding. Fixing means other than welding, for example, fixing, fastening, and the like by using a joint member may be also used.

Figure 22A:
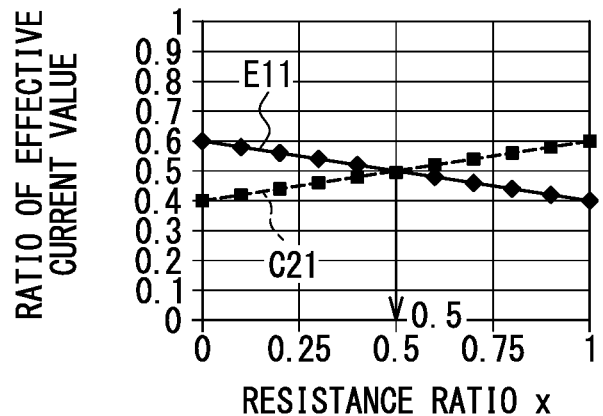
FIG. 22A is a diagram illustrating the relations between resistance ratio and ratio of effective current value when a duty ratio is 50% and k=2.
Figure 22B:
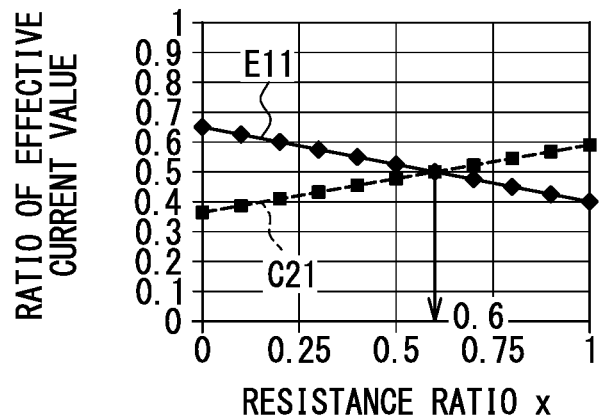
FIG. 22B is a diagram illustrating the relations between resistance ratio and ratio of effective current value when a duty ratio is 55% and k=2.
Figure 22C:
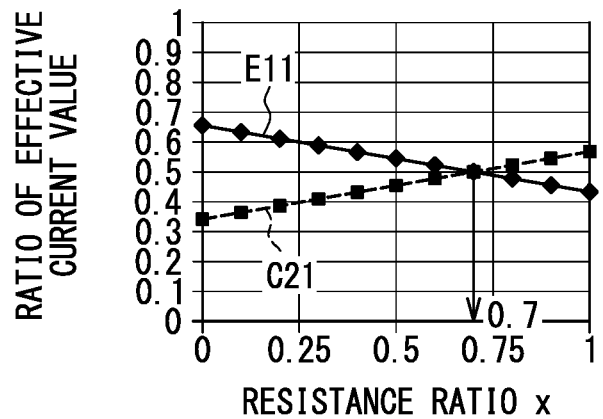
FIG. 22C is a diagram illustrating the relation between resistance ratio and ratio of effective current value when a duty ratio is 60% and k=2.

FIGS. 22A to 22C illustrate the relations between the ratio of the effective current value and the resistance ratio x when each of the values of the resistors R1 to R4 on the side of the path F1 is set to r and each of the values of the resistors R5 to R8 on the side of the path F2 is set to 2r. When the ratio of the resistance value of the entire path F2 to the resistance value of the entire path F1 is k, k=2. The duty ratio in FIG. 22A is 50%, that in FIG. 22B is 55%, and that in FIG. 22C is 60%.

As illustrated in FIG. 22A, in the case where the duty ratio is 50%, the resistance ratio x0 at the cross point matches the duty ratio Rd. As illustrated in FIG. 22B and FIG. 22C, in the case where the duty ratio is 55% and 60%, a deviation occurs between the resistance ratio x0 and the duty ratio Rd. The value of the resistance ratio x0 is larger than the duty ratio Rd. When the duty ratio is 55%, the resistance ratio x0 is 0.6. When the duty ratio is 60%, the resistance ratio x0 is 0.7.

When the resistance values of the paths F1 and F2 do not match, the resistance ratio x0 at the cross point is determined by the following formula 1.

$$x0=\{(Rd-0.5) \times k+0.5\} \qquad \text{(Formula 1)}$$

Therefore, when the tolerance to energization stress of the emitter terminal E11 is lower, it is sufficient to set the resistance ratio x, that is, the base position BP so as to satisfy the following mathematical formula 2.

$$x \geq \{(Rd-0.5) \times k+0.5\} \qquad \text{(Formula 2)}$$

By satisfying the relation, the effective current value of the emitter terminal E11 can be set to equal to or less than the effective current value of the collector terminal C21. When the following mathematical formula 3 is satisfied, the effective current value of the emitter terminal E11 can be set to be less than the effective current value of the collector terminal C21.

$$x > \{(Rd-0.5) \times k+0.5\} \qquad \text{(Formula 3)}$$

When the tolerance to energization stress of the collector terminal C21 is lower, it is sufficient to set the resistance ratio x, that is, the base position BP so as to satisfy the following formula 4.

$$x \leq \{(Rd-0.5) \times k+0.5\} \qquad \text{(Formula 4)}$$

By satisfying the relation, the effective current value of the collector terminal C21 can be set to equal to or less than the effective current value of the emitter terminal E11. When the following formula 5 is satisfied, the effective current value of the collector terminal C21 can be set to be less than the effective current value of the emitter terminal E11.

$$x < \{(Rd-0.5) \times k+0.5\} \qquad \text{(Formula 5)}$$

Figure 23A:
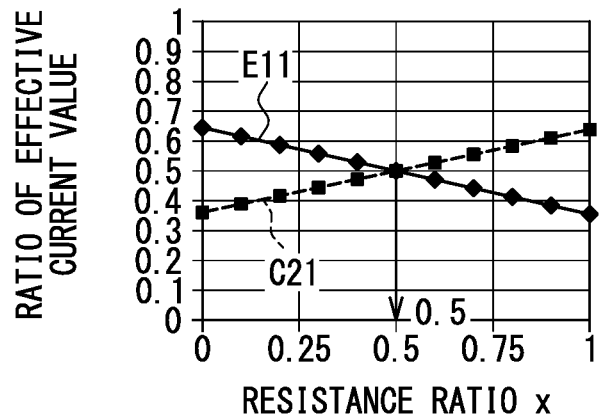
FIG. 23A is a diagram illustrating the relations between resistance ratio and ratio of effective current value when a duty ratio is 50% and k=1.5.
Figure 23B:
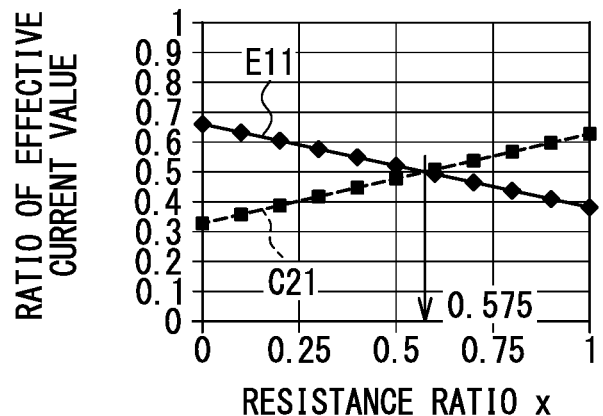
FIG. 23B is a diagram illustrating the relations between resistance ratio and ratio of effective current value when a duty ratio is 55% and k=1.5.
Figure 23C:
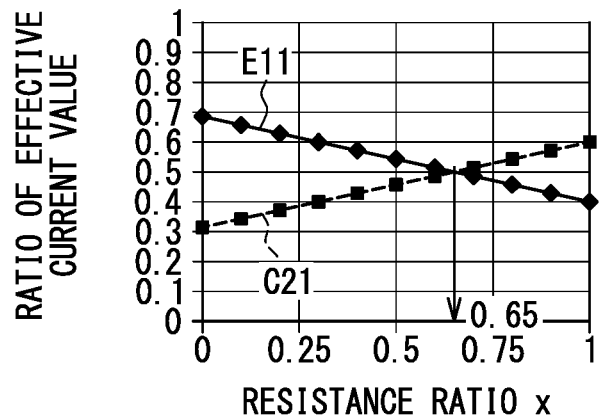
FIG. 23C is a diagram illustrating the relation between resistance ratio and ratio of effective current value when a duty ratio is 60% and k=1.5.

The relations of the above-described formulas 1 to 5 are satisfied also in the case where k is not equal to 2. For example, FIGS. 23A to 23C illustrate the case where k=1.5. The duty ratio in FIG. 23A is 50%, that in FIG. 23B is 55%, and that in FIG. 23C is 60%. In the case where the duty ratio is 50%, the resistance ratio x0 at the cross point matches the duty ratio Rd. In the case where the duty ratio is 55%, the resistance ratio x0 is 0.575. In the case where the duty ratio is 60%, the resistance ratio x0 is 0.65. At any of the duty ratios, the resistance ratio x0 at the cross point matches the value calculated by the above-described formula 1.

Figure 24A:
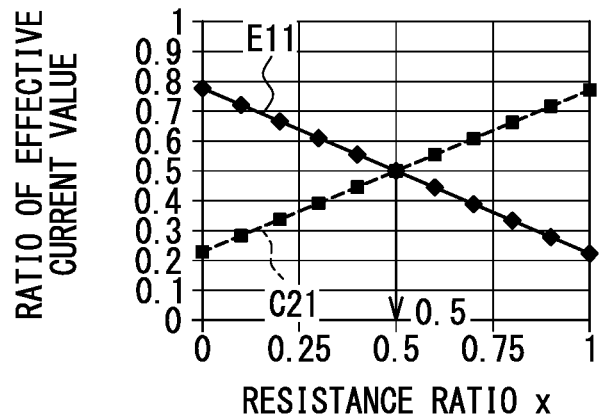
FIG. 24A is a diagram illustrating the relations between resistance ratio and ratio of effective current value when a duty ratio is 50% and k=0.5.
Figure 24B:
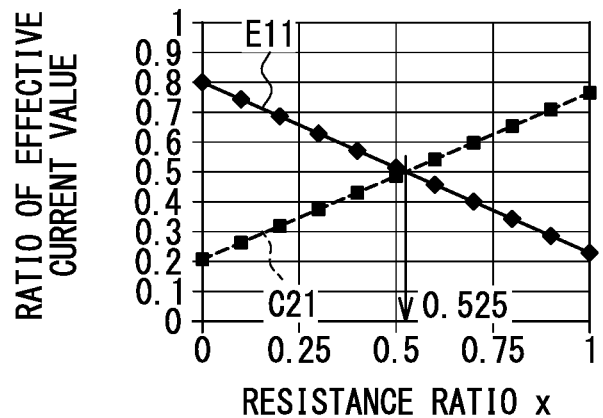
FIG. 24B is a diagram illustrating the relations between resistance ratio and ratio of effective current value when a duty ratio is 55% and k=0.5.
Figure 24C:
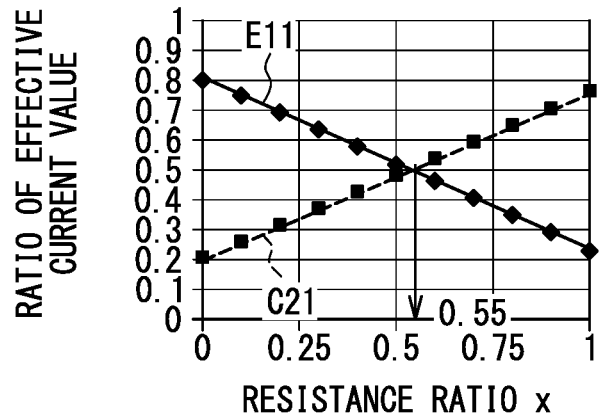
FIG. 24C is a diagram illustrating the relation between resistance ratio and ratio of effective current value when a duty ratio is 60% and k=0.5.

FIGS. 24A to 24C illustrate the case where k=0.5. The duty ratio in FIG. 24A is 50%, that in FIG. 24B is 55%, and that in FIG. 24C is 60%. In the case where the duty ratio is 50%, the resistance ratio x0 at the cross point matches the duty ratio Rd. In the case where the duty ratio is 55%, the resistance ratio x0 is 0.525. In the case where the duty ratio is 60%, the resistance ratio x0 is 0.55. At any of the duty ratios, the resistance ratio x0 at the cross point matches the value calculated by the above-described formula 1. The relations of the above-described formulas 1 to 5 are satisfied, for example, also when k=1.

Figure 25:
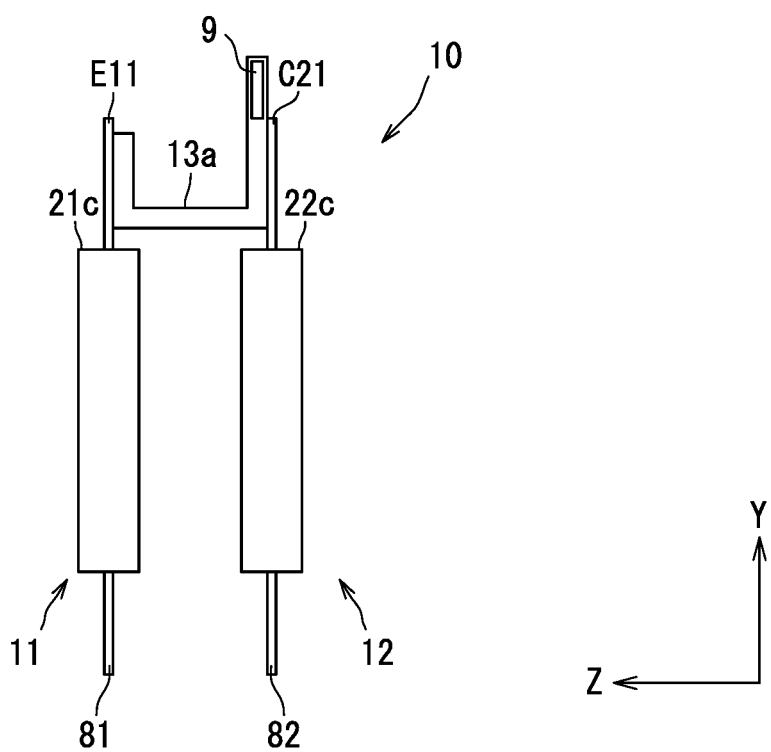
FIG. 25 is a planar view illustrating a modification.
Figure 26:
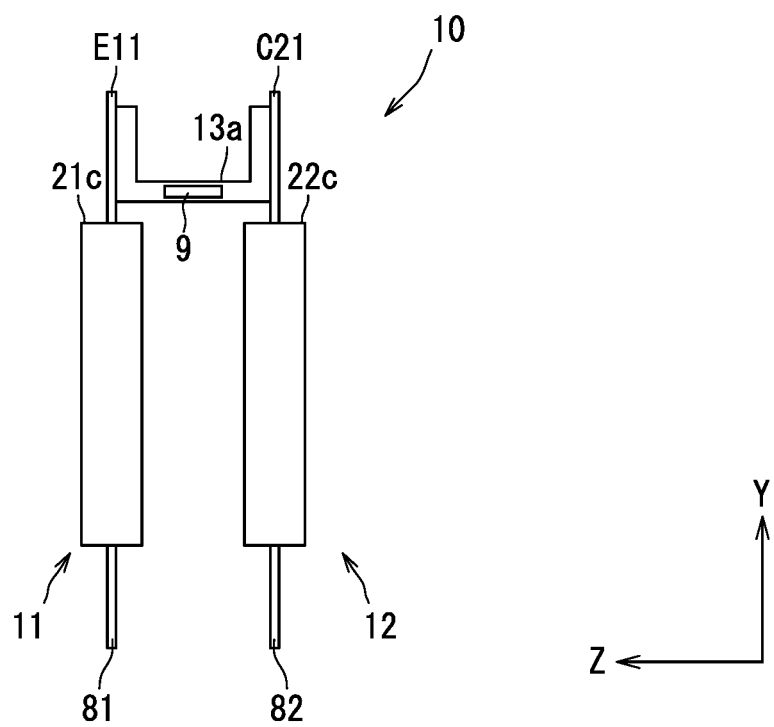
FIG. 26 is a planar view illustrating another example.
Figure 27:
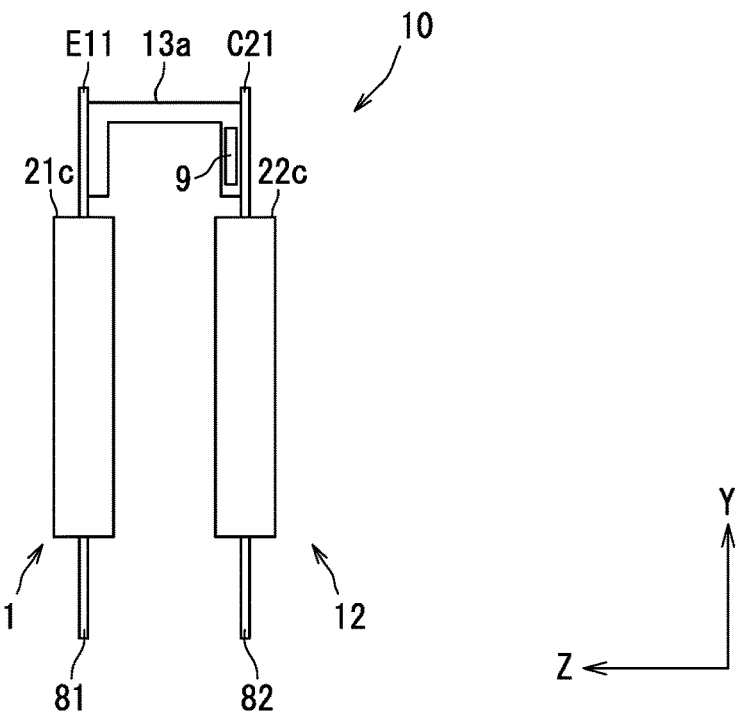
FIG. 27 is a planar view illustrating a modification.

The position of the load line 9 is not limited to that in the above-described example. For example, when the tolerance to energization stress of the emitter terminal E11 is low, like a modification illustrated in FIG. 25, a configuration that the coupling member 13a is extended from the part of connection to the collector terminal C21 and the load line 9 is connected to the extended part may be also employed. Like a modification illustrated in FIG. 26, a configuration that the load line 9 is connected to a binding part which binds the connection part between the emitter terminal E11 and the collector terminal C21 in the coupling member 13a having an almost U-letter shape may be also employed. In this case, it is sufficient to make a difference in the welding resistance and/or to vary the width of the connection part in the coupling member 13a. Like a modification illustrated in FIG. 27, the coupling member 13a may be inverted in the Y direction.

Figure 28:
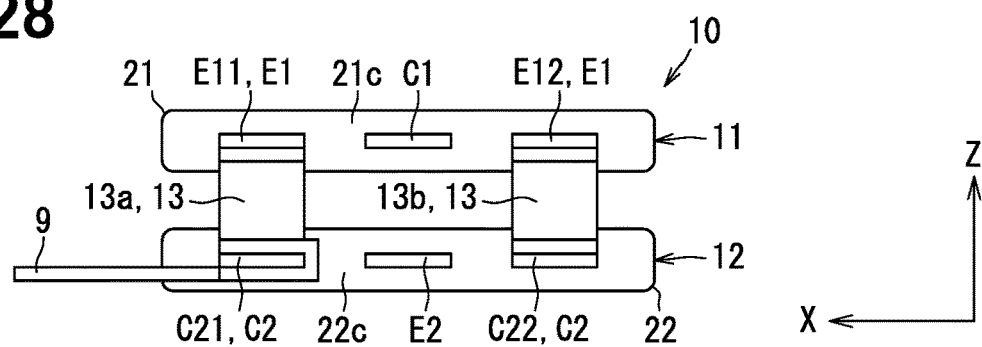
FIG. 28 is a planar view illustrating a modification.

Although the example that the numbers of connections between the emitter terminal E11 and the collector terminal C21 and the coupling member 13a in the path F1 are the same has been described, the present disclosure is not limited to the example. By making the number of connections of the emitter terminal E11 and that of the collector terminals C21 different, the wiring resistance from the base position BP can be also adjusted. For example, in a modification illustrated in FIG. 28, the coupling member 13a is connected to the collector terminal C21 on the surface and the rear face in the plate thickness direction. The structure of the coupling member 13a and that of the coupling member 13b are different from each other. The collector terminal C21 has two connecting parts, and the emitter terminal E11 has one connecting part. Due to the two connecting parts, the connection area of the collector terminal C21 is larger. Consequently, the value of the resistor R4 is smaller than that of the resistor R1.

Figure 29:
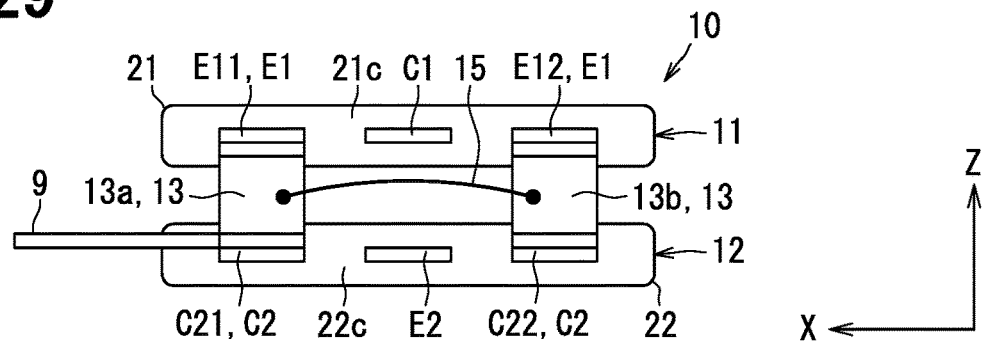
FIG. 29 is a planar view illustrating a modification.

Like a modification illustrated in FIG. 29, a configuration that the coupling members 13a and 13b are electrically connected by a thin line 15 such as a wire may be also employed. The resistance value of the thin line 15 is sufficiently larger as compared with the resistance values of other elements constructing the current paths CP1, CP2, CP3, and CP4. The thin line 15 does not exert a large influence on the balance of the direct current.

Figure 30:
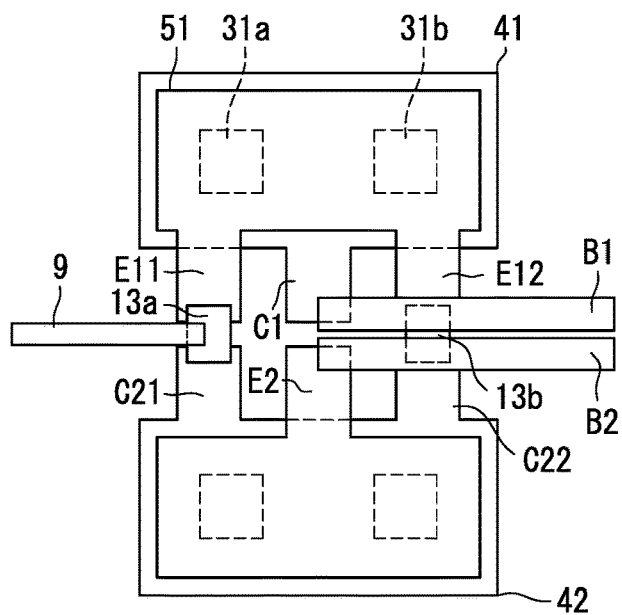
FIG. 30 is a planar view illustrating a modification.

Although the example that the semiconductor devices 11 and 12 are stacked in the Z direction has been described, the present disclosure is not limited to the example. For example, like a modification illustrated in FIG. 30, they can be also connected in a state of flat arrangement. Reference numeral B1 in FIG. 30 denotes a bus bar on the positive electrode side, and reference numeral B2 denotes a bus bar on the negative electrode side. The collector terminal C1 is connected to the terminal on the positive electrode side of the smoothing capacitor Cs via the bus bar B1. The emitter terminal E2 is connected to the terminal on the negative electrode side of the smoothing capacitor Cs via the bus bar B2. In FIG. 30, a part of the elements of the semiconductor devices 11 and 12, such as the sealing resin members 21 and 22 is omitted.

The structures of the semiconductor devices 11 and 12 are not limited to the both-side heat-dissipation structure. The present disclosure can be also applied to a one-side heat-dissipation structure. The present disclosure is not limited to a switching element of a vertical structure but can be also applied to a switching element of a lateral structure (for example, LDMOS). In the case of the one-side heat-dissipation structure, for example, a connection structure in a flat arrangement state can be employed.

Although the example that the semiconductor devices 11 and 12 have the plurality of semiconductor elements 31 and 23 has been described, the present disclosure is not limited to the example. When a plurality of paths, for example, two paths F1 and F2 are provided in the configuration that one semiconductor element 31 and one semiconductor element 32 are provided, unbalance in the direct current may occur. Therefore, the present disclosure can be also applied to a configuration that the semiconductor device 11 has only one semiconductor element 31 and the semiconductor device 12 has only one semiconductor element 32.

Although the example that the semiconductor devices 11 and 12 have the sealing resin members 21 and 22, respectively has been described, the present disclosure is not limited to the example. A configuration that the sealing resin members 21 and 22 are not provided may be also employed.

Third Embodiment

In a third embodiment, the same reference numerals are designated to parts corresponding to the parts in the foregoing embodiments in view of function and/or structure and/or relates parts. With respect to the corresponding part and/or the related part, the description of the forgoing embodiments can be referred to.

Figure 31:
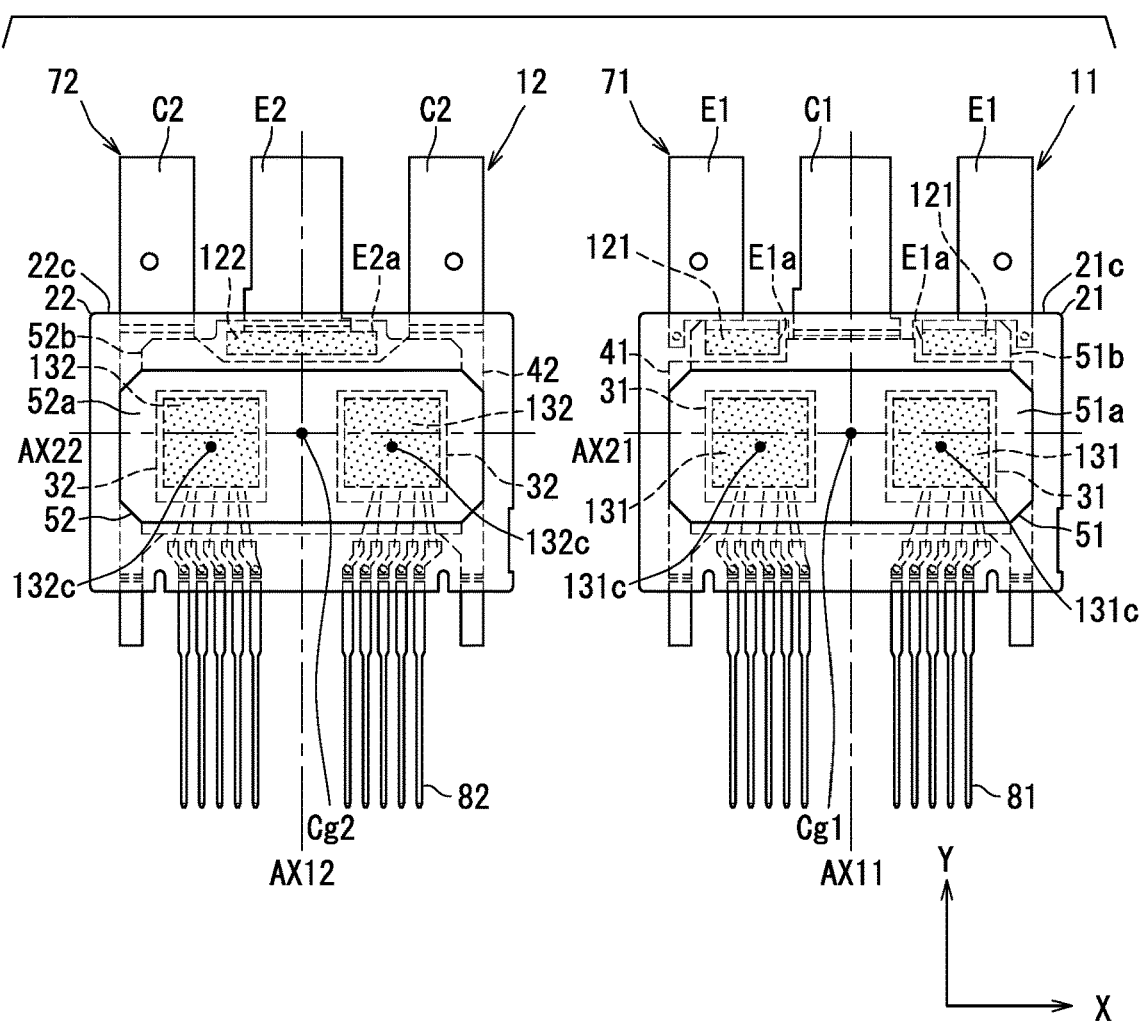
FIG. 31 is a planar view illustrating a semiconductor device according to a third embodiment.

FIG. 31 illustrates the semiconductor devices 11 and 12 according to the third embodiment. In FIG. 31, for convenience, the two semiconductor devices 11 and 12 are illustrated side by side. In FIG. 31, like in FIG. 12, the elements in the sealing resin members 21 and 22 are illustrated by broken lines.

The basic configurations of the semiconductor devices 11 and 12 are similar to those of the foregoing embodiments. The semiconductor devices 11 and 12 have a both-side heat-dissipation structure. In planar view from the Z direction, the area of the heat sinks 51 and 52 is smaller than that of the corresponding heat sinks 41 and 42. In the longer-side direction of the heat sink 51 (body part 51a), two semiconductor elements 31 are disposed side by side. Similarly, in the longer-side direction of the heat sink 52 (body part 52a), two semiconductor elements 32 are disposed side by side.

The semiconductor device 11 has the solder joint part 121. The solder joint part 121 is formed between each of the emitter terminals E1 and the heat sink 51. The semiconductor device 12 has the solder joint part 122. The solder joint part 122 is formed between the emitter terminal E2 and the heat sink 52.

The semiconductor devices 11 and 12 further have solder joint parts 131 and 132, respectively. The solder joint part 131 is formed between each of the terminals 61 and the heat sink 51. The solder joint part 132 is formed between each of the terminals 62 and the heat sink 52. In FIG. 31, to discriminate from the others, the solder joint parts 121, 122, 131, and 131 are hatched.

Figure 32:
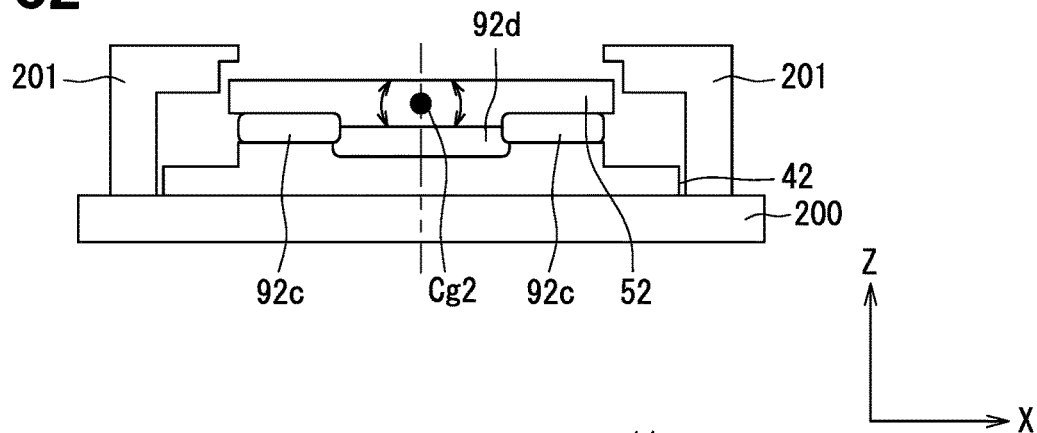
FIG. 32 is a schematic diagram illustrating a solder reflow process.

In the case where the area of the heat sinks 51 and 52 is smaller than that of the heat sinks 41 and 42, as described above, the solder joint part on the side of the heat sinks 51 and 52 is formed by the second reflow. For example, in the case of forming the semiconductor device 12, as illustrated in FIG. 32, the connection body including the heat sink 42 is disposed on a base 200 so that the solder 92c and 92d are in upper positions. Subsequently, the heat sink 52 is disposed. In this disposition state, the second reflow is performed. At this time, depending on the weight of the members, a jig, and the like, the position of the heat sink 42 is determined using the base 200 as the position reference in the Z direction.

Although the heat sink 52 is positioned and disposed on the base 200 by jigs 201, in the Z direction, it is free at the time of solder welding. There is the possibility that an inclination occurs in the heat sink 52 due to the relation between gravity center Cg2 of the heat sink 52 and the surface tension of the solder connected to the heat sink 52. For example, it can be considered that the solder 92c and 92d is not solidified at the same timing. A change in volume from the liquid phase to the solid phase of the solder may exert an influence on inclination. The semiconductor device 11 (heat sink 51) is similar. In FIG. 32, paying attention to the heat sinks 42 and 52 and the solder 92c and 92, for convenience, the other elements are illustrated integrally with the heat sink 42.

In the semiconductor device 11 according to the present embodiment, main solder joint parts of the heat sink 51 are disposed line-symmetrically with respect to the axis AX11 passing gravity center Cg1 of the heat sink 51 as the axis of symmetry. The axis AX11 is orthogonal to the longer side direction of the heat sink 51, that is, the X direction and the Z direction as the plate thickness direction of the semiconductor element 31. Similarly, in the semiconductor device 12, main solder joint parts are disposed line-symmetrically with respect to the axis AX12 passing the gravity center Cg2 of the heat sink 52 as the axis of symmetry. The axis AX12 is orthogonal to the longer side direction of the heat sink 52, that is, the X direction and the Z direction as the plate thickness direction of the semiconductor element 32.

By the disposition, almost the same surface tension acts at almost the same distance with respect to the gravity centers Cg1 and Cg2 in the longer side direction of the heat sinks 51 and 52. Consequently, the torque on one side in the longer side direction and that on the other side almost balance each other as illustrated in FIG. 32. Therefore, at the time of positioning the heat sinks 41 and 42 having large areas in the Z direction and, in this state, forming the solder joint parts of the heat sinks 51 and 52, relative inclination in the heat sinks 41 and 42 and the heat sinks 51 and 52 can be suppressed.

Particularly, inclination in the longer side direction can be suppressed. A displacement amount of inclination in the longer-side direction is larger than that of the same inclination in the shorter-side direction. According to the present embodiment, the displacement amount can be suppressed. By suppressing the inclination, for example, heat dissipation performance can be assured. In the semiconductor elements 31 and 32 connected in parallel, a deviation in the wiring inductance can be suppressed.

In the present embodiment, as solder joint parts formed in the heat sink 51, the semiconductor device 11 has the solder joint part 131 electrically connecting the heat sink 51 and the semiconductor element 31 and the solder joint part 121 electrically connecting the heat sink 51 and the emitter terminal E1. The solder joint part 131 is formed while including the solder 91c, and the solder joint part 121 is formed while including the solder 91d. The semiconductor device 11 has two solder joint parts 131 and two solder joint parts 121.

The two solder joint parts 131 are disposed line-symmetrically with respect to the axis AX11 as the axis of symmetry. By the disposition, the surface tension of the solder 91c is balanced in the longer-side direction of the heat sink 51. The two solder joint parts 121 are disposed line-symmetrically with respect to the axis AX11 as the axis of symmetry. By the disposition, the surface tension of the solder 91d is balanced in the longer-side direction of the heat sink 51. Consequently, occurrence of inclination in the longer-side direction in the heat sink 51 can be suppressed.

Similarly, the semiconductor device 12 has, as solder joint parts formed in the heat sink 52, the solder joint part 132 electrically connecting the heat sink 52 and the semiconductor device 32 and the solder joint part 122 electrically connecting the heat sink 52 and the emitter terminal E2. The solder joint part 132 is formed while including the solder 92c, and the solder joint part 122 is formed while including the solder 92d. The semiconductor device 12 has two solder joint parts 132 and one solder joint part 122.

The two solder joint parts 132 are disposed line-symmetrically with respect to the axis AX12 as the axis of symmetry. By the disposition, the surface tension of the solder 92c is balanced in the longer-side direction of the heat sink 52. The solder joint parts 122 are disposed line-symmetrically with respect to the axis AX12 as the axis of symmetry. By the disposition, the surface tension of the solder 92d is balanced in the longer-side direction of the heat sink 52. Consequently, occurrence of inclination in the longer-side direction in the heat sink 52 can be suppressed.

In the present embodiment, at least two solder joint parts which are highest in descending order of the large area of connection to the heat sink 51 are provided so as to overlap the axis AX21 in the shorter-side direction of the heat sink 51. The axis AX21 is orthogonal to the shorter-side direction of the heat sink 51, that is, the Y direction and the Z direction and passes the gravity center Cg1. Since the surface tension acts in a position close to the axis AX21, the torque causing inclination can be decreased in the shorter-side direction. Consequently, occurrence of inclination in the shorter-side direction of the heat sink 51 can be suppressed. In the present embodiment, all of the solder joint parts 131 are provided on the axis X21.

Similarly, at least two solder joint parts which are highest in descending order of the large area of connection to the heat sink 52 are provided so as to overlap the axis AX22 in the shorter-side direction of the heat sink 52. The axis AX22 is orthogonal to the shorter-side direction of the heat sink 52, that is, the Y direction and the Z direction and passes the gravity center Cg2. Since the surface tension acts in a position close to the axis AX22, the torque causing inclination can be decreased in the shorter-side direction. Consequently, occurrence of inclination in the shorter-side direction of the heat sink 52 can be suppressed. In the present embodiment, all of the solder joint parts 132 are provided on the axis X22.

In the present embodiment, the solder joint parts 121 and 122 are provided in positions apart from the axes AX21 and AX22 in the shorter-side direction so as not to overlap the axes AX21 and AX22. Consequently, the structure of connection between the heat sinks 51 and 52 and the semiconductor elements 31 and 32 and the emitter terminals E1 and E2 can be simplified. Particularly, in the semiconductor device 11, the two solder joint parts 121 are disposed on the same side with respect to the axis AX21, so that the structure can be simplified.

Also in the present embodiment, as illustrated in FIG. 31, all of the main terminals 71 project from the side face 21c of the sealing resin member 21. In planar view from the Z direction, a center 131c of the solder joint part 131 is provided in a position apart from the solder joint part 121 more than the axis AX21 in the shorter-side direction. By the disposition, the surface tension of the solder 91c can be made act on the side of cancelling out the torque by the surface tension of the solder 91d. Therefore, the inclination in the shorter-side direction of the heat sink 51 can be effectively suppressed. The center 131c almost coincides with the center of the emitter electrode 31e.

Similarly, all of the main terminals 72 project from the side face 22c of the sealing resin member 22. In planar view from the Z direction, a center 132c of the solder joint part 132 is provided in a position apart from the solder joint part 122 more than the axis AX22 in the shorter-side direction. By the disposition, the surface tension of the solder 92c can be made act on the side of cancelling out the torque by the surface tension of the solder 92d. Therefore, the inclination in the shorter-side direction of the heat sink 52 can be effectively suppressed. The center 132c almost coincides with the center of the emitter electrode 32e.

In the present embodiment, the heat sinks 41, 42, 51, and 52 correspond to heat dissipation members. The heat sinks 41 and 42 correspond to a first member, and the heat sinks 51 and 52 correspond to a second member. The solder joint parts 121, 122, 131, and 132 correspond to a plurality of solder joint parts. The solder joint parts 131 and 132 correspond to a first joint part, and the solder joint parts 121 and 122 correspond to a second joint part. The axes AX11 and AX12 correspond to an axis, a first axis. The axes AX21 and AX22 correspond to a second axis.

Although the example of the heat sinks 41, 42, 51, and 52 as heat dissipation members has been described, the present disclosure is not limited to the example. For example, as one of the heat sinks 41 and 42 and the heat sinks 51 and 52, a DBC (Direct Bonded Copper) board can be employed.

The number and disposition of the semiconductor elements 31 of the semiconductor device 11 are not limited to those in the above-described example. The number and disposition of the semiconductor elements 32 of the semiconductor device 12 are not limited to those in the above-described example. Three or more semiconductor elements 31 and 32 may be provided. By providing four semiconductor elements 31, in the modification illustrated in FIG. 33, the semiconductor device 11 has four solder joint parts 131.

Figure 33:
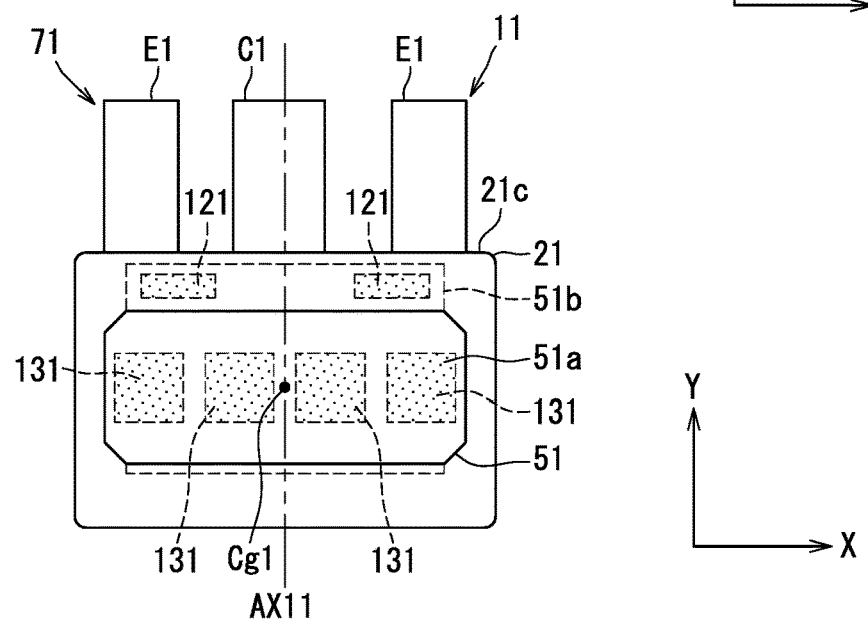
FIG. 33 is a planar view illustrating a modification.
Figure 34:
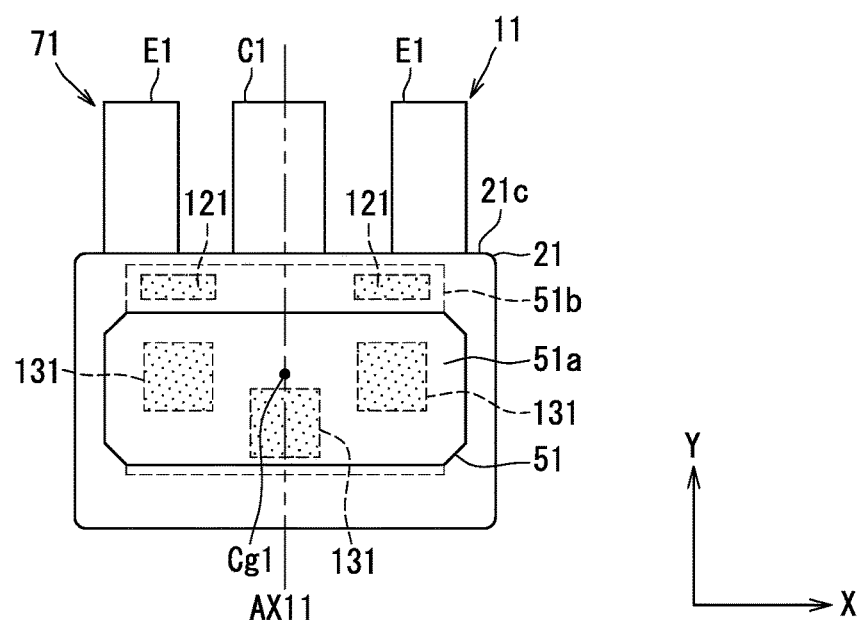
FIG. 34 is a planar view illustrating a modification.

A configuration can be employed that some of the plurality of semiconductor elements 31 and 32 are disposed side by side in the X direction and the rest of the semiconductor elements 31 and 32 are disposed so as to be deviated in the Y direction from the semiconductor elements 31 and 32 which are disposed side by side. In this case as well, it is sufficient to dispose the plurality of solder joint parts 131 and 132 line-symmetrically with respect to the axes AX11 and AX12. In the modification illustrated in FIG. 34, the semiconductor device 11 has three solder joint parts 131. The two solder joint parts 131 are disposed side by side in the X direction so as to be line-symmetrical with respect to the axis AX11. The remaining solder joint part 131 is disposed so as to be deviated from the other two solder joint parts 131 in the Y direction and disposed line-symmetrically with respect to the axis AX11. In FIGS. 33 and 34, for convenience, the signal terminals 81, the suspension lead 101b, and the like are omitted. Although FIGS. 33 and 34 illustrate the semiconductor device 11, the arrangement can be also applied to the semiconductor device 12.

Although the example that the semiconductor devices 11 and 12 have the sealing resin members 21 and 22 has been described, the present disclosure is not limited to the example. A configuration having no sealing resin members 21 and 22 may be also employed.

Fourth Embodiment

In a fourth embodiment, the same reference numerals are designated to parts corresponding to the parts in the foregoing embodiments in view of function and/or structure and/or relates parts. With respect to the corresponding part and/or the related part, the description of the forgoing embodiments can be referred to.

Figure 35:
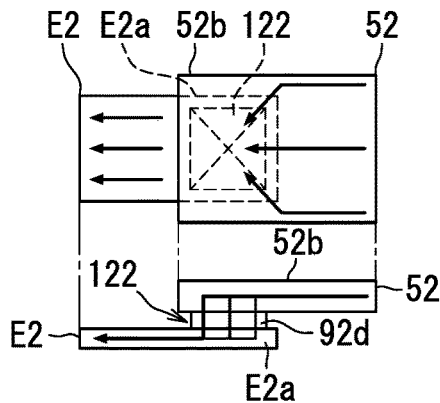
FIG. 35 is a diagram for explaining local concentration of current.

The semiconductor device 11 described in the foregoing embodiments has the solder joint part 121 between the heat sink 51 and the main terminal 71. The semiconductor device 12 has the solder joint part 122 between the heat sink 52 and the main terminal 72. FIG. 35 schematically illustrates, as an example, the solder joint part 122 of the semiconductor device 12 and its periphery. In FIG. 35, the flow of current is indicated by the solid-line arrows.

As illustrated in FIG. 35, the solder 92d is interposed between the joint part 52b of the heat sink 52 and the opposite part E2a of the emitter terminal E2, thereby forming the solder joint part 122. When current does not flow in the opposite part E2a easier as compared with that in the joint part 52b, in the solder joint part 122, the force of the flow to a further place in the joint part 52b of low resistance increases. Consequently, in the solder 92d, the current density on the depth side becomes higher than that on the front side in the flow direction. In such a manner, in the solder 92d, the current tends to be locally concentrated.

Each of the heat sink 52 and the emitter terminal E2 is formed by using a metal such as copper. At least main component metal of the heat sink 52 and that of the emitter terminal E2 are the same. For example, when the opposite part E2a is thinner than the joint part 52b, the flow in the opposite part E2a is not easier. Consequently, in the solder joint part 122, the force of the flow to a further place in the joint part 52b increases.

The plate face of the joint part 52b and that of the opposite part E2a face each other. The solder 92d interposes between the plate face of the joint part 52b and the plate face of the opposite part E2a. In projection view from the opposite direction, when the terminal disposition face (opposite face) in the joint part 52b is larger than the opposite part E2a, in the solder joint part 122, the force of the flow to a further place in the joint part 52b increases. Also in the semiconductor device 11, a similar problem occurs. When current is locally concentrated in the solder 91d and 92d, for example, electromigration is concerned.

Figure 36:
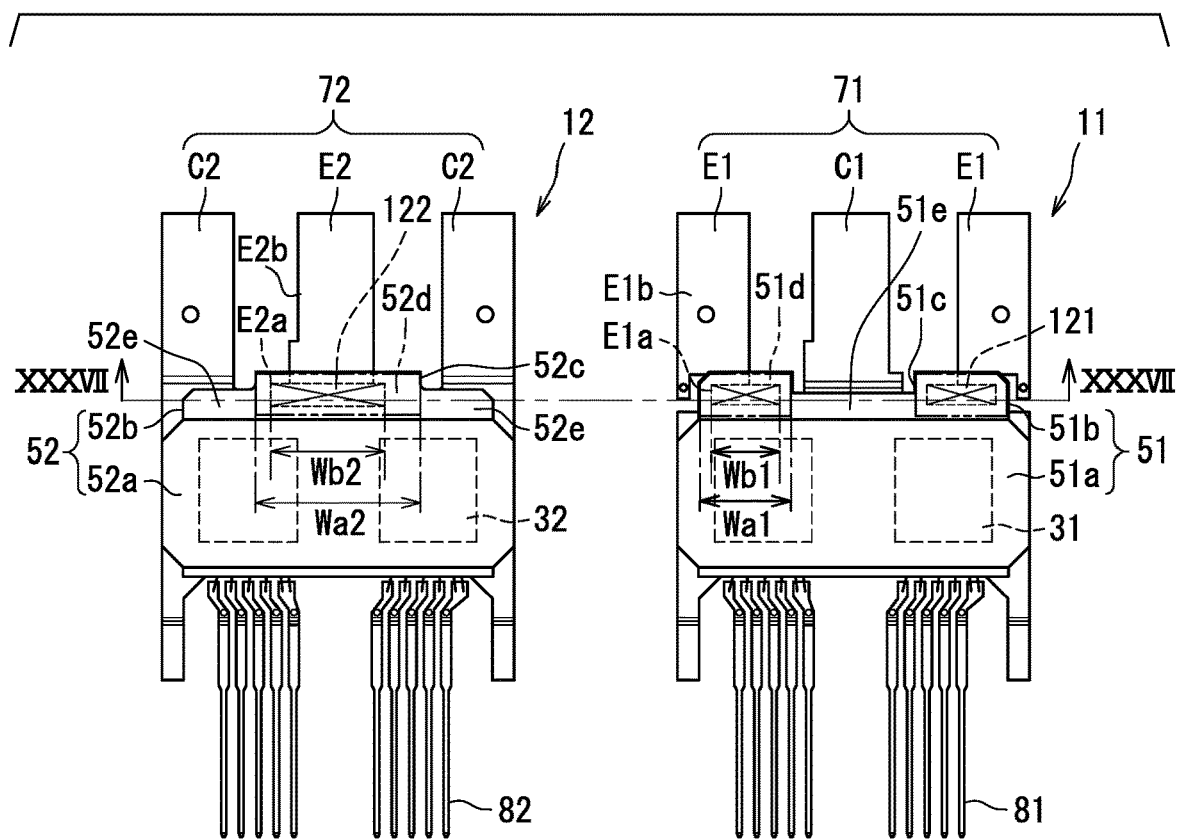
FIG. 36 is a planar view illustrating a semiconductor device according to a fourth embodiment.
Figure 37:
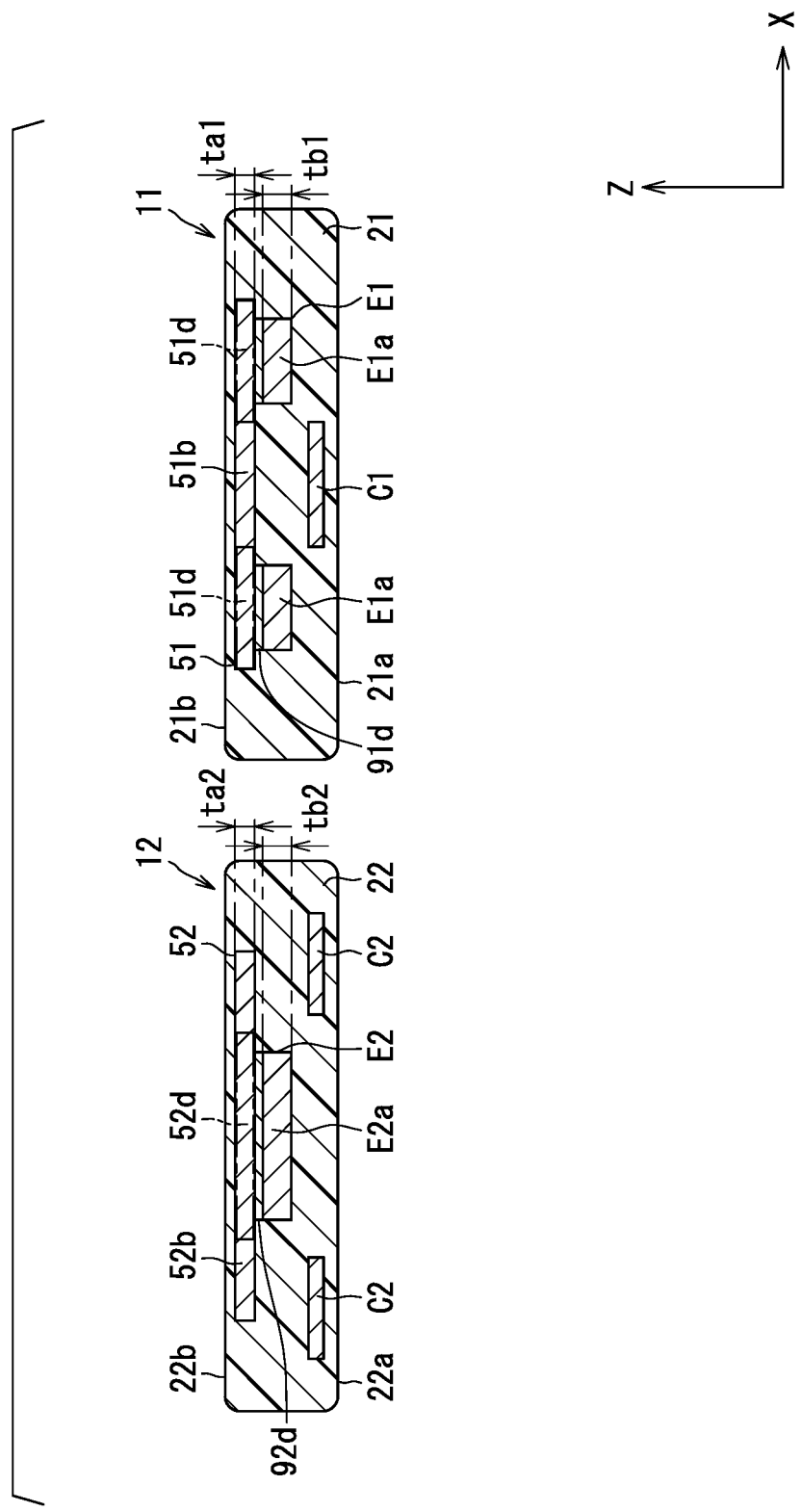
FIG. 37 is a cross section taken along the XXXVII-XXXVII line in FIG. 36.

Next, referring to FIGS. 36 and 37, the semiconductor devices 11 and 12 according to the present embodiment will be described. In FIG. 36, for convenience, the sealing resin members 21 and 22 are omitted. FIG. 37 is a cross section taken along the XXXVII-XXXVII line in FIG. 36. FIG. 37 also illustrates the sealing resin members 21 and 22. FIG. 37 corresponds to FIG. 5 of the foregoing embodiment.

The heat sink 51 of the semiconductor device 11 has the body part 51a and the joint part 51b. Each of the two emitter terminals E1 has the opposite part E1a and an extended part E1b. The opposite part E1a is disposed on the joint part 51b so that the plate faces are opposed to each other. The opposite part E1a is connected to the joint part 51b via the solder 91d. The extended part E1b is connected to the opposite part E1a. The extended part E1b is extended in the Y direction and a direction apart from the joint part 51b. As illustrated in FIG. 37, when the thickness of the joint part 51b is set as ta1 and the thickness of the opposite part E1a is set as tb1, the thickness tb1 is equal to or larger than the thickness ta1 (tb1≤ta1) at least in the solder joint part 121. In the present embodiment, the thickness of the joint part 51b is almost uniform in the entire region. The thickness of the opposite part E1a is almost uniform in the entire region. The thickness tb1 of the opposite part E1a is larger than the thickness ta1 of the joint part 51b (tb1>ta1). The disposition plane of the emitter terminal E1 in the joint part 51b is larger than the opposite part E1a. The joint part 51b has two projection parts 51c in correspondence with the two opposite parts E1a. The projection part 51c projects in the Y direction and a direction apart from the body part 51a.

A disposition region 51d of the opposite part E1a is provided at both ends in the X direction of the joint part 51b. In the joint part 51b, a region opposite to the collector terminal C1 is a no-disposition region 51e in which the opposite part E1a is not disposed. In the X direction, the disposition region 51d, the no-disposition region 51e, and the disposition region 51d are provided in this order. A width Wa1 of the disposition region 51d and a width of the projection part 51c are equal to each other. The width Wa1 is the length in the X direction.

The width Wa1 is length in a direction orthogonal to the plate thickness direction of the joint part 51b and the main flow direction of the current in the joint part 51b. The width Wa1 is length in a direction orthogonal to the plate thickness direction and the extension direction of the joint part 51b from the body part 51a. A part in the Y direction in the disposition region 51d, concretely, a part apart from the body part 51a forms the projection part 51c. Each of the disposition regions 51d has an almost rectangular shape in planar view. In the XY plane, the solder 91d is connected to the center part of the disposition region 51d, and the solder 91d is not connected to a periphery part surrounding the center part.

The solder 91d is connected to a part of the opposite part E1a. In the opposite part E1a, the joint part is provided at one end in the longer-side direction of the emitter terminal E1. A width Wb1 of the opposite part E1a is narrower than the width Wa1 of the disposition region 51d of the joint part 51b. That is, the width Wa1 is wider than the width Wb1 (Wa1>Wb1). The width Wb1 is length in the X direction including the joint part. The width Wb1 is length in the direction orthogonal to the plate thickness direction and the longer-side direction of the emitter terminal E1.

The heat sink 52 of the semiconductor device 12 has the body part 52a and the joint part 52b. One emitter terminal E2 has the opposite part E2a and an extended part E2b. The opposite part E2a is disposed on the joint part 52b so that surfaces are opposite to each other. The opposite part E2a is connected to the joint part 52b via the solder 92d. The extended part E2b is connected to the opposite part E2a. The extended part E2b is extended in the Y direction and a direction apart from the joint part 52b. As illustrated in FIG. 37, when the thickness of the joint part 52b is set as ta2 and the thickness of the opposite part E2a is set as tb2, the thickness tb2 is equal to or larger than the thickness ta2 (tb2≤ta2) at least in the solder joint part 122.

In the present embodiment, the thickness of the joint part 52b is almost uniform in the entire region. The thickness of the opposite part E2a is almost uniform in the entire region. The thickness tb2 of the opposite part E2a is larger than the thickness ta2 of the joint part 52b (tb2>ta2). The disposition plane of the emitter terminal E2 in the joint part 52b is larger than the opposite part E2a. The joint part 52b has one projection part 52c in correspondence with the opposite part E2a. The projection part 52c projects in the Y direction and a direction apart from the body part 52a.

A disposition region 52d of the opposite part E2a is provided in the center in the X direction of the joint part 52b. In the joint part 52b, a region opposite to the collector terminal C2 is a no-disposition region 52e in which the opposite part E2a is not disposed. In the X direction, the no-disposition region 52e, the disposition region 52d, and the no-disposition region 52e are provided in this order. A width Wa2 of the disposition region 52d and that of the projection part 52c are equal to each other. The width Wa2 is the length in the X direction.

The width Wa2 is length in a direction orthogonal to the plate thickness direction of the joint part 52b and the main flow direction of the current in the joint part 52b. The width Wa2 is length in a direction orthogonal to the plate thickness direction and the extension direction of the joint part 52b from the body part 52a. A part in the Y direction in the disposition region 52d, concretely, a part apart from the body part 52a forms the projection part 52c. The disposition region 52d has an almost rectangular shape in planar view. In the XY plane, the solder 92d is connected to the center part of the disposition region 52d, and the solder 92d is not connected to a periphery part surrounding the center part.

The solder 92d is connected to a part of the opposite part E2a. In the opposite part E2a, the joint part is provided at one end in the longer-side direction of the emitter terminal E2. A width Wb2 of the opposite part E2a is narrower than the width Wa2 of the disposition region 52d of the joint part 52b. That is, the width Wa2 is wider than the width Wb2 (Wa2>Wb2). The width Wb2 is length in the X direction including the joint part. The width Wb2 is length in the direction orthogonal to the plate thickness direction and the longer-side direction of the emitter terminal E2.

In the semiconductor devices 11 and 12 according to the present embodiment, as described above, the thickness tb1 of the opposite part E1a is equal to or larger than the thickness ta1 of the joint part 51b. Since current flows to the opposite part E1a more easily as compared with the configuration that the opposite part E1a is thinner than the joint part 51b, local concentration of the current in the solder 91d can be suppressed. Therefore, the reliability of the semiconductor device 11 can be improved. Similarly, the thickness tb2 of the opposite part E2a is equal to or larger than the thickness ta2 of the joint part 52b. Therefore, the reliability of the semiconductor device 12 can be improved.

In the present embodiment, the displacement face of the emitter terminal E1 in the joint part 51b is larger than the opposite part E1a. The width Wa1 of the disposition region 51d is wider than the width Wb1 of the opposite part E1a. In spite of the configuration that current tends to locally concentrate on the solder 91d, by satisfying the above-described relation of tb1 ta1, the reliability of the semiconductor device 11 can be improved. Similarly, the displacement face of the emitter terminal E2 in the joint part 52b is larger than the opposite part E2a. The width Wa2 of the disposition region 52d is wider than the width Wb2 of the opposite part E2a. In spite of the configuration that current tends to locally concentrate on the solder 92d, by satisfying the above-described relation of tb2 ta2, the reliability of the semiconductor device 12 can be improved.

In the present embodiment, the semiconductor device 11 has the plurality of semiconductor elements 31 and the semiconductor device 12 has the plurality of semiconductor elements 32. The plurality of semiconductor elements 31 are connected to the same body part 51a via the solder 91b and 91c. In spite of the configuration that current tends to locally concentrate on the solder 91d, by satisfying the above-described relation of tb1≥ta1, the reliability of the semiconductor device 11 can be improved. The plurality of semiconductor elements 32 are connected to the same body part 52a via the solder 92b and 92c. In spite of the configuration that current tends to locally concentrate on the solder 92d, by satisfying the above-described relation of tb2≥ta2, the reliability of the semiconductor device 12 can be improved.

In the semiconductor device 12, the number of emitter terminals E2 is smaller than that of the semiconductor elements 32. The number of emitter terminals E2 is smaller than that of the collector terminals C2. The semiconductor device 12 has two semiconductor elements 32 and one emitter terminal E2. In such a manner, in spite of the configuration that current tends to locally concentrate on the emitter terminal E2, that is, the solder 92d of the solder joint part 122, by satisfying the above-described relation of tb1≥ta1, the reliability of the semiconductor device 11 can be improved.

As illustrated in FIG. 37, in the present embodiment, in the semiconductor device 11, the thickness of the opposite part E1a of the emitter terminal E1 is thicker than that of the collector terminal C1. In the semiconductor device 12, the thickness of the opposite part E2a of the emitter terminal E2 is thicker than that of the collector terminal C2. In such a manner, in the main terminals 71 and 72, at least the opposite parts E1a and E2a in the emitter terminals E1 and E2 are set to be thicker than the other parts. Therefore, without changing the conditions of connection between the collector terminals C1 and C2 and the bus bar and the like, the local current concentration can be suppressed.

Figure 38A:
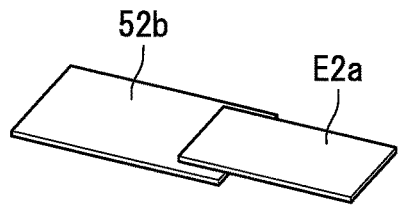
FIG. 38A is a perspective view of a model used for simulation in which θ=0°.
Figure 38B:
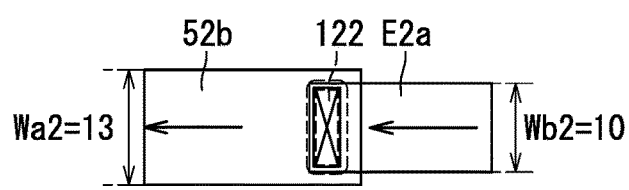
FIG. 38B is a top view of the model shown in FIG. 38A.
Figure 38C:
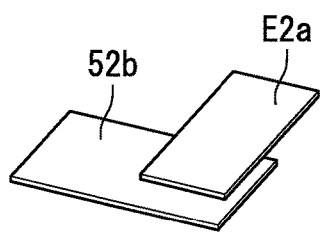
FIG. 38C is a perspective view of a model used for simulation in which θ=90°.
Figure 38D:
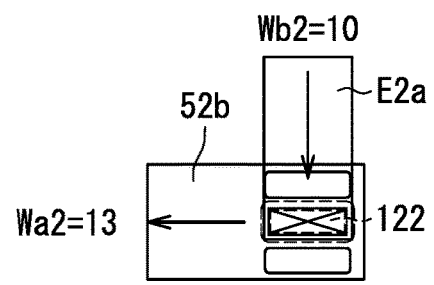
FIG. 38D is a top view of the model shown in FIG. 38C.
Figure 38E:
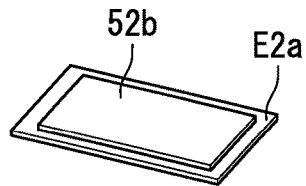
FIG. 38E is a perspective view of a model used for simulation in which θ=180°.
Figure 38F:
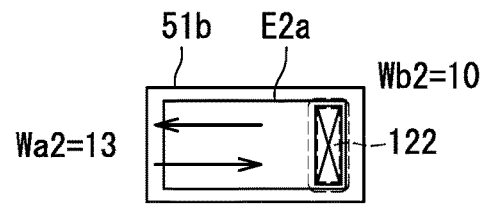
FIG. 38F is a top view of the model shown in FIG. 38E.
Figure 39A:
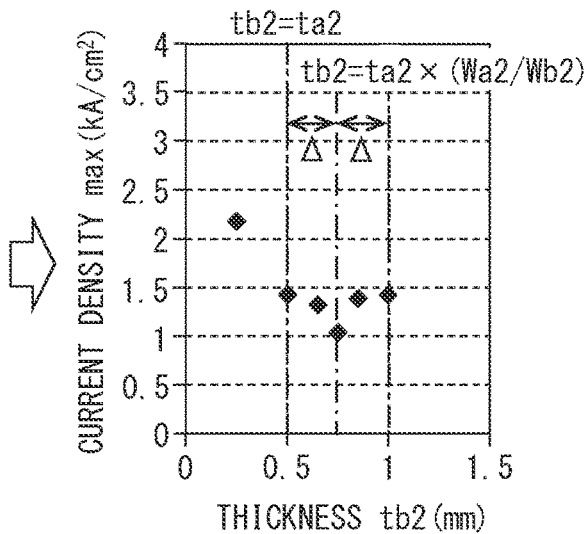
FIG. 39A is a diagram illustrating the relations between thickness and maximum value of current density of a solder joint part in a case of θ=0°.
Figure 39B:
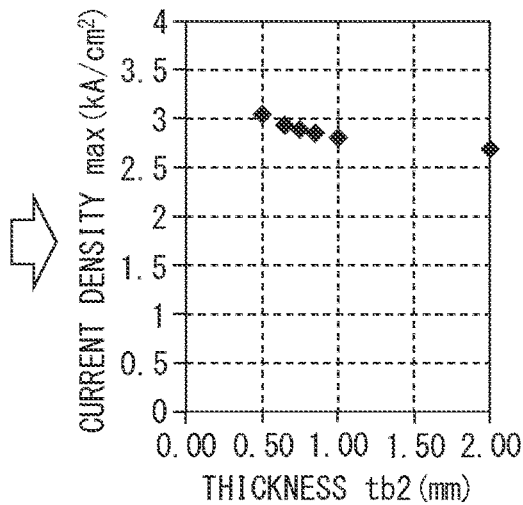
FIG. 39B is a diagram illustrating the relations between thickness and maximum value of current density of a solder joint part in a case of θ=90°.
Figure 39C:
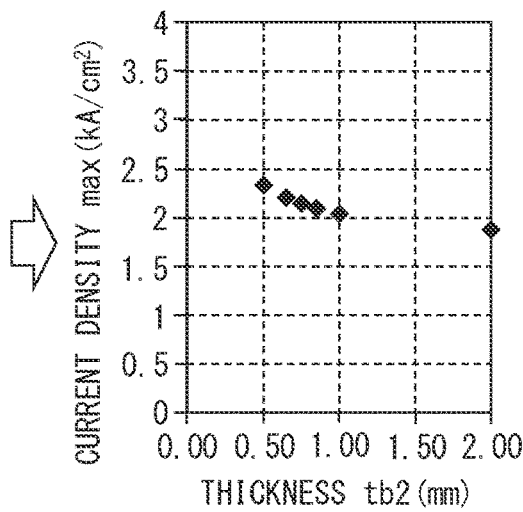
FIG. 39C is a diagram illustrating the relations between thickness and maximum value of current density of a solder joint part in a case of θ=180°.

Next, more preferable relations of the thicknesses ta1, ta2, tb1, and tb2 will be described. FIGS. 38A to 38F illustrate models used for simulation. FIGS. 39A to 39C illustrate simulation results. By simplifying the periphery of the solder joint part 122 of the semiconductor device 12, models are obtained. In FIGS. 38A and 38B, the main flows of current are indicated by solid-line arrows. In FIGS. 38A and 38B, the main flow direction of current flowing in the joint part 52b and the main flow direction of current flowing in the emitter terminal E2 are the same. That is, the angle θ formed by the currents is 0°. In FIGS. 38C and 38D, θ is 90°. In FIGS. 38E and 38F, θ is 180°. In FIGS. 38A to 38F, the width of the solder joint part 122 is almost equal to the width Wb2 of the emitter terminal E2.

In simulation, the width Wa2 is set to 13 mm, and the width Wb2 is set to 10 mm. The thickness ta2 of the joint part 52b is set to 0.5 mm. By variously changing the thickness tb2 of the emitter terminal E2, the maximum value of the current density in the solder joint part 122 is obtained. FIG. 39A illustrates the result when θ=0°, FIG. 39B illustrates the result when θ=90°, FIG. 39C illustrates the result when θ=180°.

As illustrated in FIG. 39A, in the case of θ=0°, the maximum value of the current density indicates the largest value at tb2<ta2. At tb2 ta2, the maximum value of the current density indicates a value smaller than that at tb2<ta2. When the thickness tb2 is around ta2×(Wa2/Wb2), the maximum value of the current density indicates the smallest value (lowest point).

When the thickness equal to the thickness ta2 is set as tb2s and the thickness at the lowest point is set as tb2m, the difference A between tb2s and tb2m is expressed by the following formula 6.

$$\Delta = tb2m - tb2s = ta2 \times \{(Wa2/Wb2) - 1\} \quad \text{(Formula 6)}$$

In the range of twice of A using the lowest point as an apex, the thickness tb2 becomes thicker than the thickness ta2. The range is expressed by the following formula 7.

$$ta2 < tb2 \leq ta2 \times \{(2 \times Wa2 - Wb2)/Wb2\} \quad \text{(Formula 7)}$$

By satisfying the relation of the formula 7, the maximum value of the current density can be further decreased. That is, local concentration of the current in the solder joint part 122 can be effectively suppressed. In the model, the example of θ=0° has been described. However, the present disclosure is not limited to the case that the main flow directions of current match completely. In the range of 0°≤θ<45°, that is, when the current component in the same direction is large, the effect can be produced.

Also in the case of θ=90°, although not illustrated, the maximum value of the current density indicates the largest value at tb2<ta2. As illustrated in FIG. 39B, in the range of tb2≥ta2, the thicker the thickness tb2 is, the smaller the maximum value of the current density becomes. Also in the case of θ=180°, although not illustrated, the maximum value of the current density indicates the largest value at tb2<ta2. As illustrated in FIG. 39C, in the range of tb2 ta2, the thicker the thickness tb2 is, the smaller the maximum value of the current density becomes.

In such a manner, at 45°≤θ≤180°, in the range of tb2≥ta2, the thicker the thickness tb2 is, the smaller the maximum value of the current density becomes. Particularly, by satisfying tb2>ta2, local concentration of current can be suppressed effectively. The semiconductor device 11 also produces similar effects.

In the semiconductor devices 11 and 12, the thickness of the opposite parts E1a and E2a of the emitter terminals E1 and E2 can be made almost equal to the thickness of the extended parts E1b and E2b. A configuration that the emitter terminals E1 and E2 have the same thickness throughout the length may be also employed.

Figure 40:
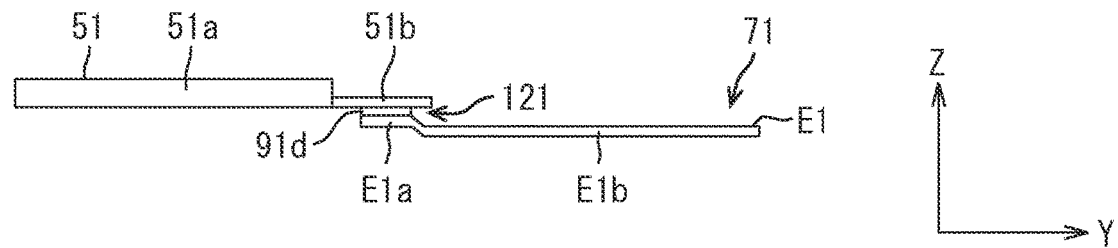
FIG. 40 is a planar view illustrating a modification.

For example, as in a modification illustrated in FIG. 40, the thickness of the opposite part E1a may be set thicker than the thickness of the extended part E1b. The thickness of the extended part E1b may be thinner than the thickness ta1 at of the joint part 51b. In the emitter terminal E1, the opposite part E1a is made thick, and the extended part E1b is made thin. In such a manner, also in the emitter terminal E1, without changing the condition of connection to the bus bar and the like, local concentration of current can be suppressed. As compared with the configuration that the thickness is the same throughout the length, the cost can be also reduced. The emitter terminal E2 is similar.

It is sufficient for each of the semiconductor devices 11 and 12 according to the present embodiment to have at least a semiconductor element, a metal member having a body part ad a joint part to which the semiconductor element is electrically connected, and a terminal soldered to the joint part.

Although the example that the semiconductor device 11 has two semiconductor elements 31 and the semiconductor device 12 has two semiconductor elements 32 has been described, the present disclosure is not limited to the example. The semiconductor device 11 may have only one semiconductor element 31 or three or more semiconductor elements 31, and the semiconductor device 12 may have only one semiconductor element 32 or three or more semiconductor elements 32. For example, as illustrated in FIG. 33, a configuration that four semiconductor elements 31 are electrically connected to the same heat sink 41, 51 may be also employed.

The disposition of the plurality of semiconductor elements 31 and 32 is not limited to the above-described examples. The present disclosure is not limited to the configuration that all of the semiconductor elements 31 and 32 are disposed side by side in the X direction. The present disclosure can be applied also to a configuration that a part of the semiconductor elements 31 is disposed so as to be deviated from the other semiconductor elements 31 in the Y direction. The present disclosure can be applied also to a configuration that a part of the semiconductor elements 32 is disposed so as to be deviated from the other semiconductor elements 32 in the Y direction. For example, the configuration illustrated in FIG. 34 may be employed.

Although the example that the semiconductor devices 11 and 12 have the sealing resin members 21 and 22, respectively has been described, the present disclosure is not limited to the example. A configuration that the sealing resin members 21 and 22 are not provided may be also employed.

The structures of the semiconductor devices 11 and 12 are not limited to the both-side heat-dissipation structure. The present disclosure can be also applied to a one-side heat-dissipation structure. The present disclosure is not limited to a switching element of a vertical structure but can be also applied to a switching element of a lateral structure (for example, an LDMOS).

Fifth Embodiment

In a fifth embodiment, the same reference numerals are designated to parts corresponding to the parts in the foregoing embodiments in view of function and/or structure and/or relates parts. With respect to the corresponding part and/or the related part, the description of the forgoing embodiments can be referred to.

In the foregoing embodiment, the example that a trench holding surplus solder is provided so as to surround the part joint to the main terminal in the heat sink has been described. In place of the trench, another holding structure may be also employed.

The basic configuration of the semiconductor devices 11 and 12 of the fifth embodiment is similar to that described in the foregoing embodiments. The semiconductor devices 11 and 12 have wiring members. The wiring members are electrically connected to the semiconductor elements 31 and 32 and provide the wiring function. The wiring member has a plurality of conductive parts and a joint part formed between two conductive parts. The conductive part includes at least a set of heat dissipation parts disposed so as to sandwich the semiconductor element 31 or 32 and a plurality of terminal parts connected to the heat dissipation parts. The heat sinks 41, 42, 51, and 52 correspond to the heat dissipation parts, and the main terminals 71 and 72 correspond to the terminal parts. The solder joint parts 121 and 122 correspond to joint parts, and the solder 91d and 92d corresponds to a joint material. The heat sinks 41, 42, 51, and 52 and the main terminals 71 and 72 correspond to wiring members.

<Structure of Holding Surplus Solder>

Figure 41:
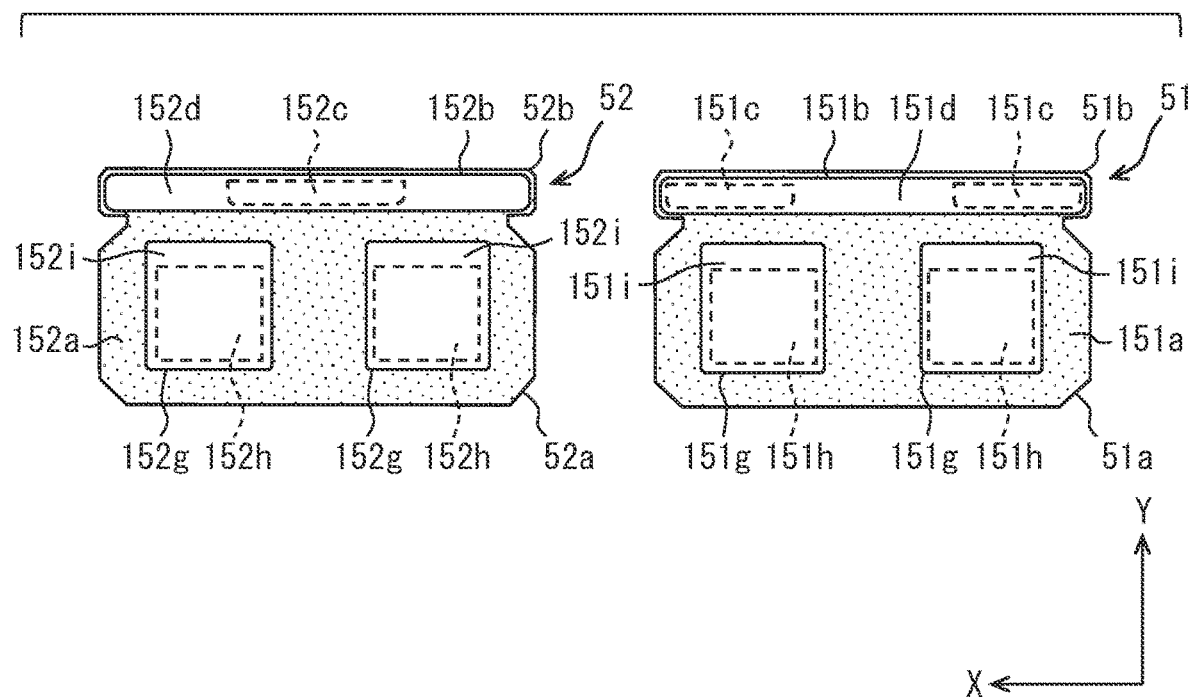
FIG. 41 is a planar view illustrating a heat sink on the emitter side in a semiconductor device according to a fifth embodiment.
Figure 42:
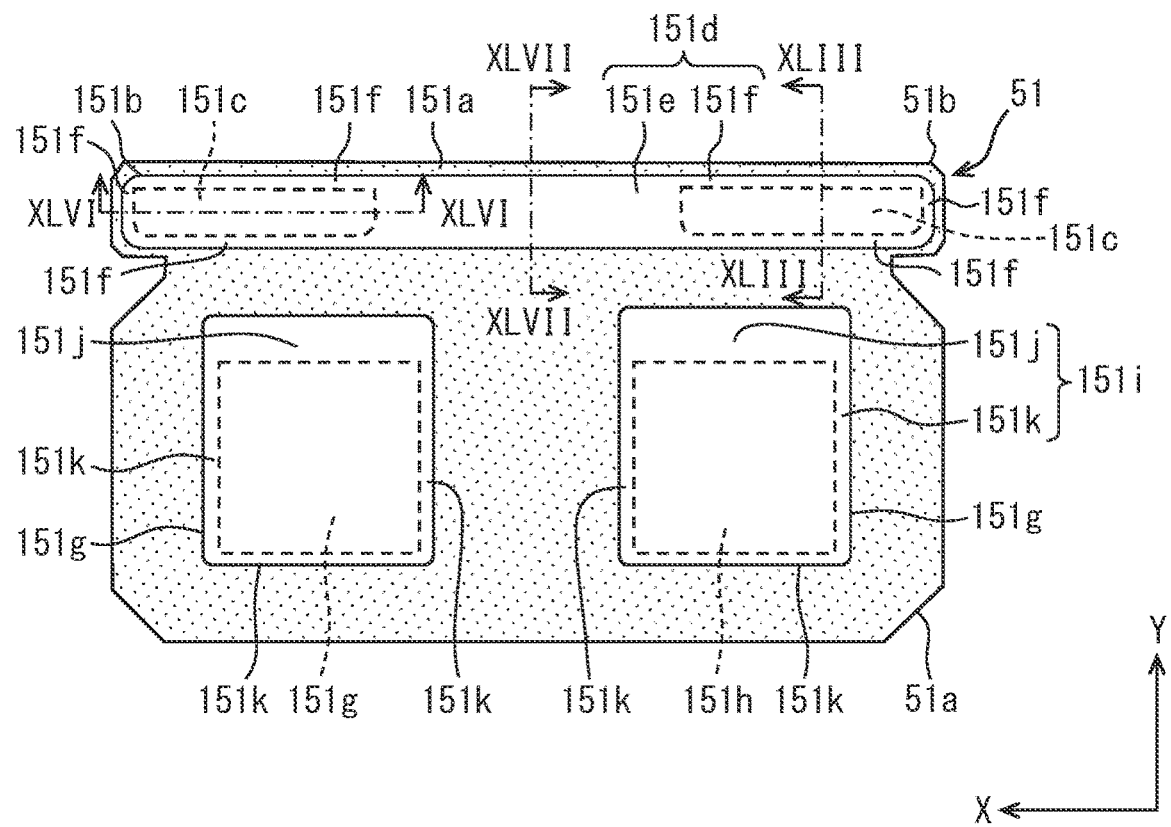
FIG. 42 is an enlarged planar view of the heat sink on the emitter side.
Figure 43:
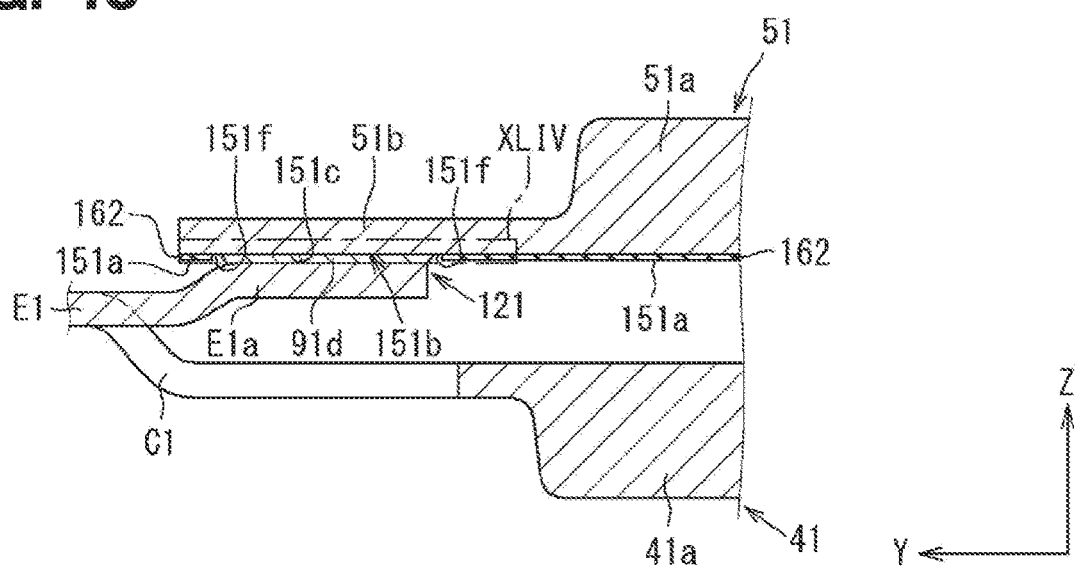
FIG. 43 is a cross section of the semiconductor device corresponding to the XLIII-XLIII line in FIG. 42.

Referring to FIGS. 41 to 43, a structure of holding surplus solder will be described. FIG. 41 illustrates the heat sinks 51 and 52 on the emitter side in the semiconductor devices 11 and 12 of the present embodiment. FIG. 42 is an enlarged view of the heat sink 51. FIG. 43 is a cross section of the semiconductor device 11 corresponding to the XLIII-XLIII line in FIG. 42. In FIG. 43, for convenience, the sealing resin member 21 is omitted. In the present embodiment, each of the heat sinks 51 and 52 on the emitter side is provided with a surplus solder holding structure. The heat sinks 51 and 52 correspond to first conductive parts, and the emitter terminals E1 and E2 correspond to second conductive parts.

The heat sink 51 has a low wettability region 151a and a high wettability region 151b on a surface opposite to the emitter terminal E1, that is, a mounting face. In planar views such as FIGS. 41 and 42, for clarification, the low wettability region is hatched. The low wettability region 151a is a region having wettability to solder, which is lower than that of the high wettability region 151b. The low wettability region 151a is provided adjacent to the high wettability region 151b so as to define at least a part of the outer periphery of the high wettability region 151b. The low wettability region 151a is a part in which solder is not easily wet and spread at the time of joint, and the high wettability region 151b is a part in which solder is easily wet and spread.

The high wettability region 151b has, in planar view in the Z direction as the plate thickness direction of the semiconductor element 31, an overlap region 151c as a region overlapping a joint part forming region in the emitter terminal E1 and a non-overlap region 151d as a region connected to the overlap region 151c and a region which does not overlap the joint part forming region in the emitter terminal E1. The non-overlap region 151d is connected to the overlap region 151c to be flush with the overlap region 151c. The joint part forming region in the emitter terminal E1 is the opposite part E1a. The solder 91d is disposed at least in an opposite region between the opposite part E1a and the overlap region 151c, and the joint part 131 is formed mainly by the overlap region 151c.

The high wettability region 151b including the overlap region 151c and the non-overlap region 151d is formed in the joint part 51b of the heat sink 51. The overlap region 151c and the non-overlap region 151d are surrounded by the low wettability region 151a. In the heat sink 52, the joint part 121 is formed between two emitter terminals E1. The heat sink 52 has two overlap regions 151c. Each of the overlap regions 151c has an almost rectangular shape in planar view using the X direction as the longer-side direction. The two overlap regions 151c are disposed side by side in the X direction.

The non-overlap region 151d includes at least a holding region 151e. The holding region 151e is connected to the overlap region 151c, and is the high wettability region 151b holding the solder 91d which is surplus for the joint part 121. The holding region 151e of the present embodiment is connected to the two overlap regions 151c to be flush with the two overlap regions 151c. In the arrangement direction of the two overlap regions 151c, one end of the holding region 151e is connected to one of the overlap regions 151c, and the other end of the holding region 151e is connected to the other one of the overlap regions 151c. In such a manner, one holding region 151e is provided as a region shared by the two overlap regions 151c.

The non-overlap region 151d further includes a fillet forming region 151f. The fillet forming region 151f is also the high wettability region 151b connected to the overlap region 151c. The fillet forming region 151f is a region provided so that a fillet of the solder 91d can be formed and narrower than the holding region 151e. The fillet forming region 151f corresponds to a narrow region.

The holding region 151e is connected to one side of the overlap region 151c, and the fillet forming region 151f is connected to the remaining three sides of the overlap region 151c. In each of the overlap regions 151c, the fillet forming region 151f is connected to sides on both sides in the Y direction and the side on the outside in the X direction, and the holding region 151e is connected to the side on the inside in the X direction. The inside in the X direction is a side to which the two overlap regions 151c face each other and the outside is opposite from the inside. In such a manner, the non-overlap region 151d surrounds the overlap region 151c. The low wettability region 151a is adjacent to the entire periphery of the non-overlap region 151d so as to define the outer periphery of the non-overlap region 151d. The low wettability region 151a is adjacent to the entire outer periphery of the high wettability region 151b in the holding region 151e. The high wettability region 151b including two overlap regions 151c and the holding region 151e is provided in a straight line state along the X direction.

The width of the non-overlap region 151d is length in the direction connected to the overlap region 151c, that is, the direction of arrangement with the overlap region 151c. The width of the holding region 151e is length in the X direction. In the fillet forming region 151f, for example, the width of the part arranged in the X direction with the overlap region 151c is length in the X direction. The fillet forming region 151f has width to a degree that a fillet can be formed. The holding region 151e has a width sufficiently larger than the width of the fillet forming region 151f. The holding region 151e has width in which a surplus amount of the solder 91d when the opposite interval between the overlap region 151c and the opposite part E1a becomes the narrowest can be housed so as to absorb variations in the height of the semiconductor device 11. The holding region 151e has width that the surplus amount for the joint part 121 of the two overlap regions 151c can be held.

The heat sink 51 has a high wettability region 151g in addition to the above-described high wettability region 151b. The high wettability region 151b has an overlap region 151h as a region overlapped by the terminal 61 in planar view and a non-overlap region 151i as a region connected to the overlap region 151h and a region which is not overlapped by the terminal 61. The heat sink 51 has two high wettability regions 151g in correspondence with the two terminals 61 (semiconductor elements 31). The non-overlap region 151i includes, like the non-overlap region 151d, a holding region 151j and a fillet forming region 151k.

The holding region 151j is connected to the overlap region 151h and holds the solder 91c overflowed from the region in which the overlap region 151h and the terminal 61 face each other. The holding region 151j is connected to one side of the overlap region 151h having an almost rectangular shape in planar view, and the fillet forming region 151k is connected to the remaining three sides of the overlap region 151h. In each of the overlap regions 151h, the fillet forming region 151k is connected to both sides in the X direction and one side in the Y direction and the holding region 151j is connected to the remaining sides in the Y direction.

As described above, the non-overlap region 151i surrounds the overlap region 151h. The low wettability region 151a is adjacent to the entire periphery of the non-overlap region 151i so as to define the outer periphery of the non-overlap region 151i. The outer periphery of the low wettability region 151a is adjacent to the part as the outer periphery of the high wettability region 151b in the holding region 151j. Each of the two high wettability regions 151g has an almost rectangular shape in planar view.

The fillet forming region 151k is a region narrower than the holding region 151j. The fillet forming region 151k has width to the degree that a fillet can be formed. The holding region 151j has width sufficiently wider than the width of the fillet forming region 151k. The holding region 151j has width in which a surplus amount of the solder 91c when the opposite interval between the overlap region 151h and the terminal 61 becomes the narrowest can be held so as to absorb variations in height of the semiconductor device 11.

The low wettability region 151a is provided on the entire surface of the part except for the high wettability region 151b and the two high wettability regions 151g in the mounting face of the heat sink 51. Since the heat sink 52 has a configuration similar to that of the heat sink 51, detailed description will be omitted. The heat sink 52 also has a low wettability region 152a and high wettability regions 152b and 152g. The low wettability region 152a is provided on the entire surface of the part except for the high wettability regions 152b and 152g. The high wettability region 152b includes an overlap region 152c and a non-overlap region 152d. The high wettability region 152g includes an overlap region 152h and a non-overlap region 152i. The non-overlap regions 152d and 152i include not-illustrated holding regions 152e and 152j and fillet forming regions 152f and 152k. The heat sink 52 has the same shape (common part) as that of the heat sink 51, and the patterning of the low wettability region 151a and that of the low wettability region 152a are the same with each other. Different from the heat sink 51, the heat sink 52 has only one overlap region 152c overlapping the opposite part E2a of the emitter terminal E2. The overlap region 152c is provided near the center of the high wettability region 152b extending along the X direction.

<Low Wettability Region>

Figure 44:
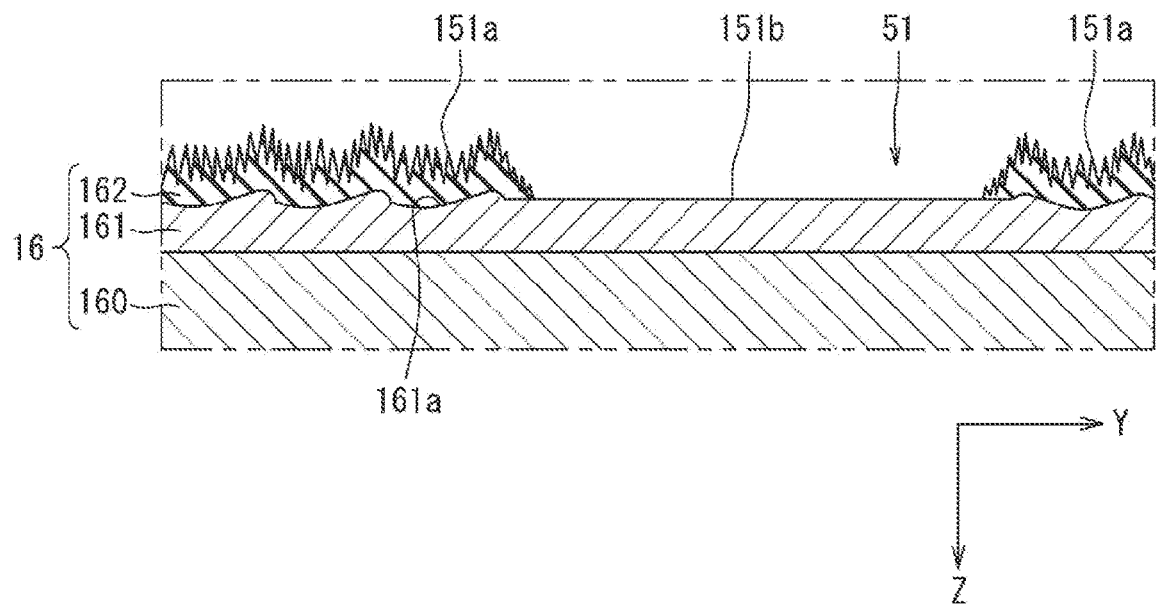
FIG. 44 is an enlarged cross section of a region XLIV in FIG. 43.

Referring to FIG. 44, the low wettability region will be described. FIG. 44 is an enlarged view of a region XLIV in FIG. 43. In FIG. 44, for convenience, the solder 91d is omitted. Hereinafter, the heat sink 51 will be described as an example.

The heat sink 51 has a base material 160 including metal and a metal film 161 provided on the surface of the base material 160 and an irregular-surface oxide film 162. The base material 160 forms a main part of the heat sink 51. The base material 160 is formed by using a Cu-based material. The metal film 161 is formed by including a material having high wettability to solder higher than that of the base material 160. The metal film 161 is formed in the entire region of the mounting face of the heat sink 51. The irregular-surface oxide film 162 is formed locally in the mounting face.

By irradiating the metal film 161 with a laser beam, the irregular-surface oxide film 162 is locally formed on the metal film 161. The metal film 161 is provided on the entire region of the face, for example, except for the exposed face in the surface of the base material 160. The metal film 161 has an underlayer using Ni (nickel) as a main component and an upper film using Au (gold) as a main component. In the present embodiment, as the underlayer, an electroless Ni plating film including P (phosphorus) is employed. In the metal film 161 exposed from the irregular-surface oxide film 162, the upper film (Au) of the part the solder is in contact is diffused in the solder at the time of reflow. The upper film (Au) of the part in which the irregular-surface oxide film 162 is formed in the metal film 161 is removed by irradiation of a laser beam at the time of forming the irregular-surface oxide film 162. The irregular-surface oxide film 162 is a film of an oxide having Ni as a main component. For example, 80% of the components of the irregular-surface oxide film 162 is $Ni_2O_3$, 10% is NiO, and 10% is Ni.

The irregular-surface oxide film 162 is formed in the low wettability region 151a in the mounting face of the heat sink 51. The irregular-surface oxide film 162 is not formed in the high wettability regions 151b and 151g. The irregular-surface oxide film 162 provides the low wettability region 151a. The metal film 161 exposed from the irregular-surface oxide film 162 provides the high wettability regions 151b and 151g.

Reference numeral 161a in FIG. 44 indicates a dent part formed in the surface of the metal film 161. The dent part 161a is formed by radiation of a laser beam of pulse oscillation. One dent part 161a is formed by one pulse. The irregular-surface oxide film 162 is formed by melting, vaporizing, and depositing a surface-layer part of the metal film 161 by irradiation of a laser beam. The irregular-surface oxide film 162 is an oxide film derived from the metal film 161. The irregular-surface oxide film 162 is a film of an oxide of a metal (Ni) as a main component of the metal film 161. The irregular-surface oxide film 162 is formed in the track of projections and dents in the surface of the metal film 161 having the dent parts 161a. In the surface of the irregular-surface oxide film 162, projections and dents are formed at pitches finer than the width of the dent part 161a. That is, very fine projections and dents (rough part) are formed.

The irregular-surface oxide film 162 can be formed by, for example, the following manufacturing method. First, electroless Ni plating containing P (phosphorus) is performed on the base material 160. After that, Au plating is performed to obtain the metal film 161. After formation of the metal film 161, the mounting face is irradiated with a laser beam of pulse oscillation to melt and evaporate the surface of the metal film 161.

The laser beam of pulse oscillation is adjusted so that the energy density becomes equal to or larger than 0 $J/cm^2$ and equal to or less than 100 $J/cm^2$, and the pulse width becomes 1 µsecond or less. To satisfy the conditions, a YAG laser, a $YVO_4$ laser, a fiber laser, or the like can be employed. For example, in the case of a YAG laser, it is sufficient that the energy density is 1 $J/cm^2$ or higher. In the case of electroless Ni plating, for example, even at about 5 $J/cm^2$, the metal film 161 can be processed.

By moving the light source of the laser beam and the heat sink 51 relatively, the laser beam is emitted to a plurality of positions in order. By irradiating the laser beam to melt and evaporate the surface of the metal film 161, the dent parts 161a are formed in the surface of the metal film 161. Average thickness of the parts irradiated with the laser beam in the metal film 161 is thinner than that of the parts which are not irradiated with the laser beam. The plurality of dent parts 161a formed in correspondence with spots of the laser beam are continuous, for example, in an imbricate shape.

Subsequently, the molten parts in the metal film 161 are solidified. Concretely, the molten and vaporized metal film 161 is deposited in the parts irradiated with the laser beam and their peripheral parts. By depositing the molten and vaporized metal film 161 in such a manner, the irregular-surface oxide film 162 is formed on the surface of the metal film 161. As a result, the heat sink 51 having the low wettability region 151a by the irregular-surface oxide film 162 and the high wettability regions 151b and 151g by the metal film 161 exposed from the irregular-surface oxide film 162 can be prepared.

The heat sink 52 has a configuration similar to that of the heat sink 51. By a manufacturing method similar to that of the heat sink 51, the heat sink 52 having the low wettability region 152a by the irregular-surface oxide film 162 and the high wettability regions 152b and 152g by the metal film 161 exposed from the irregular-surface oxide film 162 can be prepared.

Summary of Fifth Embodiment

As described in the foregoing embodiments, each of the semiconductor devices 11 and 12 of the both-side heat dissipation structure is sandwiched by coolers from both sides in the Z direction. Therefore, in the Z direction, the high-degree of a parallel state of the surface and high dimension precision between the surfaces are required. Consequently, the solder 91d and 92d of an amount capable of absorbing variations in the height of the semiconductor devices 11 and 12 is disposed. That is, a rather large amount of solder 91d and 92d is disposed. By applying a load in the Z direction at the time of the second reflow, the height of each of the semiconductor devices 11 and 12 becomes predetermined height. The solder 91d and 92d absorbs height variations due to dimension tolerance and assembly tolerance of the components of the semiconductor devices 11 and 12.

For example, in the case that all of the amount of the solder 91d is necessary to set the height of the semiconductor device 11 to predetermined height, all of the amount of the solder 91d remains in the opposing region between the opposite part E1a and the overlap region 151c by the capillary phenomenon, surface tension, or the like. When the solder 91d is surplus to set the predetermined height, by application of an external force exceeding the holding force between the opposite regions such as the capillary phenomenon or the surface tension, a part of the solder 91d flows to the outside of the opposed region.

Figure 45:
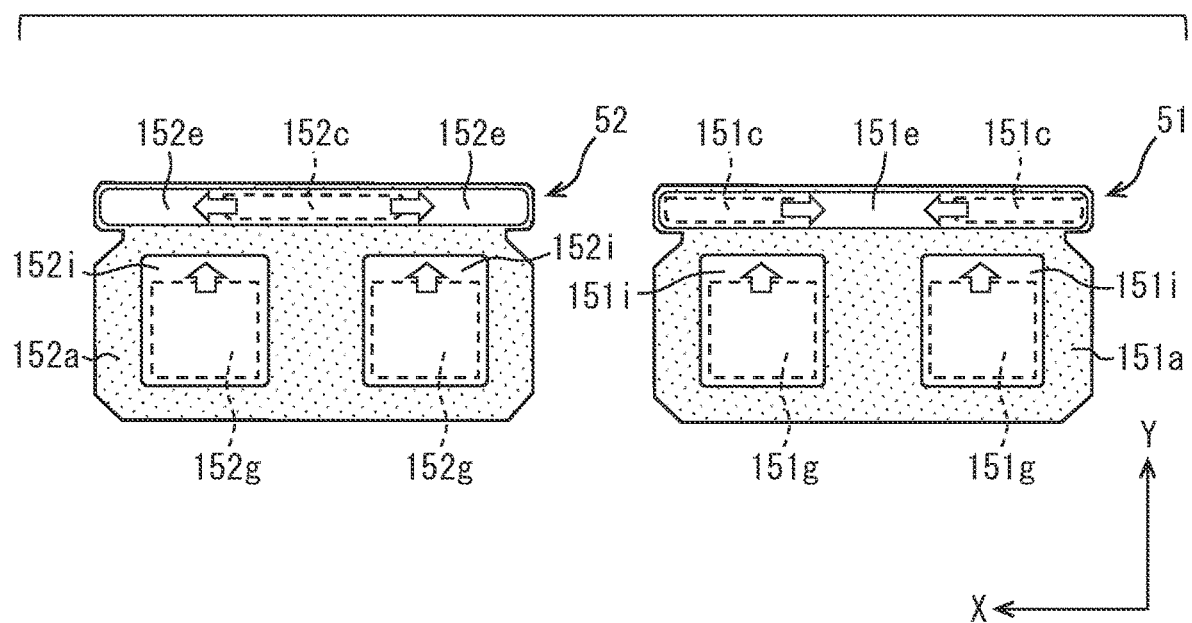
FIG. 45 is a planar view illustrating wetting and spreading of surplus solder.
Figure 46:
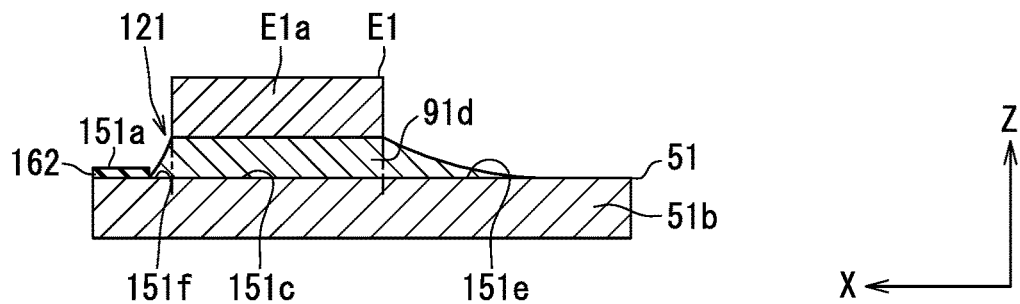
FIG. 46 is a cross section of the semiconductor device corresponding to the XLVI-XLVI line in FIG. 42.

In the present embodiment, the holding region 151e as the high wettability region 151b is connected to the overlap region 151c. Consequently, the surplus solder 91d easily spreads from the overlap region 151c to the holding region 151e as indicated by open arrows in FIG. 45. The open arrows in FIG. 45 indicate the flow directions (overflow directions) of the surplus solder. The wet spreading of the surplus solder 91d is regulated by the low wettability region 151a. By the low wettability region 151a adjacent to the high wettability region 151b, wet spreading to the holding region 151e is promoted and/or spread to the outside of the holding region 151e is suppressed. In such a manner, without providing a trench, as illustrated in FIG. 46, the surplus solder 91d can be held in the holding region 151e. FIG. 46 is a cross section of the semiconductor device 11, corresponding to the XLVI-XLVI line in FIG. 42. FIG. 46 illustrates a state that the solder 91d overflows. Similarly, without providing a trench, the surplus solder 92d can be held in the holding region 152e.

As a result, the semiconductor devices 11 and 12 in which the surplus solder 91d and 92d can be held with a simple configuration can be provided. Since press work to form a trench becomes unnecessary, the manufacture cost can be reduced.

Figure 47A:
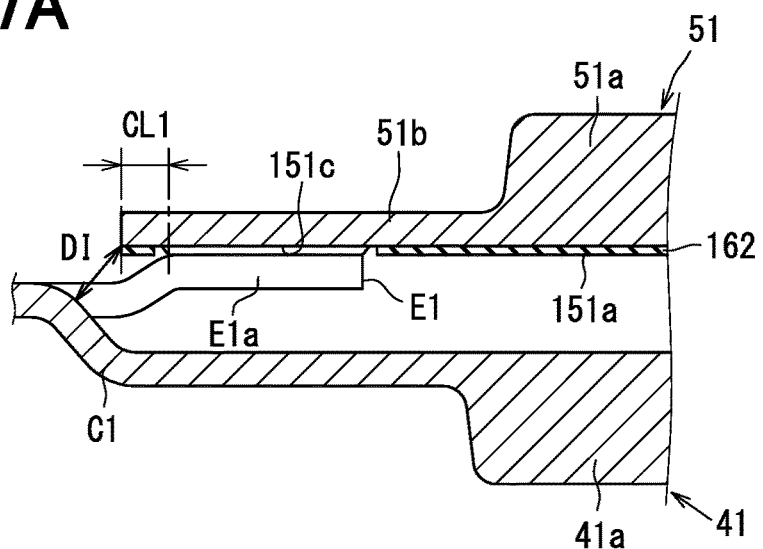
FIG. 47A is a cross section of the semiconductor device corresponding to the XLVII-XLVII line in FIG. 42.
Figure 47B:
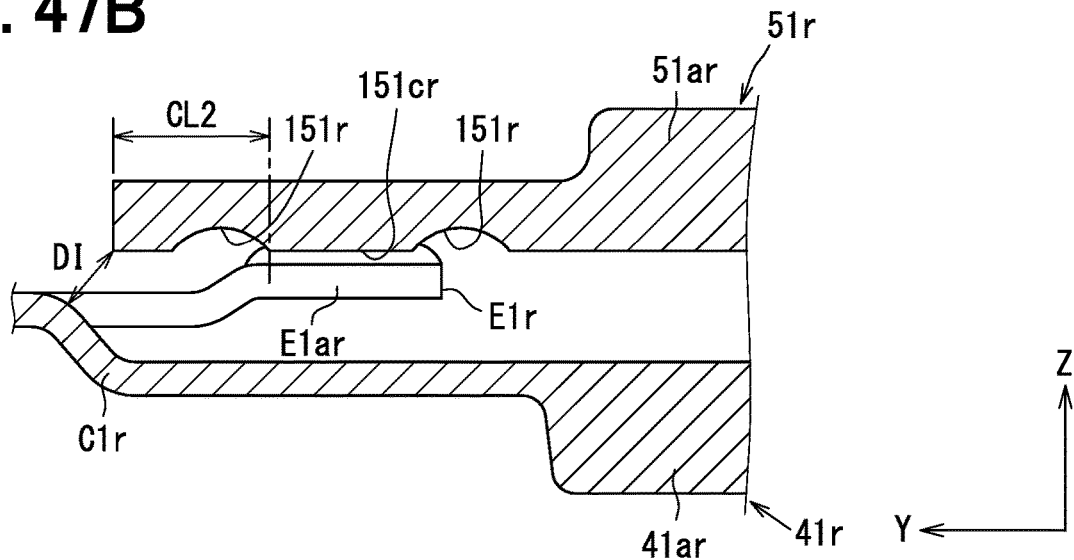
FIG. 47B is a cross section of a semiconductor device according to a reference example.

FIG. 47A is a cross section of the semiconductor device 11 corresponding to the XLVII-XLVII line of FIG. 42. In FIG. 47A, for convenience, the sealing resin member 21 is omitted. FIG. 47A illustrates the present embodiment and FIG. 47B illustrates a reference example. Since the potential of the heat sink 51 and that of the collector terminal C1 are different, a predetermined insulation distance DI has to be assured between them in the sealing resin member 21. By positioning a bent part of the collector terminal C1 far from the heat sink 51 in the Y direction, the insulation distance DI can be assured. On the other hand, the build of the sealing resin member 21 and, furthermore, the build of the semiconductor device 11 become larger. Therefore, it is preferable to dispose the elements so that the distance between the bent part of the collector terminal C1 and the end part of the heat sink 51 (the joint part 51b) becomes the insulation distance DI.

When such disposition is employed, in the example, the clearance from the end part of the heat sink 51 to the overlap region 151c becomes CL1. In the case of the reference example, there is a trench 151r for holding the surplus solder, so that the clearance to the overlap region 151cr becomes CL2. The clearance CL2 is longer than the clearance CL1. The clearance CL1 is, for example, a length which is about the half of the clearance CL2. Therefore, according to the present embodiment, while assuring the insulation distance DI, the build of the semiconductor device 11 can be made smaller in the extension direction of the emitter terminal E1. The semiconductor device 12 (heat sink 52) has a configuration similar to that of the semiconductor device 11 (heat sink 51). In the reference example, r is added to the end of each of the reference numerals of the present embodiment with respect to elements which are the same or related to the elements of the present embodiment. In the following reference examples, r is similarly added.

In the present embodiment, in the heat sink 51, the holding region 151e is connected to only a part of the overlap region 151c. The low wettability region 151a is adjacent to the outer periphery of the high wettability region 151b on both sides in the Y direction orthogonal to the direction (X direction) in which the overlap region 151c and the holding region 151e are arranged and sandwiches the overlap region 151c and the holding region 151e. The low wettability region 151a positioned on both sides functions as a guide of flow of the surplus solder 91d. By the guide of the low wettability region 151a, wet spreading of the surplus solder 91d from the overlap region 151c to the holding region 151e becomes easy. In addition, the surplus solder 91d is easily held in the holding region 151e by the low wettability region 151a on both sides. The heat sink 52 is similar.

In the present embodiment, in the heat sink 51, the low wettability region 151a is adjacent to the part as the outer periphery of the high wettability region 151b in the entire holding region 151e. With the configuration, wet spreading of the solder 91d to the outside of the holding region 151e can be suppressed. That is, the surplus solder 91d can be held more certainly in the holding region 151e. The heat sink 52 is similar.

In the present embodiment, in the heat sink 51, the low wettability region 151a is adjacent to the entire outer periphery of the high wettability region 151b. Consequently, the surplus solder 91d is certainly wet and spread in the holding region 151e and held in the holding region 151e.

Figure 48:
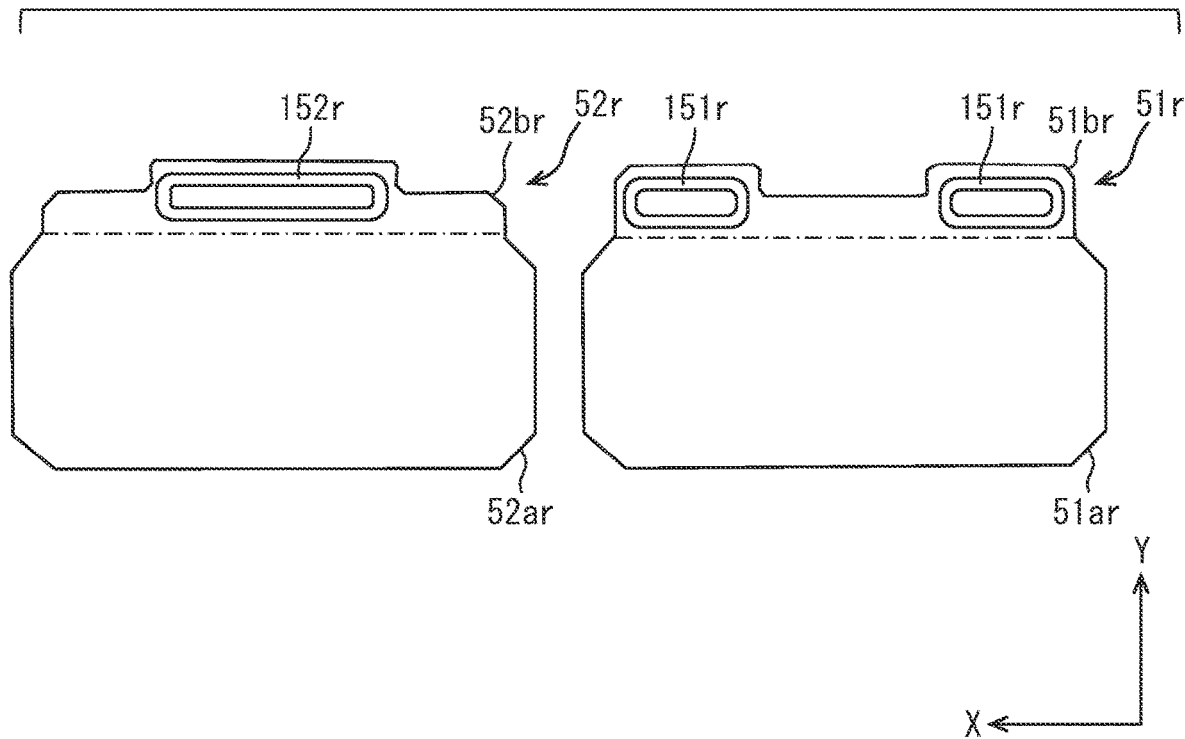
FIG. 48 is a planar view illustrating the reference example.

FIG. 48 illustrates the reference example. In the reference example, in joint parts 51br and 52br of the heat sinks 51r and 52r, the trenches 151r and 152r holding surplus solder are provided. The heat sink 51r has the trenches 151r near both ends in the X direction of the joint part 51br. The heat sink 52r has the trench 152r around the center in the X direction of the joint part 52br. Therefore, the heat sinks 51r and 52r cannot be made common.

On the other hand, in the present embodiment, the heat sinks 51 and 52 have the same shape and the low wettability regions 151a and 152a and the high wettability regions 151b and 152b have the same wetting pattern. That is, the irradiation pattern of a laser beam forming the irregular-surface oxide film 162 is also the same. As illustrated in FIG. 45, in the semiconductor device 11, the parts near both ends become the overlap regions 151c in the high wettability region 151b and the region between the two overlap regions 151c becomes the holding region 151e. In the semiconductor device 12, in the high wettability region 152b, a region near the center becomes the overlap region 152c and both sides become the holding regions 152e. By making the heat sinks 51 and 52 common, the manufacture cost can be reduced.

In the present embodiment, the metal film 161 having high wettability to solder is locally irradiated with a laser beam to obtain the irregular-surface oxide film 162 and form the low wettability regions 151a and 152a. The wettability to solder of the oxide film (irregular-surface oxide film 162) is lower than that of the metal film 161. Since the surface has fine irregularities, the area of contact to solder becomes smaller, and a part of the solder becomes a sphere shape by the surface tension. That is, the contact angle becomes large. Therefore, the wettability to solder is low. Consequently, the irregular-surface oxide film 162 is suitable to the low wettability regions 151a and 152a. Since a laser beam is used, patterning of the low wettability regions 151a and 152a and the high wettability regions 151b and 152b is easy.

Further, very fine projections and dents are formed in the surface of the irregular-surface oxide film 162, the sealing resin members 21 and 22 are entangled, and the anchor effect is produced. In addition, the area of contact with the sealing resin members 21 and 22 increases. Therefore, in the parts provided with the irregular-surface oxide film 162 in the heat sinks 51 and 52, the adhesion with the sealing resin members 21 and 22 increases.

In parts in which the solder joint parts 131 and 132 are formed in the heat sinks 51 and 52, trenches for holding the surplus solder 91c and 92c may be also provided. When the dispositions of the semiconductor elements 31 and 32 are the same in the semiconductor devices 11 and 12, the shapes and dispositions of the trenches can be made the same. In the present embodiment, a structure of holding surplus solder similar to the solder joint parts 121 and 122 is applied also to parts in which the solder joint parts 131 and 132 are formed. Therefore, without providing a trench, the surplus solder 91c and 92c can be held in the holding regions 151j and 152j. In the heat sinks 51 and 52, the press work of forming trenches can be made completely unnecessary.

Modifications

Figure 49:
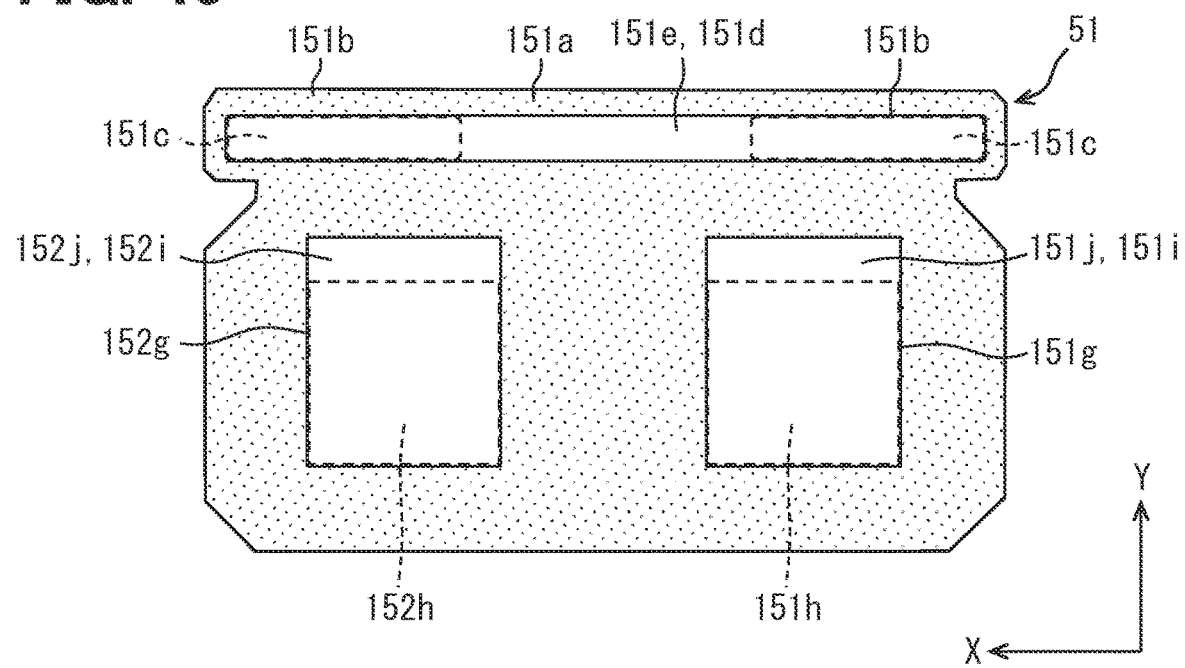
FIG. 49 is a planar view illustrating a modification.

In the non-overlap region 15d, it is sufficient to include at least the holding region 151e. As illustrated in FIG. 49, a configuration obtained by excluding the fillet forming region 151f from the non-overlap region 151d in the heat sink 51 may be employed. The high wettability region 151b has only the overlap region 151c and the holding region 151e. Even with such a configuration, effects similar to those of the foregoing embodiment can be produced. The high wettability region 151g on the side of the terminal 61 also has a configuration that the fillet forming region 151k is similarly excluded. The heat sink 52 is also similar.

Figure 50:
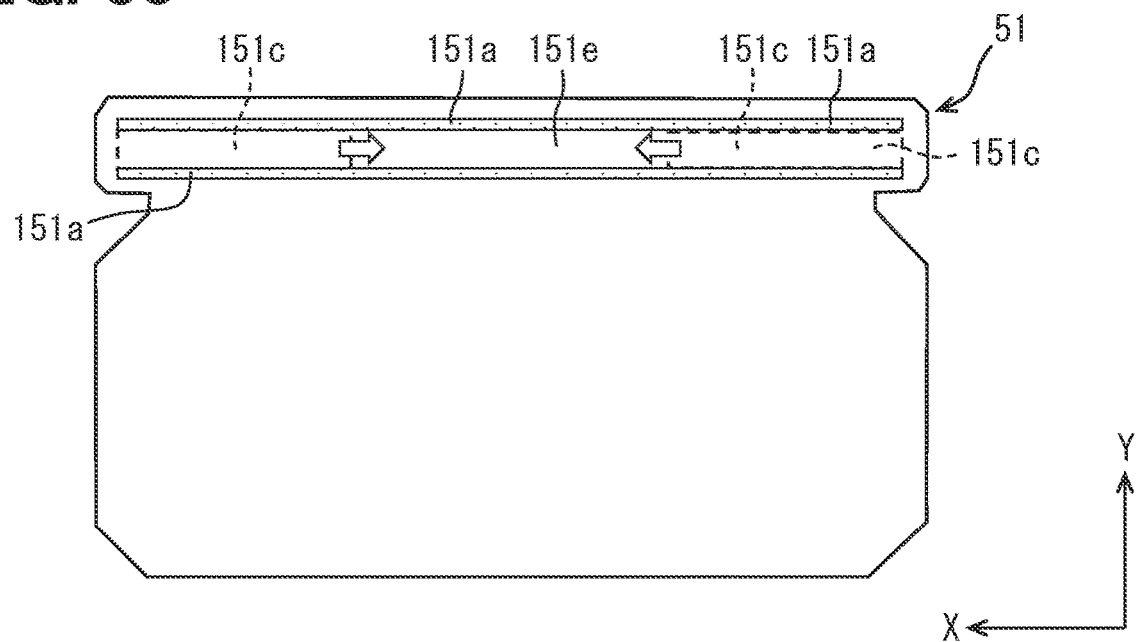
FIG. 50 is a planar view illustrating a modification.

It is sufficient for the low wettability region 151a to be adjacent to at least a part of the high wettability region 151b. As illustrated in FIG. 50, the low wettability region 151a may be provided only on both sides in the Y direction orthogonal to the direction (X direction) of arrangement of the overlap region 151c and the holding region 151e. The low wettability region 151a extends over the overlap region 151c and the holding region 151e on both sides in the Y direction and sandwiches the overlap region 151c and the holding region 151e. In FIG. 50, like in FIG. 49, the low wettability region 151a is continuously adjacent to the overlap region 151c and the holding region 151e. The heat sink 52 is also similar.

Figure 51:
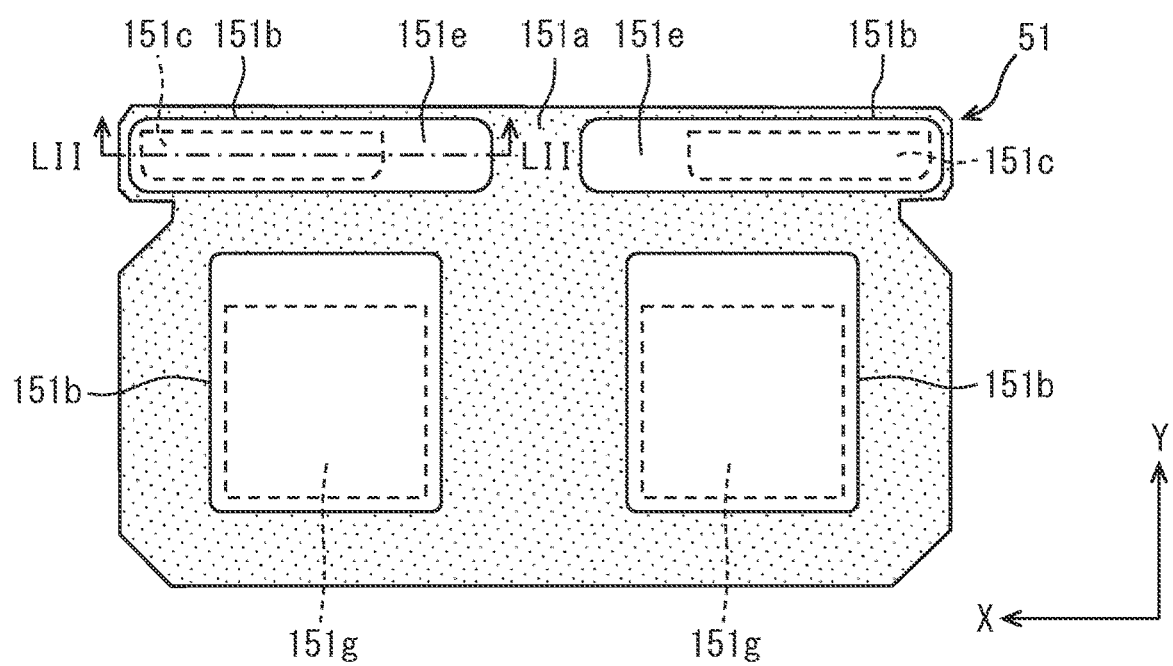
FIG. 51 is a planar view illustrating a modification.
Figure 52:
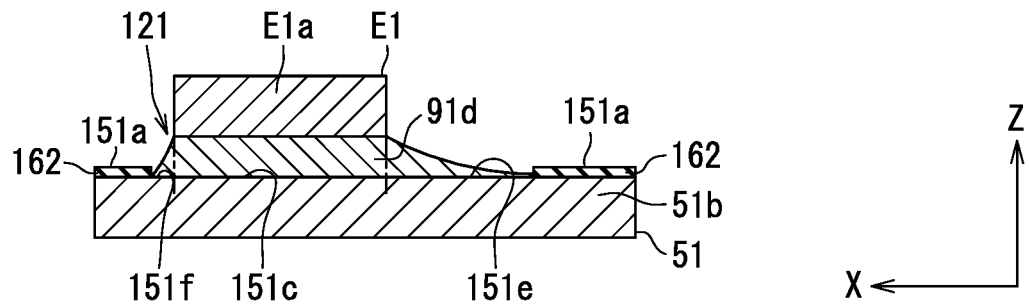
FIG. 52 is a cross section taken along the LII-LII line in FIG. 51.

Although the example that the holding region 151e is shared by a plurality of overlap regions 151c has been described, the present disclosure is not limited to the example. As illustrated in FIGS. 51 and 52, the holding region 151e may be divided every overlap region 151c. The low wettability region 151a divides the high wettability region 151b into two parts. FIG. 52 is a cross section of the semiconductor device 11 corresponding to the LII-LII line in FIG. 51 and illustrates a state where the solder 91d overflows like in FIG. 46. According to the modification, the patterns of the low wettability region and the high wettability region in the heat sink 51 and those in the heat sink 52 are different. However, with respect to the point other than the common patterns, effects equivalent to those of the above-described configuration can be produced. In the case of the irregular-surface oxide film 162, it is sufficient to switch the laser beam irradiation patterns, so that the heat sinks 51 and 52 having the same shape can be used.

Figure 53:
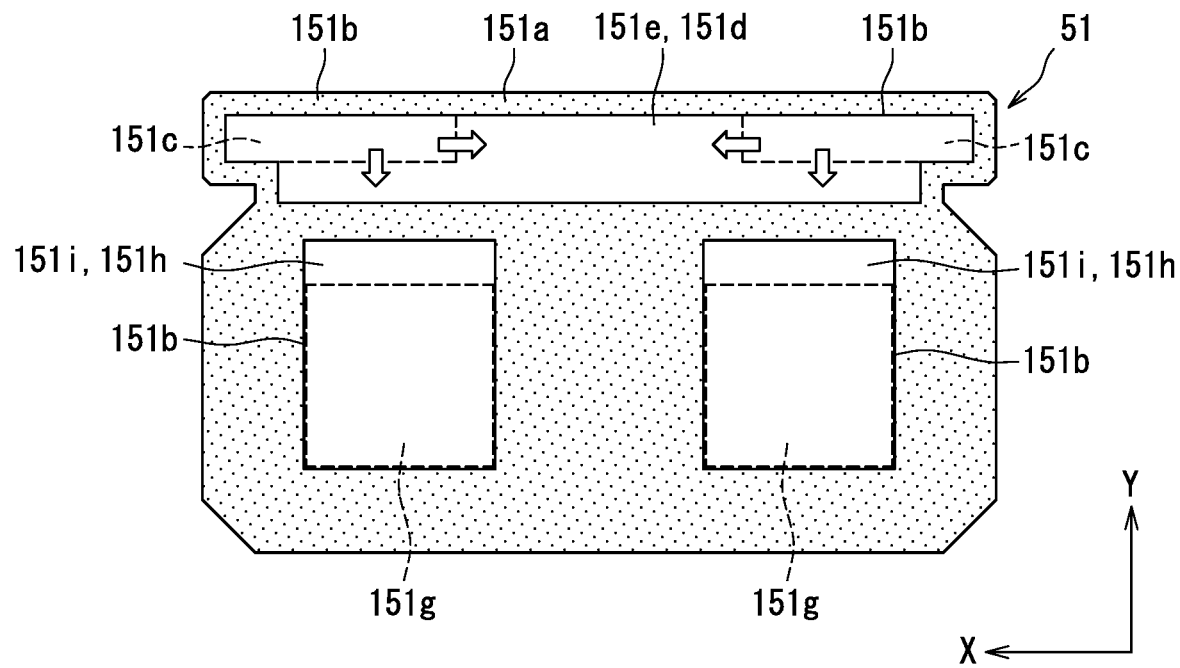
FIG. 53 is a planar view illustrating a modification.

It is sufficient that the holding region 151e is connected to at least a part of the overlap region 151c. Although the example that the holding region 151e is connected to only one of the four sides of the overlap region 151c has been described, the present disclosure is not limited to the example. As illustrated in FIG. 53, the holding region 151e may be provided so as to be connected to two sides of the overlap region 151c having an almost rectangular shape in planar view. With the configuration, the surplus solder 91d can escape to the inside in the X direction and one of the sides in the Y direction. The volume of holding the surplus solder 91d can be increased. The holding region 151e may be connected to three sides of the overlap region 151c. The holding region 151e may be connected to four sides of the overlap region 151c. For example, the holding region 151e may be provided in an annular shape so as to surround the overlap region 151c. In this case, the holding region 151e corresponds to the entire outer periphery of the high wettability region 151b. The holding regions 151e connected to different sides to the common overlap region 151c may be separated from each other. The heat sink 52 is also similar.

Figure 54:
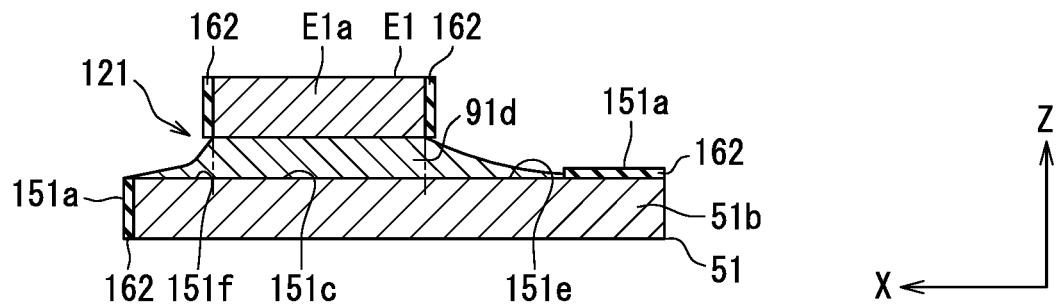
FIG. 54 is a cross section illustrating a modification.

As illustrated in FIG. 54, the irregular-surface oxide film 162 may be provided on a side face of the opposite part E1a of the emitter terminal E1. By the irregular-surface oxide film 162, the low wettability region is formed. Therefore, wet spreading of the solder 91d to the side face side of the emitter terminal E1 can be suppressed. The high wettability region 151b can be specified by the low wettability region 151a provided on the mounting surface and the side face of the heat sink 51. By providing the low wettability region 151a on the side face, the mounting surface can be made wider by that amount and used as the high wettability region 151b. Therefore, the build of the heat sink 51 can be also made smaller. Although FIG. 54 illustrates the example of providing the irregular-surface oxide film 162 on each of the side face of the emitter terminal E1 and the side face of the heat sink 51, it may be provided only one of them. The heat sink 52 is also similar.

The number of semiconductor elements sandwiched by a set of heat dissipation parts is not particularly limited. For example, the above-described surplus solder holding structure can be applied also to a configuration that only one semiconductor element 31 is disposed between the heat sinks 41 and 51 and only one semiconductor element 32 is disposed between the heat sinks 42 and 52. It can be applied also to a configuration that three or more semiconductor elements 31 and three or more semiconductor elements 32 are disposed.

Figure 55:
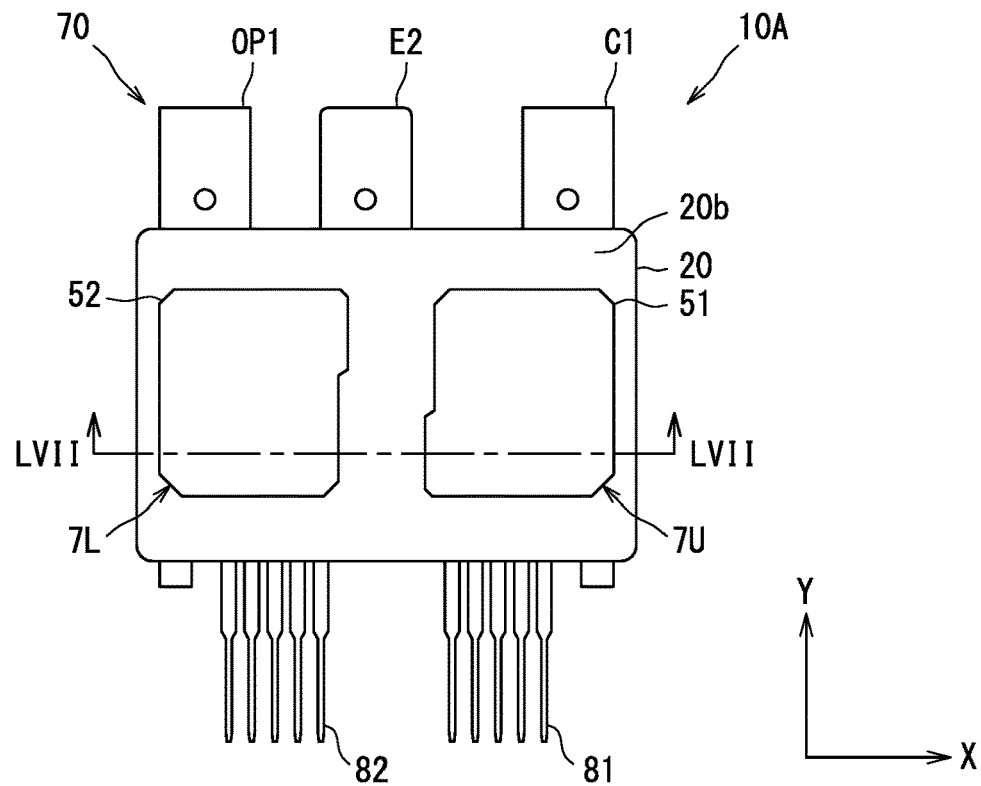
FIG. 55 is a planar view illustrating a modification.
Figure 56:
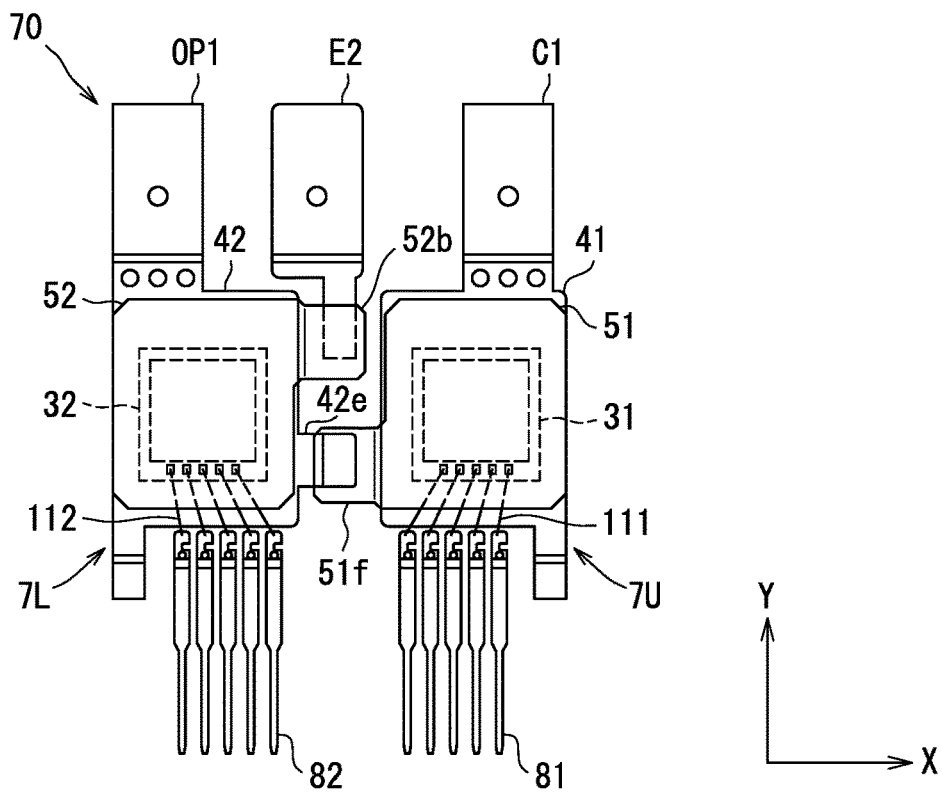
FIG. 56 is a diagram that an sealing resin member is omitted in the modification of FIG. 55.
Figure 57:
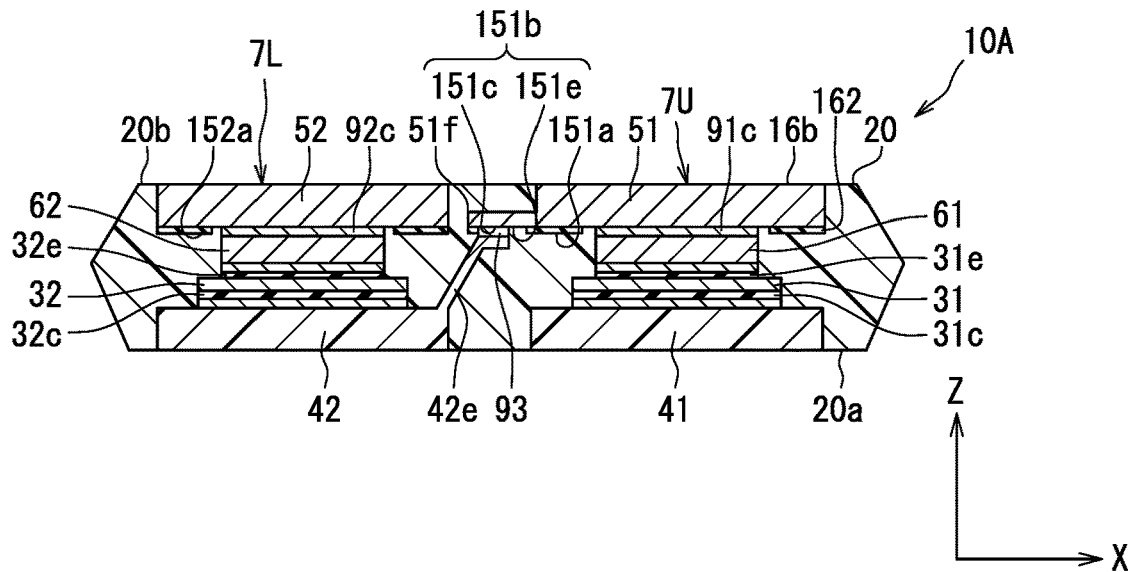
FIG. 57 is a cross section taken along the LVII-LVII line in FIG. 55.

The above-described surplus solder holding structure is not limited to the semiconductor device 11 constructing the upper arm 7U and the semiconductor device 12 constructing the lower arm 7L. That is, the structure is not limited to application to a semiconductor device constructing one arm. For example, as illustrated in FIGS. 55, 56, and 57, the structure may be applied to a semiconductor device 10A having the semiconductor elements 31 and 32 constructing the upper/lower arm 7. By one semiconductor device 10A, the upper/lower arm 7 of one phase is configured. In FIG. 56, the sealing resin member 20 in the semiconductor device 10A illustrated in FIG. 55 is omitted. FIG. 57 is a cross section taken along the LVII-LVII line in FIG. 55.

The semiconductor device 10A has the semiconductor element 31 on the side of the upper arm 7U and the semiconductor element 32 on the side of the lower arm 7L. To the collector electrode 31c of the semiconductor element 31, the heat sink 41 is soldered. To the emitter electrode 31e of the semiconductor element 31, the heat sink 51 is soldered via the terminal 61. Similarly, to the collector electrode 32c of the semiconductor element 32, the heat sink 42 is soldered. To the emitter electrode 32e of the semiconductor element 32, the heat sink 52 is soldered via the terminal 62. The heat sink 42 has a body part to which the semiconductor element 32 is connected, and a joint part 42e connected to the body part. The heat sink 51 has a body part to which the semiconductor element 31 is connected, and a joint part 51f connected to the body part. The joint parts 42e and 51f are disposed so as to face each other in the Z direction and connected via solder 93. The heat sink 52 has the joint part 52b.

The sealing resin member 20 has one face 20a and a rear face 20b as a face opposite to the one face 20a. The heat sinks 41 and 42 are exposed from the sealing resin member 20 in a state that a heat dissipation face opposite to a mounting face is almost flush with the one face 20a. The semiconductor device 10A has, as main terminals 70, one collector terminal C1, one emitter terminal E2, and one output terminal OP1. The collector terminal C1 is connected to the heat sink 41, the output terminal OP1 is connected to the heat sink 42. The emitter terminal E2 is soldered to the joint part 52b of the heat sink 52.

In the heat sinks 51 and 52 on the emitter side, the low wettability regions 151a and 152a are locally provided on the mounting face. The low wettability region 151a is provided also in the joint part 51f. The joint part 51f has the low wettability region 151a and the high wettability region 151b in the face on the side of the mounting face. The high wettability region 151b has the overlap region 151c with the joint part 42e and the holding region 151e. The low wettability region 151a surrounds the high wettability region 151b and defines the outer periphery of the high wettability region 151b. In the solder joint part of the joint parts 42e and 51f, to absorb height variations, the surplus solder 93 overflowed from the opposite regions of the joint parts 42e and 51f wets and spreads from the overlap region 151c to the holding region 151e. Then, the surplus solder 93 is held in the holding region 151e. In the configuration, the joint parts 42e and 51f are terminal parts provided in the semiconductor device 10A. As described above, the structure can be also applied to the joint part of the terminal parts electrically connecting the upper arm 7U and the lower arm 7L.

Although not illustrated, the above-described surplus solder holding structure can be applied also to the solder joint part between the emitter terminal E2 and the heat sink 52 (the joint part 52b). Although FIGS. 55 to 57 illustrate the example that the heat sinks 42 and 51 are provided with the joint parts 42e and 51f, respectively, and the joint parts 42e and 51f are soldered, the present disclosure is not limited to the example. In a configuration that only one of the heat sinks 42 and 51 is provided with a joint part (terminal part), the above-described surplus solder holding structure may be applied. A configuration that a plurality of semiconductor elements 31 are disposed in parallel with one another between the heat sinks 41 and 51 may be also employed. The above-described surplus solder holding structure may be applied to the solder joint part with the terminals 61 and 62 in the heat sinks 51 and 52. The semiconductor element 32 is similar.

Figure 58:
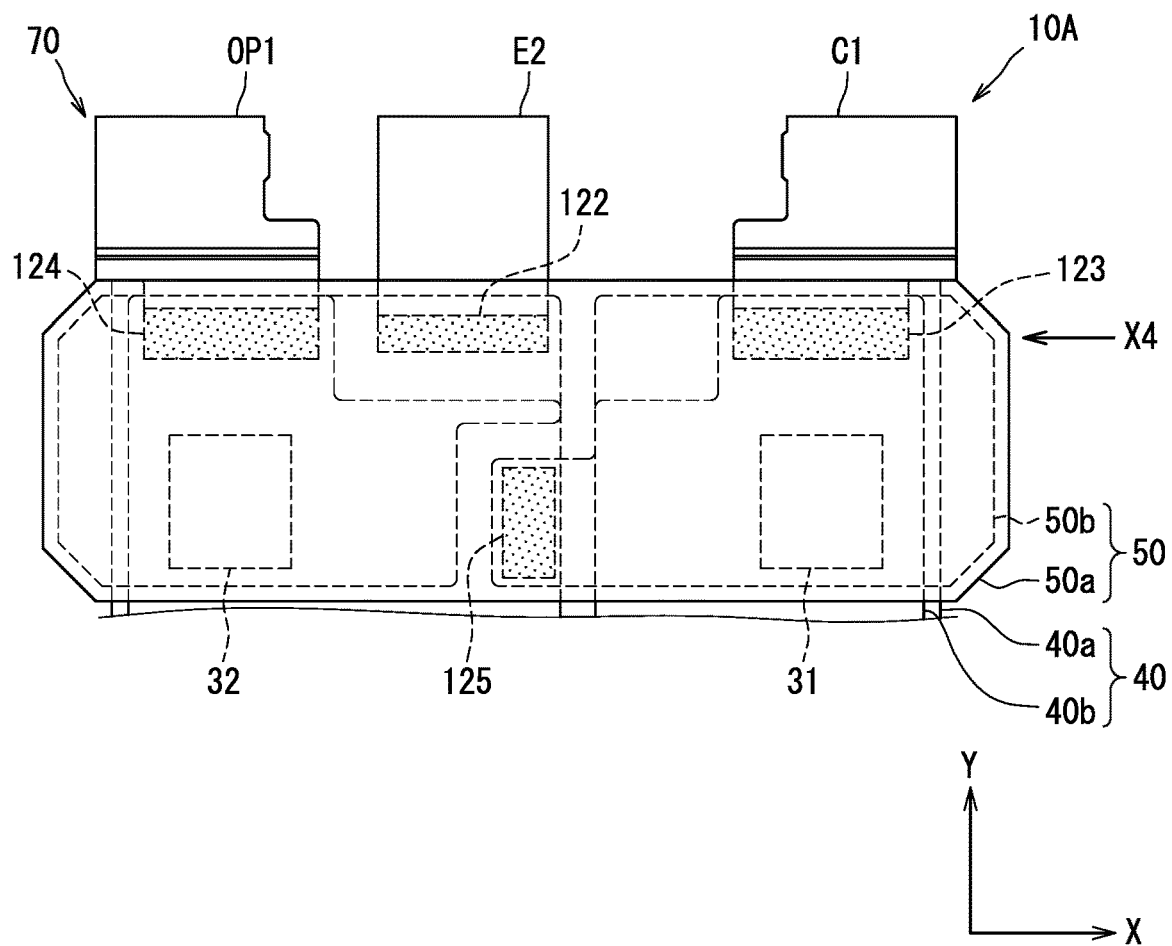
FIG. 58 is a planar view illustrating a modification.
Figure 59:
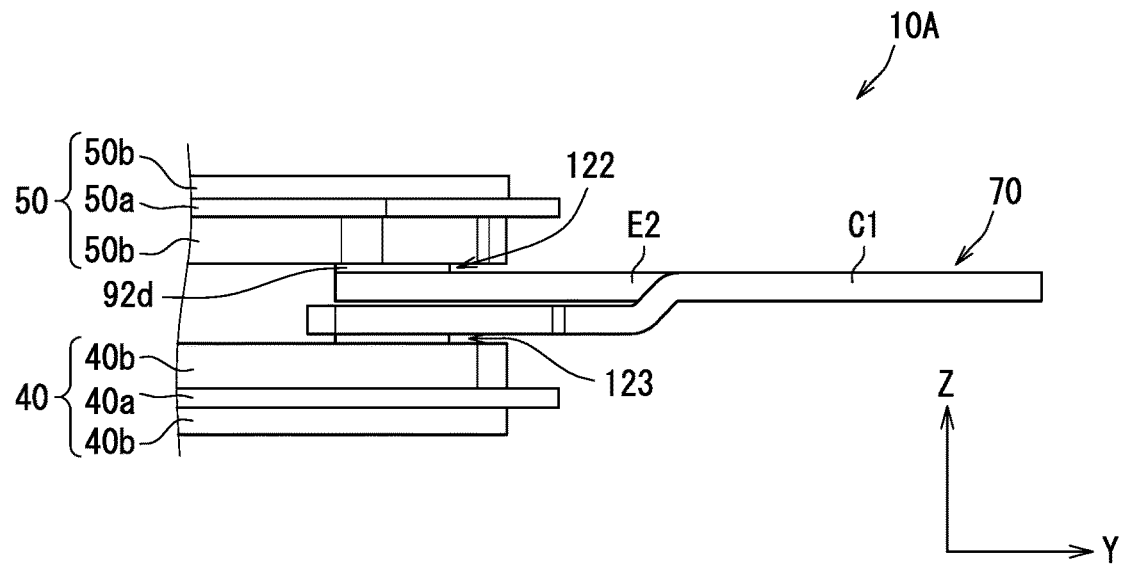
FIG. 59 is a planar view observed from the X4 direction of FIG. 58.

Although the example of employing the heat sinks 41, 42, 51, and 52 as the wiring members electrically connected to the semiconductor elements 31 and 32 has been described, the present disclosure is not limited to the example. A wiring substrate obtained by disposing a conductor made of Cu or the like in an insulator made of ceramics or the like may be employed. The semiconductor device 10A illustrated in FIGS. 58 and 59 has wiring substrates 40 and 50 disposed so as to sandwich the semiconductor elements 31 and 32. As the wiring substrates 40 and 50, DBC (Direct Bonded Copper) substrates are employed. The wiring substrates 40 and 50 have insulators 40a and 50a and conductors 40b and 50b. The conductors 40b and 50b are disposed at least in the face (mounting face) on the side of the semiconductor elements 31 and 32 in the Z direction, in other words, the plate thickness direction of the insulator. In this case, they are disposed also in the rear face of the mounting face. FIG. 59 is a planar view when FIG. 58 is observed from the X4 direction and an enlarged view of a part around the solder joint part between the main terminals and the wiring substrate.

The wiring substrate 40 has, on its mounting face, a plurality of conductors 40b electrically insulated. The collector electrode 31c of the semiconductor element 31 is connected to one of the conductors 40b, and the collector electrode 32c of the semiconductor element 32 is connected to another one of the conductors 40b. Similarly, the wiring substrate 50 also has, on its mounting face, a plurality of conductors 50b electrically insulated. The emitter electrode 31e of the semiconductor element 31 is electrically connected to one of the conductors 50b, and the emitter electrode 32e of the semiconductor element 32 is electrically connected to another one of the conductors 50b.

A solder joint part 123 is formed between the collector terminal C1 and the conductor 40b to which the semiconductor element 31 is connected. A solder joint part 124 is formed between the output terminal OP1 and the conductor 40b to which the semiconductor element 32 is connected. The solder joint part 122 is formed between the emitter terminal E2 and the conductor 50b to which the semiconductor element 32 is connected. A solder joint part 125 is formed between the conductor 50b to which the semiconductor element 31 is connected and the conductor 40b to which the semiconductor element 32 is connected. In such a manner, the semiconductor device 10A has four solder joint parts 122 to 125 as joint parts formed between the two conductive parts.

Figure 60:
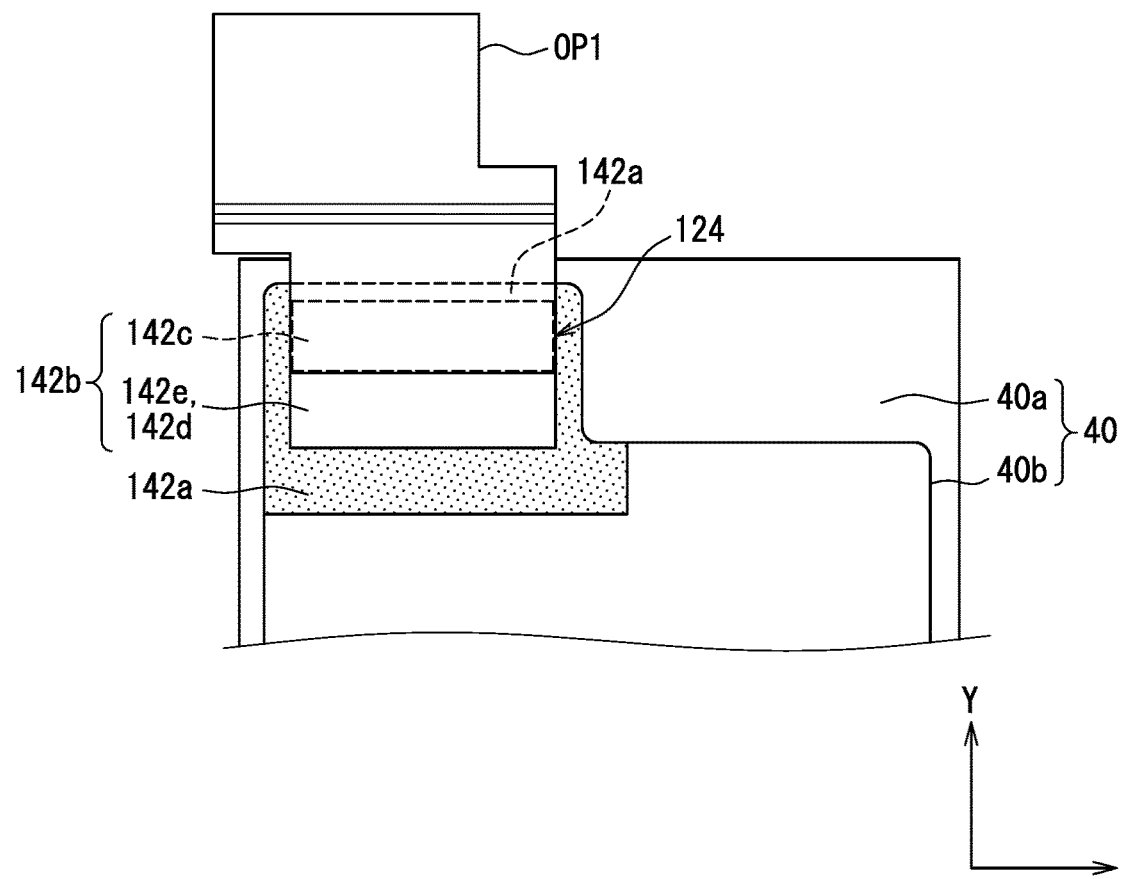
FIG. 60 is an enlarged planar view of the periphery of a joint part.

FIG. 60 is a planar view illustrating a periphery of the solder joint part 124. The conductor 40b of the wiring substrate 40 has, in the mounting face, a low wettability region 142a and a high wettability region 142b. The low wettability region 142a corresponds to the above-described low wetting regions 151a and 152a, and the high wettability region 142b corresponds to the high wettability regions 151b and 152b. The high wettability region 142b has an overlap region 142c overlapping the joint part forming region of the output terminal OP1 and a non-overlap region 142d connected to the overlap region 142c. The non-overlap region 142d includes only a holding region 142e. The holding region 142e is connected to only one of sides of the overlap region 142c having an almost rectangular shape in planar view. The low wettability region 142a surrounds the overlap region 142c and the holding region 142e and is entirely adjacent to the outer periphery of the high wettability region 142b. In the solder joint part 124, surplus solder is wet and spread from the overlap region 142c to the holding region 142e and held in the holding region 142e.

Although the example of applying the above-described surplus solder holding structure to the solder joint part 124 has been described, the structure can be applied also to other solder joint parts 122, 123, and 125. The surplus solder holding structure may be applied to all of the four solder joint parts 122 to 125 or at least one of them. In a semiconductor device (for example, the semiconductor device 11 or 12) constructing one arm, the wiring substrates 40 and 50 such as DBC substrates may be used. In the foregoing embodiments, the wiring substrates 40 and 50 such as DBC substrates may be used in place of the heat sinks 41, 42, 51, and 52. The wiring member may be a combination of a heat sink and a wiring substrate.

Although the example of forming the low wettability regions 142a, 151a, and 152a in a part of the mounting face by providing the irregular-surface oxide film 162 by laser irradiation has been described, the present disclosure is not limited to the example. For example, by performing thermal oxidation process in a state where the high wettability regions 142b, 151b, and 152b are masked, an oxide film may be provided in the low wettability regions 142a, 151a, and 152a. In the part in which the oxide film is provided, the wettability to a joint material (solder) decreases as compared with the part in which the oxide film is not provided.

By patterning polyamide resin, epoxy resin, or the like, parts in which a resin film is formed may be set as the low wettability regions 142a, 151a, and 152a, and parts in which no resin film is formed may be set as the high wettability regions 142b, 151b, and 152b. By forming a resin film on the surface of a metal member, the adhesion to the sealing resin members 20, 21, and 22 can be also improved by the primer effect. In place of a resin material, an inorganic material having low wettability to solder (a material repelling solder) may be used. Parts subjected to roughening plating may be set as the low wettability regions 142a, 151a, and 152a, and parts which are not subjected to roughening plating may be set as the high wettability regions 142b, 151b, and 152b.

Although the example of forming a film of low wettability by selectively processing the low wettability regions 142a, 151a, and 152a has been described above, process may be selectively performed to the high wettability regions 142b, 151b, and 152b. A configuration may be employed that a film (for example, a plating film) having high wettability to a joint material is formed in the high wettability regions 142b, 151b, and 152b in the mounting face and a film having high wettability is not formed in the low wettability regions 142a, 151a, and 152a.

The joint material is not limited to solder. A sintering-type joint material such as Ag or Cu or a conductive adhesive such as an Ag paste may be used.

Sixth Embodiment

In a sixth embodiment, the same reference numerals are designated to parts corresponding to the parts in the foregoing embodiments in view of function and/or structure and/or relates parts. With respect to the corresponding part and/or the related part, the description of the forgoing embodiments can be referred to.

In the foregoing embodiment, the example that the arrangement order of pads is the same in a plurality of semiconductor elements connected in parallel has been described. An arrangement order different from the arrangement order may be also employed.

Figure 61:
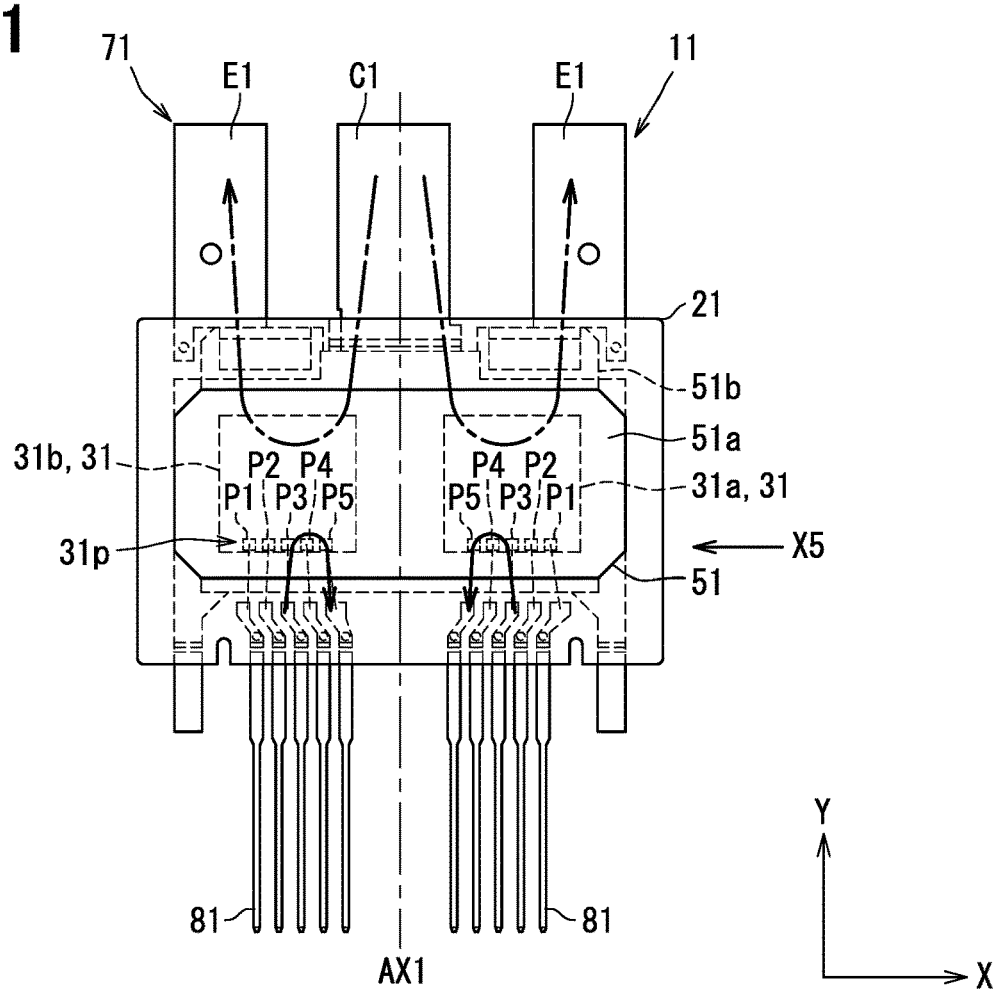
FIG. 61 is a planar view illustrating a semiconductor device according to a sixth embodiment.

FIG. 61 illustrates the semiconductor device 11 of the present embodiment. FIG. 61 corresponds to FIG. 12. The basic configuration of the semiconductor device 11 is the same as that of the foregoing embodiments. The semiconductor device 11 has two semiconductor elements 31 (31a, 31b) disposed side by side in the X direction. The semiconductor element 31 has five pads 31p on a formation face of the emitter electrode 31e which is not illustrated. The give pads 31p are arranged along the X direction. The semiconductor element 31 has, as pads 31p, a cathode pad P1 for the cathode potential of a temperature-sensitive diode, an anode pad P2 for an anode potential, a gate pad P3 for a gate electrode, a current sense pad P4 for current sensing, and a Kelvin emitter pad P5 detecting the potential of the emitter electrode 31e.

As the pads 31p of the semiconductor element 31a in which the switching element Q1a is formed, when viewed from the X5 direction, the cathode pad P1, the anode pad P2, the gate pad P3, the current sense pad P4, and the Kelvin emitter pad P5 are arranged in this order. As the pads 31p of the semiconductor element 31b in which the switching element Q1b is formed, when viewed from the X5 direction, the Kelvin emitter pad P5, the current sense pad P4, the gate pad P3, and the anode pad P2, and the cathode pad P1 are arranged in this order.

Summary of Sixth Embodiment

The arrows of alternate long and short dash lines illustrated in FIG. 61 indicate paths of current (main current) flowing in the main terminal 71. The path of the main current is formed between the collector terminal C1 and the emitter terminal E1 via the semiconductor element 31. The arrows of solid lines indicate paths of current (signal currents) flowing in the signal terminals 81. The path of signal current is formed between the signal terminal 81 connected to the gate pad P3 and the signal terminal 81 connected to the Kelvin emitter pad P5 via the semiconductor element 31. The circuit in which the main current flows and the circuit in which the signal current flows are magnetically coupled.

In the present embodiment, in a manner similar to the foregoing embodiment, the two semiconductor elements 31a and 31b are line-symmetrically disposed with respect to the axis AX1. Using the axis AX1 as the axis of symmetry, the collector terminal C1 and the emitter terminal E1 are disposed line-symmetrically. Therefore, the path of main current on the side of the semiconductor element 31a and the path of main current on the side of the semiconductor element 31b are almost line-symmetrical using the axis AX1 as the axis of symmetry.

In addition, the arrangement order of the pads 31p in the two semiconductor elements 31 is the line symmetrical disposition with respect to the axis AX1. The signal terminals 81 are disposed line-symmetrical with respect to the axis AX1. Therefore, the magnetic coupling is almost line symmetrical on the side of the semiconductor element 31a and the side of the semiconductor element 31b. When the arrangement orders of the pads 31p in the two semiconductor elements 31a and 31b are the same, magnetic coupling becomes asymmetrical.

In the present embodiment, the symmetry of magnetic couplings of the signal current circuits, that is, the symmetry of mutual inductances is also considered, so that unbalance of Alternating currents can be suppressed more effectively.

Seventh Embodiment

In a seventh embodiment, the same reference numerals are designated to parts corresponding to the parts in the foregoing embodiments in view of function and/or structure and/or relates parts. With respect to the corresponding part and/or the related part, the description of the forgoing embodiments can be referred to.

The present embodiment is characterized by the shape of heat dissipation parts disposed so as to sandwich a semiconductor element in a wiring member. The shape of the heat dissipation part is devised so as to increase the wiring inductance on the emitter side.

<Effect of Wiring Inductance on Emitter Side>

Figure 62:
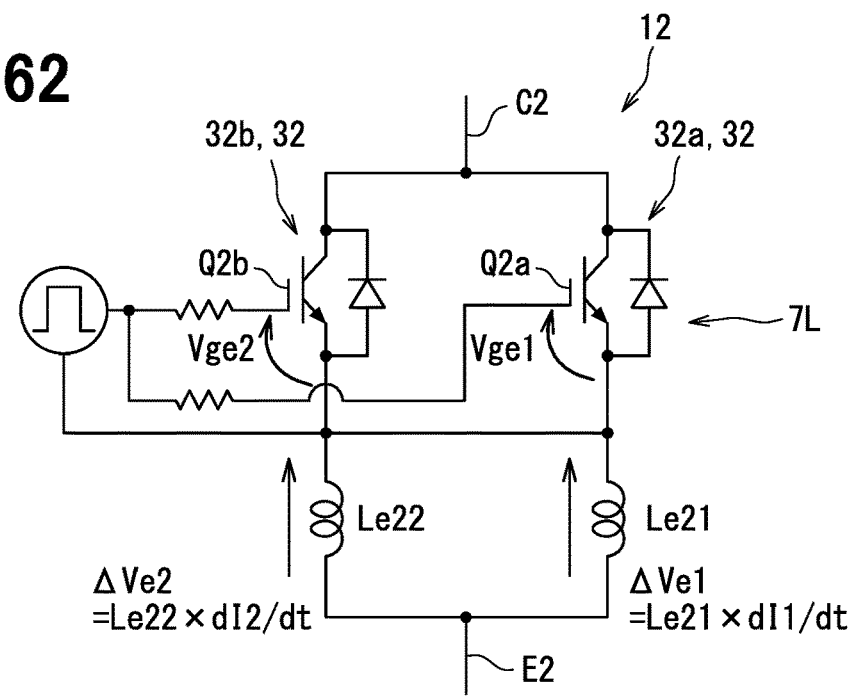
FIG. 62 is an equivalent circuit diagram of a semiconductor device constructing a lower arm.

The wiring inductance on the emitter side plays a function of lessening unbalance of Alternating currents in a parallel circuit. FIG. 62 is an equivalent circuit diagram of the semiconductor device 12 constructing the lower arm 7L. The semiconductor device 12 has two semiconductor elements 32 (32a, 32b) like in the foregoing embodiments. The wiring inductance Le21 exists between the semiconductor element 32a and the emitter terminal E2, and the wiring inductance Le22 exists between the semiconductor element 32b and the emitter terminal E2. Consequently, at the time of switching, that is, when Alternating current flows, the emitter potential fluctuates (rises).

It is assumed that the switching speed of the switching element Q2a is dl1/dt, and the switching speed of the switching element Q2b is dl2/dt. A fluctuation amount ΔVe of the emitter potential at the time of switching is equal to a multiplication value of the switching speed and the wiring inductance. A fluctuation amount ΔVe1 on the side of the semiconductor element 32a is obtained as ΔVe1=Le21×(dl1/dt). A fluctuation amount ΔVe2 on the side of the semiconductor element 32b is obtained as ΔVe2=Le22×(dl2/dt).

For example, a case that the wiring inductances Le21 and Le22 are equal to each other will be considered. Due to a deviation of the switching speed dl1/dt and dl2/dt, a deviation occurs in the fluctuation amount ΔVe. When the values of the wiring inductances Le21 and Le22 are large, the difference of the fluctuation amounts ΔVe becomes large and the influence is exerted on the gate voltage Vge. For example, in the case of dl1/dt>dl2/dt, the fluctuation amount ΔVe1 becomes larger than the fluctuation amount ΔVe2, and the gate voltage Vge1 becomes lower than the gate voltage Vge2. In such a manner, the gate voltage Vge deviates to the side of suppressing the unbalance (bias) of Alternating current. Therefore, the unbalance of the Alternating current can be suppressed.

In the case where the values of the wiring inductances Le21 and Le22 are small, the value of the fluctuation amount ΔVe becomes small. Consequently, even a deviation occurs in the switching speeds dI1/dt and dI2/dt, the difference between the fluctuation amounts ΔVe1 and ΔVe2 is small. Therefore, the effect of suppressing unbalance by the wiring inductance is weakened. In other words, when the values of the wiring inductances Le21 and Le22 are small, unbalance of Alternating currents tends to occur due to a deviation of the switching speeds dI1/dt and dI2/dt, that is, element characteristic variations.

<Shape of Heat Sink>

Figure 63:
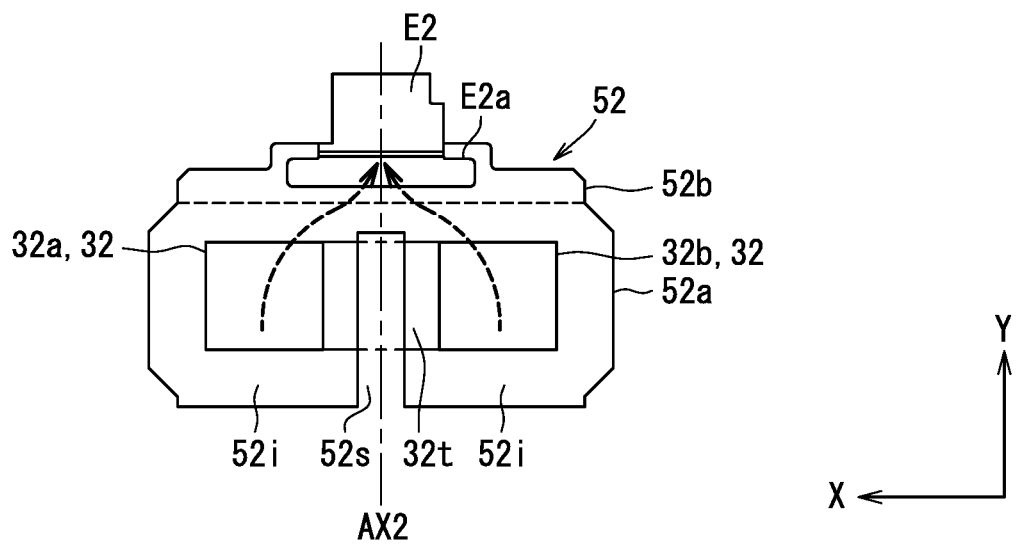
FIG. 63 is a planar view illustrating a heat sink and a main terminal on the emitter side in a semiconductor device according to a seventh embodiment.
Figure 64:
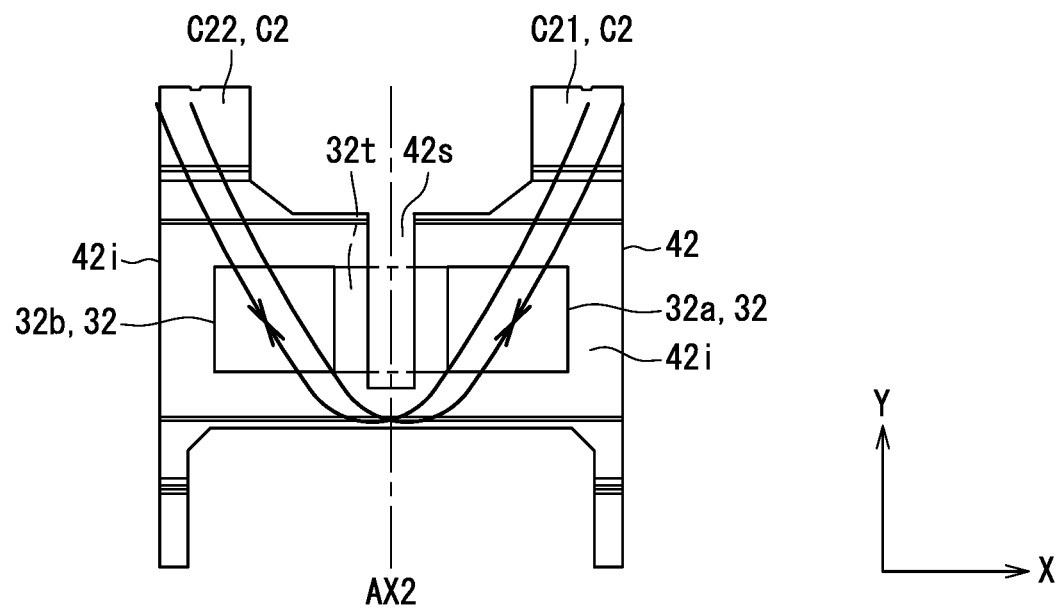
FIG. 64 is a planar view illustrating a heat sink and a main terminal on the collector side.

FIG. 63 illustrates the heat sink 52 on the emitter side and the emitter terminal E2 in the semiconductor device 12 according to the present embodiment. FIG. 64 illustrates the heat sink 42 on the collector side and the collector terminal C2. The configurations of the collector terminal C2 and the emitter terminal E2 are the same as those described in the foregoing embodiments (refer to, for example, FIG. 12). The disposition of the two semiconductor elements 32 is similar to the above. The basic configuration of the heat sinks 42 and 52 is also similar to the above.

As illustrated in FIG. 63, the heat sink 52 of the present embodiment has a slit 52s. The slit 52s penetrates the heat sink 52 in the Z direction and partitions the body part 52a into two islands 52i. One of the islands 52i is a mounting region of the semiconductor element 32a. The other one of the islands 52i is a mounting region of the semiconductor element 32b. The body part 52a has an almost rectangular shape in planar view and has a first long side on the side the emitter terminal E2 is connected and a second long side positioned opposite to the first long side. The slit 52s is open in the second long side of the body part 52a and extends in the Y direction toward the first long side.

The slit 52s extends over an opposed region 32t of the two semiconductor elements 32 in the Y direction. Specifically, the slit 52s extends to a position closer to the emitter terminal E2 (opposite part E2a) than the semiconductor element 32 in the Y direction. The slit 52s is provided in almost center of the body part 52a (heat sink 52) in the X direction. The two islands 52i are disposed line-symmetrically with respect to the axis AX2 as the axis of symmetry. The slit 52s is also called a notch, an isolation region, or the like.

As illustrated in FIG. 64, the heat sink 42 has a slit 42s. The slit 42s penetrates the heat sink 42 in the Z direction and partitions it into two islands 42i. One of the islands 42i is a mounting region of the semiconductor element 32a. The other one of the islands 42i is a mounting region of the semiconductor element 32b. The heat sink 42 has an almost rectangular shape in planar view and has a first long side on the side the collector terminal C2 is connected and a second long side positioned opposite to the first long side. The slit 42s is open in the first long side and extends in the Y direction toward the second long side. The slit 42s is open on the side opposite to the open end of the slit 52s.

The slit 42s extends over the opposed region 32t of the two semiconductor elements 32 in the Y direction. Specifically, the slit 42s extends to a position closer to the second long side than the semiconductor element 32 in the Y direction. The slit 42s is provided in almost center of the heat sink 42 in the X direction. The two islands 42i are disposed line-symmetrically with respect to the axis AX2 as the axis of symmetry. The slit 42s is also called a notch, an isolation region, or the like.

Summary of Seventh Embodiment

The broken lines illustrated in FIG. 63 indicate current paths. The current path on the side of the semiconductor element 32a and the current path on the side of the semiconductor element 32b join at an extension of the slit 52s due to the existence of the slit 52s. As described above, the heat sink 52 has the slit 52s, so that the distance (wiring length) from the semiconductor elements 32a and 32b to the joined part of the two current paths can be made longer than the configuration having no slit 52s. In other words, the joined part can be made at a distance further than the configuration having no slit 52s. With the configuration, the values of the wiring inductances Le21 and Le22 can be increased. As a result, the unbalance of Alternating currents due to the element characteristic difference can be suppressed.

In the present embodiment, the slit 52s extends over the opposed region 32t of the semiconductor element 32. Therefore, a joint part is not formed in the opposed region 32t. With the configuration, the wiring length to the joint part can be further increased. Therefore, the values of the wiring inductances Le21 and Le22 can be made larger and, moreover, the above-described current unbalance suppression effect can be increased.

In the present embodiment, the heat sink 52 including the slit 52s is line-symmetrical with respect to the axis AX2. Consequently, while providing the slit 52s, the current path on the side of the semiconductor element 32a and the current path on the side of the semiconductor element 32b become line-symmetrical. It makes the wiring inductance Le21 and the wiring inductance Le22 almost equal to each other. Therefore, the unbalance of the Alternating currents can be suppressed.

In the present embodiment, by the slit 52s, the heat sink 52 is partitioned to the two islands 52i. The plurality of islands 52i are configured in one metal plate or in a conductor. Therefore, the configuration can be simplified.

Figure 65:
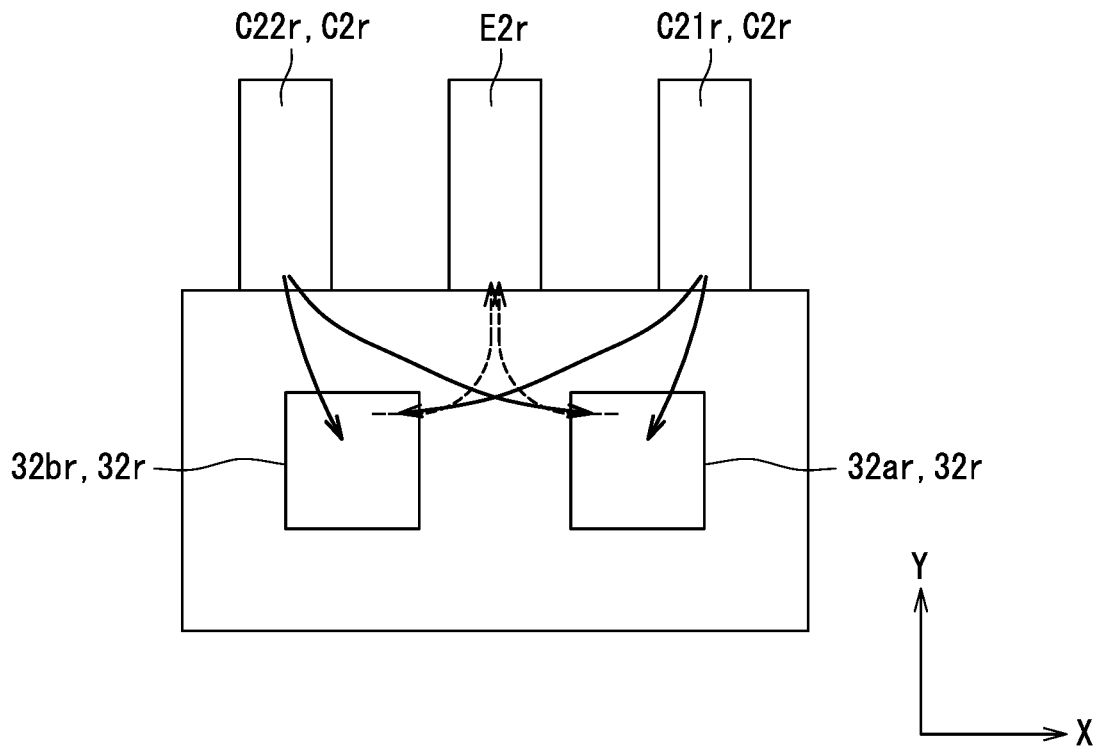
FIG. 65 is a schematic planar view illustrating a reference example.

FIG. 65 illustrates a reference example in which the slits 42s and 52s are not provided. The solid-line arrows indicate current paths between a collector terminal C2r and a semiconductor element 32r. The broken-line arrows indicate current paths between an emitter terminal E2r and the semiconductor element 32r. The current flowing between a collector terminal C21r and the semiconductor element 32br and the current flowing between the semiconductor element 32br and the emitter terminal E2r have components opposite to each other. Similarly, the current flowing between a collector terminal C22r and a semiconductor element 32ar and the current flowing between the semiconductor element 32ar and the emitter terminal E2r have components opposite to each other.

As described above, the current flowing between the collector terminal C2r and the semiconductor element 32r in far position relations in the X direction and the current flowing between the semiconductor element 32r and the emitter terminal E2r have components opposite to each other. Therefore, the wiring inductance becomes small due to cancellation of magnetic fluxes.

In the present embodiment, by providing the slit 52s in the heat sink 52, the current path between the semiconductor element 32 and the emitter terminal E2 becomes different from the current path illustrated in FIG. 65. It can reduce components opposite to each other in the current flowing between the semiconductor element 32 and the collector terminal C2 and the current flowing between the semiconductor element 32 and the emitter terminal E2. Therefore, cancellation of the magnetic fluxes can be reduced. In other words, the mutual inductance acts on the positive side. As a result, the values of the wiring inductances Le21 and Le22 can be made larger and, moreover, the unbalance of Alternating current by the element characteristic difference can be suppressed.

In the present embodiment, the heat sink 42 has the slit 42s. Therefore, between the collector terminal C2 and the semiconductor element 32, the current paths indicated by the solid-line arrows in FIG. 64 are formed. Between the collector terminal C22 and the semiconductor element 32a, a current path detouring the slit 42s is formed. Similarly, between the collector terminal C21 and the semiconductor element 32b, a current path detouring the slit 42s is formed.

Consequently, the components opposite to each other in the current flowing between the semiconductor element 32 and the collector terminal C2 and the current flowing between the semiconductor element 32 and the emitter terminal E2 can be reduced as compared with that in the configuration having no slit 42s. Therefore, the values of the wiring inductances Le21 and Le22 can be made larger and, moreover, the unbalance of the Alternating currents due to the element characteristic difference can be suppressed.

In the present embodiment, the slit 42s extends over the opposed region 32t of the semiconductor element 32. Consequently, a current path formed between the collector terminal C22 and the semiconductor element 32a has an almost J shape. Similarly, a current path formed between the collector terminal c21 and the semiconductor element 32b also has an almost J shape. Therefore, the current components opposite to each other can be further reduced. As a result, the values of the wiring inductances Le21 and Le22 can be made larger and, moreover, the above-described current unbalance suppression effect can be increased.

In the present embodiment, the heat sink 42 including the slit 42s is line-symmetrical with respect to the axis AX2. Consequently, while providing the slit 42s, the current path on the side of the semiconductor element 32a and the current path on the side of the semiconductor element 32b become line-symmetrical. It makes the wiring inductance Le21 and the wiring inductance Le22 almost equal to each other. Therefore, the unbalance of the Alternating currents can be suppressed.

In the present embodiment, by the slit 42s, the heat sink 42 is partitioned to the two islands 42i. The plurality of islands 42i are configured in one metal plate or in a conductor. Therefore, the configuration can be simplified.

Modifications

Although the example of providing the slits 42s and 52s in the heat sinks 42 and 52, respectively has been described, the present disclosure is not limited to the example. A configuration that the slit 42s is provided only in the heat sink 42 and the slit 52s is not provided in the heat sink 52 may be also employed. A configuration that the slit 52s is provided only in the heat sink 52 and the slit 42s is not provided in the heat sink 42 may be also employed.

Although the example of providing the slits 42s and 52s in the semiconductor device 12 has been described, the present disclosure is not limited to the example. A current path in the case where no slit is provided in the semiconductor device 11 is equivalent to a reference example illustrated in FIG. 65. In the semiconductor device 11, a slit may be provided at least one of the heat sinks 41 and 51. By the above-described effect of setting the joint part far and/or the effect of reducing the cancellation of magnetic fluxes, the values of the wiring inductances Le11 and Le12 can be made larger. As a result, the unbalance of Alternating currents due to the element characteristic difference can be suppressed.

For example, in the semiconductor device 11 having the configuration illustrated in FIG. 12, a slit may be provided in the heat sink 41. The slit opens in a long side opposite to a side to which the collector terminal C1 is connected. With the configuration, the cancellation of magnetic fluxes is reduced and, consequently, the values of the wiring inductances Le11 and Le12 can be made larger. In the semiconductor device 11, a slit may be provided in the heat sink 51. The slit opens to the long side to which two emitter terminals E1 are connected.

Figure 66:
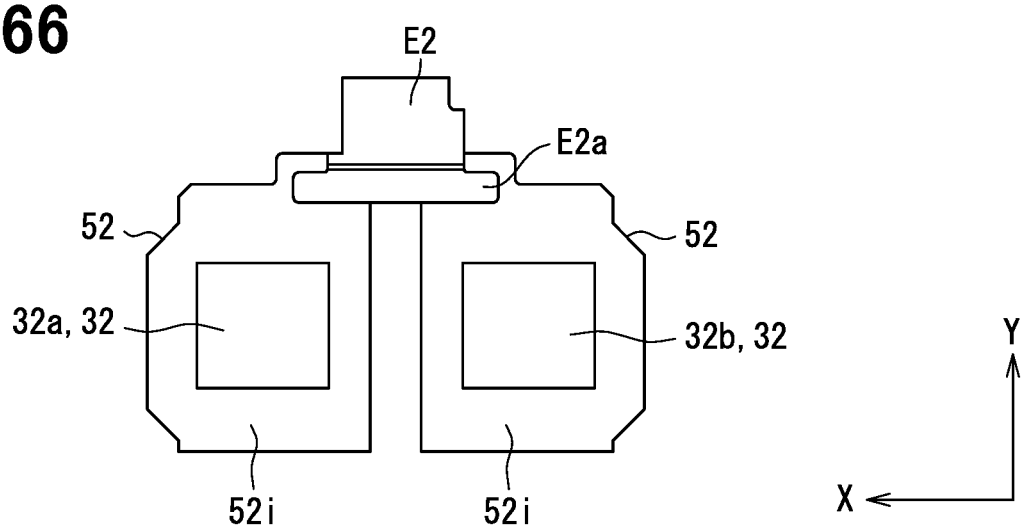
FIG. 66 is a planar view illustrating a modification.

Although the example of partitioning the plurality of islands 42i and 52i in the heat sinks 42 and 52 by providing the slits 42s and 52s has been described, the present disclosure is not limited to the example. For example, a configuration having two heat sinks 52 as illustrated in FIG. 66 may be also employed. That is, the heat sink 52 may be completely divided into two regions. Effects equivalent to those of the configuration having the slit 52s can be produced.

As illustrated in FIG. 66, each of the heat sinks 52 has the island 52i. Between the two heat sinks 52, a predetermined gap is provided in the X direction. The two heat sinks 52 are electrically connected via a coupling member. In the example illustrated in FIG. 66, the emitter terminal E2 also serves as the coupling member. The opposite part E2a of the emitter terminal E2 bridges the two heat sinks 52. By the arrangement, the number of parts can be reduced.

Figure 67:
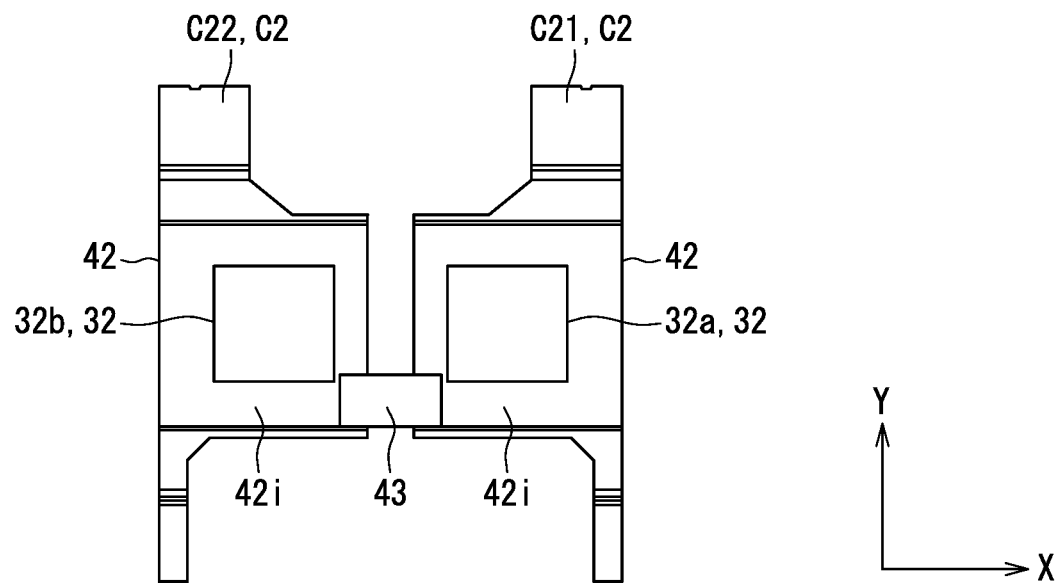
FIG. 67 is a planar view illustrating a modification.

A configuration having two heat sinks 42 as illustrated in FIG. 67 may be also employed. That is, the heat sink 42 may be completely divided into two regions. Effects equivalent to those of the configuration having the slit 42s can be produced. Each of the heat sinks 42 has the island 42i. Between the two heat sinks 42, a predetermined gap is provided in the X direction. The two heat sinks 42 are electrically connected via a coupling member 43. The coupling member 43 bridges the two heat sinks 42.

It is also possible to electrically connect the two heat sinks 52 (islands 52i) by using a coupling member different from the emitter terminal E2 and connect the emitter terminal E2 to the coupling member. In the semiconductor device 11, the division structure of the heat sinks 41 and 51 may be employed.

Figure 68:
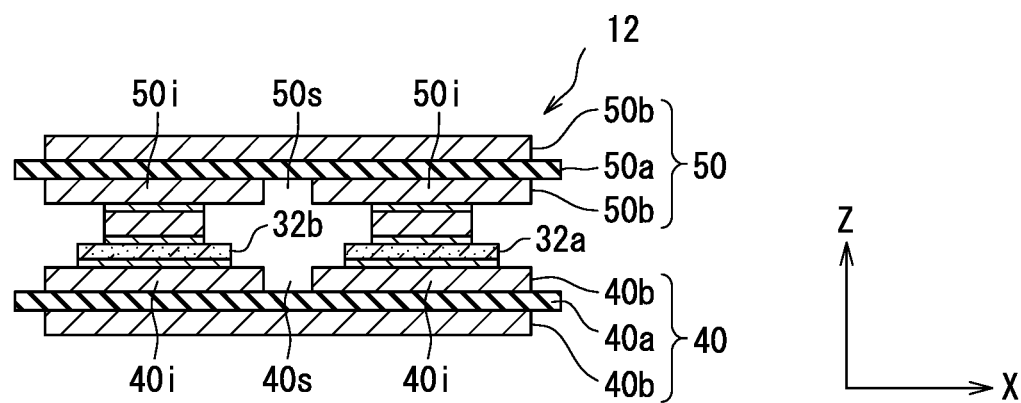
FIG. 68 is a cross section illustrating a modification.
Figure 69:
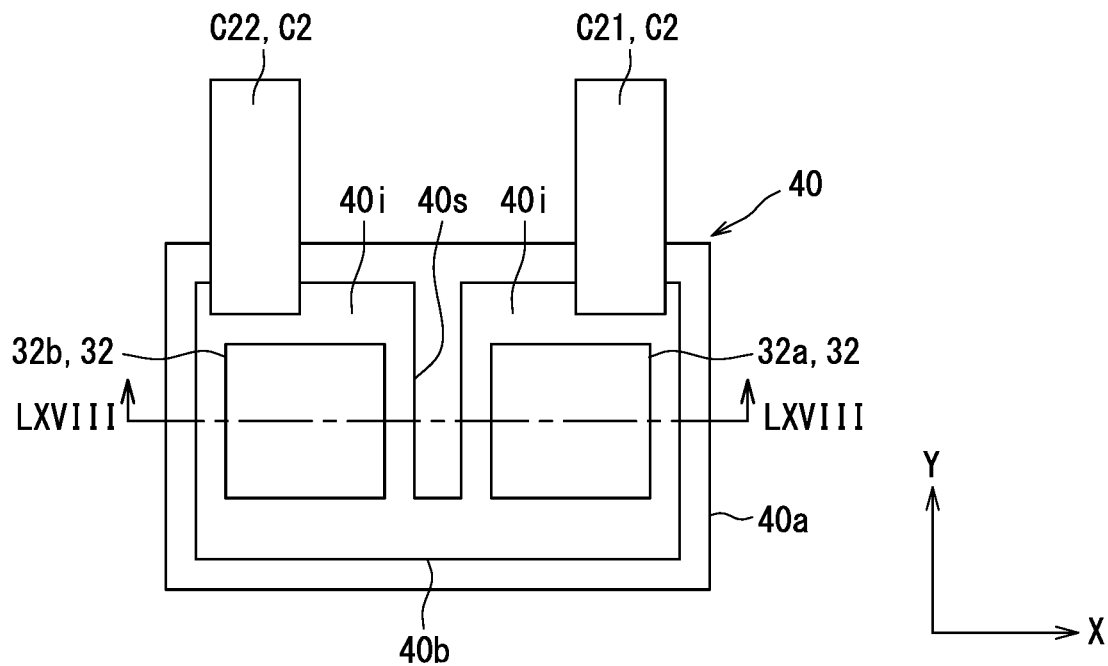
FIG. 69 is a planar view illustrating a modification.
Figure 70:
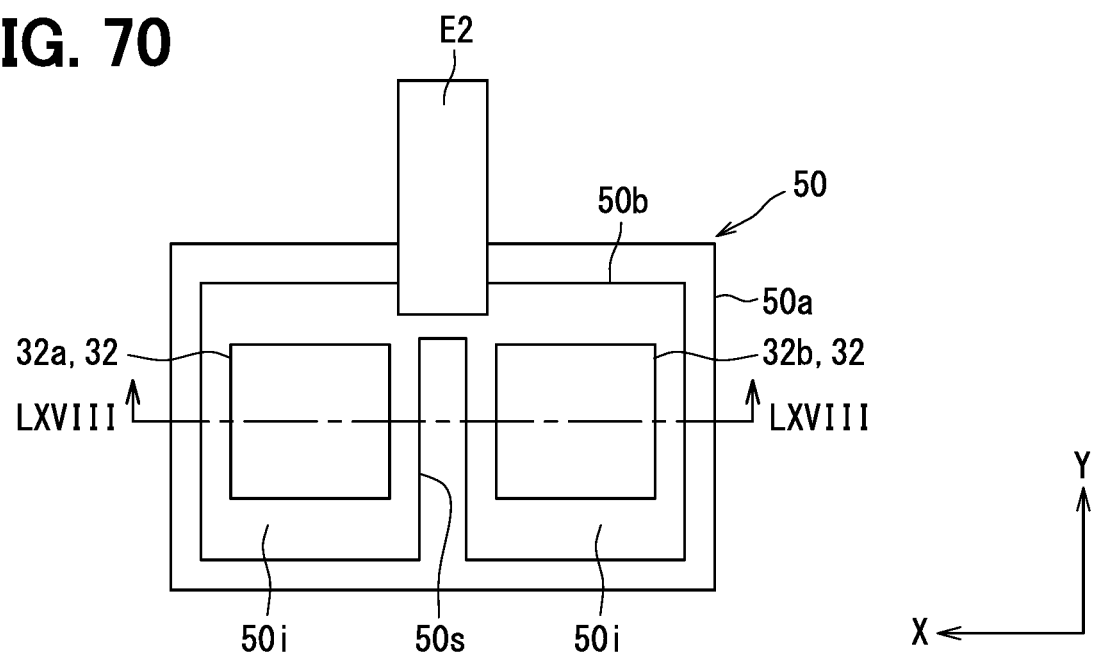
FIG. 70 is a planar view illustrating a modification.

In the present embodiment as well, in place of the heat sinks 41, 42, 51, and 52, the wiring substrates 40 and 50 such as DBC substrates may be used. FIGS. 68, 69, and 70 illustrate an example. FIG. 68 is a cross section of a semiconductor device corresponding to the LXVIII-LXVIII line of FIGS. 69 and 70. In FIG. 68, for convenience, the sealing resin member 22 and the signal terminal 82 are omitted. FIG. 69 illustrates the wiring substrate 40 on the collector side and the collector terminal C2, and FIG. 70 illustrates the wiring substrate 50 on the emitter side and the emitter terminal E2.

The semiconductor device 12 illustrated in FIG. 68 has, in a manner similar to the foregoing embodiments (refer to, for example, FIG. 59), as wiring members, the wiring substrates 40 and 50 disposed so as to sandwich the two semiconductor elements 32 (32a and 32b). The wiring substrates 40 and 50 are DBC substrates. The wiring substrates 40 and 50 have the insulators 40a and 50a and the conductors 40b and 50b. The conductors 40b and 50b are disposed at least in a mounting face in the Z direction. In this case, they are disposed also in the rear face of the mounting face.

In the wiring substrate 40, the conductor 40b on the mounting face side has two islands 40i and a slit 40s. The conductor 40b having the islands 40i and the slit 40s corresponds to the heat sink 42. The island 40i corresponds to the island 42i, and the slit 40s corresponds to the slit 42s. The slit 40s penetrates the conductor 40b and partitions the conductor 40b into the island 40i as the mounting region of the semiconductor element 32a and the island 40i as the mounting region of the semiconductor element 32b. The collector terminal C21 is connected to one of the islands 40i and the collector terminal C22 is connected to the other one of the islands 40i.

The conductor 40b has, for example, an almost rectangular shape in planar view. The slit 40s opens in a long side to which the collector terminal C2 is connected and extends in the Y direction. The slit 40s extends over the opposed region of the semiconductor elements 32a and 32b. The semiconductor element 32, the conductor 40b including the slit 40s, and the collector terminal C2 have symmetry similar to that of the above-described embodiments.

In the wiring substrate 50, the conductor 50b on the mounting face side has two islands 50i and a slit 50s. The conductor 50b having the islands 50i and the slit 50s corresponds to the heat sink 52. The island 50i corresponds to the island 52i, and the slit 50s corresponds to the slit 52s. The slit 50s penetrates the conductor 50b and partitions the conductor 50b into the island 50i as the mounting region of the semiconductor element 32a and the island 50i as the mounting region of the semiconductor element 32b. The emitter terminal E2 is connected to a part connecting the two islands 50i in the conductor 50b.

The conductor 50b has, for example, an almost rectangular shape in planar view. The slit 50s opens in a long side to which the emitter terminal E2 is connected, and extends in the Y direction. The slit 50s extends over the opposed region of the semiconductor elements 32a and 32b. The semiconductor element 32, the conductor 50b including the slit 50s, and the emitter terminal E2 have symmetry similar to that of the above-described embodiments.

As described above, the semiconductor device 12 using the wiring substrates 40 and 50 can also produce effects similar to those of the semiconductor device 12 using the heat sinks 42 and 52. As the wiring member, a heat sink and a wiring substrate may be combined. For example, a configuration having the heat sink 42 and the wiring substrate 50 (DBC substrate) and a configuration having the wiring substrate 40 and the heat sink 52 may be also employed. It can be also applied to the semiconductor device 11.

Other Embodiments

The present disclosure of the specification, the drawings, and the like is not limited to the embodiments described as examples. The disclosure includes the embodiments and modifications by a person skilled in the art based on the embodiments. For example, the disclosure is not limited to combinations of the parts and/or the elements described in the embodiments. The disclosure can be executed by various combinations. The disclosure can have a part which can be added to the embodiments. The disclosure includes a configuration obtained by omitting a part and/or an element in the embodiments. The disclosure includes replacement or combination of a part and/or an element between an embodiment and another embodiment. The technical scope disclosed is not limited to the description of the embodiments. It is to be understood that some technical scopes disclosed are indicated by the description of the scope of claims and, further, meanings equivalent to the description of the scope of claims and all of changes within the scope are included.

The disclosure in the specification, the drawings, and the like is not limited by the description of the scope of claims. The disclosure in the specification, the drawings, and the like includes the technical ideas described in the scope of claims and, further, technical ideas which are more various and wider than the technical ideas described in the scope of claims. Therefore, without being limited by the description of the scope of claims, various technical ideas can be extracted from the disclosure of the specification, the drawings, and the like.

What is claimed is:

1. A semiconductor device comprising:
   a semiconductor element having two surfaces opposite to each other in a plate thickness direction and having a main electrode disposed on each of the two surfaces; and
   a wiring member including a plurality of conducting parts and a joint part, the plurality of conducting parts including a set of heat dissipation parts and a plurality of terminal parts, the set of heat dissipation parts respectively disposed to the two surfaces to sandwich the semiconductor element and electrically connected to the main electrode disposed on corresponding one of the two surfaces, each of the plurality of terminal parts connected to one of the set of heat dissipation parts, the joint part formed by disposing a joint material between two conducting parts in the plurality of conducting parts in the plate thickness direction, wherein
   in the joint part, a first conducting part as one of the two conducting parts has a high wettability region and a low wettability region in a surface opposite to a second conducting part as another one of the two conducting parts, the low wettability region is provided adjacent to the high wettability region so as to define an outer periphery of the high wettability region in planar view in the plate thickness direction and has wettability lower than the high wettability region to the joint material,
   the high wettability region has an overlap region and a non-overlap region, the overlap region is a region overlapping a formation region of the joint part in the second conducting part in the planar view, the joint material is disposed in at least a part of the overlap region, and the non-overlap region is a region that is connected to the overlap region to be flush with the overlap region and does not overlap the formation region of the joint part in the second conducting part, and
   the non-overlap region includes a holding region that is connected to the overlap region, and is entirely flush with the overlap region, wherein any surplus joint material is disposed in the holding region.

2. The semiconductor device according to claim 1, wherein
   the holding region is connected to only a part of the outer periphery of the overlap region in the planar view,
   a direction that is orthogonal to the plate thickness direction and an arrangement direction of the overlap region and holding region is set as an orthogonal direction, and
   the low wettability region is adjacent to the outer periphery of the high wettability region on both sides in the orthogonal direction to sandwich both the overlap region and the holding region in the orthogonal direction.

3. The semiconductor device according to claim 1, wherein
the low wettability region is entirely adjacent to a part of the holding region located at the outer periphery of the high wettability region.

4. The semiconductor device according to claim 1, wherein
the low wettability region integrally surrounds the overlap region and the non-overlap region connected to each other, and is entirely adjacent to the outer periphery of the high wettability region.

5. The semiconductor device according to claim 1, wherein
the first conducting part has, as the high wettability region, two overlap regions as the overlap region and the holding region provided between the two overlap regions in an arrangement direction of the two overlap regions and connected to each of the two overlap regions.

6. The semiconductor device according to claim 1, wherein
the first conducting part has, as the high wettability region, two holding regions as the holding region and the overlap region provided between the two holding regions in an arrangement direction of the two holding regions and connected to each of the two holding regions.

7. The semiconductor device according to claim 1, further comprising
a film having low wettability to the joint material and disposed only in the low wettability region in the first conducting part.

8. The semiconductor device according to claim 7, wherein
the first conducting part has a base material, a metal film, and an irregular-surface oxide film,
the metal film is disposed on a surface of the base material and is mainly composed of a metal,
the irregular-surface oxide film is made of an oxide of a same metal as the metal of the metal film and a surface of the irregular-surface oxide film has dents and projections continuously, and
the irregular-surface oxide film is formed as the film only in the low wettability region.

9. The semiconductor device according to claim 1, wherein
the non-overlap region includes only the holding region.

10. The semiconductor device according to claim 1, wherein
the non-overlap region includes the holding region and a narrow region,
the narrow region is connected to the overlap region in a position different from the holding region, and
in an arrangement direction of the overlap region and the narrow region, a length of the narrow region is shorter than a length of the holding region.

* * * * *